United States Patent
Ono

(10) Patent No.: US 9,177,993 B2
(45) Date of Patent: Nov. 3, 2015

(54) LIGHT EMITTING PART, PRINT HEAD, AND IMAGE FORMING APPARATUS

(71) Applicant: FUJI XEROX CO., LTD., Tokyo (JP)

(72) Inventor: Seiji Ono, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/279,988

(22) Filed: May 16, 2014

(65) Prior Publication Data

US 2015/0097908 A1   Apr. 9, 2015

(30) Foreign Application Priority Data

Oct. 9, 2013  (JP) ................................. 2013-212250

(51) Int. Cl.
  *B41J 2/45* (2006.01)
  *H01L 27/15* (2006.01)

(52) U.S. Cl.
  CPC *H01L 27/153* (2013.01); *B41J 2/45* (2013.01)

(58) Field of Classification Search
  CPC ..... H01L 27/15; H01L 27/153; H01L 27/156; H01L 29/74; H01L 33/005; G03G 15/04054; B41J 2002/453
  USPC ................ 347/128, 130, 226, 227, 238, 247; 257/79, 83, 107, 115
  See application file for complete search history.

(56) References Cited

U.S. PATENT DOCUMENTS 8,325,210 B2 * 12/2012 Ohno ............................ 347/224
8,835,974 B2 *  9/2014 Nagumo ....................... 257/107

FOREIGN PATENT DOCUMENTS

JP        B2-2784011        8/1998

* cited by examiner

*Primary Examiner* — Hai C Pham
(74) *Attorney, Agent, or Firm* — Oliff PLC

(57) ABSTRACT

Cathodes of a first group of plural transfer thyristors are connected with a first transfer signal line, and also connected with a first reception terminal through a first current limiting resistance. A first transfer signal is transmitted to the first reception terminal. Cathodes of a second group of the plural transfer thyristors are connected with a second transfer signal line, and also connected with a second reception terminal through a second current limiting resistance. A second transfer signal is transmitted to the second reception terminal. The plural transfer thyristors each have an anode, a cathode, a first gate, and a second gate. A three-terminal switch element and a resistance are connected between a second gate of a former transfer thyristor and a first gate of a later transfer thyristor, the former and later transfer thyristors being closely arranged upstream and downstream transfer thyristors among the plural transfer thyristors.

6 Claims, 15 Drawing Sheets

LIGHT EMITTING PART, PRINT HEAD, AND IMAGE FORMING APPARATUS

CROSS-REFERENCE TO RELATED APPLICATIONS

This application is based on and claims priority under 35 USC 119 from Japanese Patent Application No. 2013-212250 filed Oct. 9, 2013.

BACKGROUND

The present invention relates to a light emitting part, a print head, and an image forming apparatus.

SUMMARY

According to an aspect of the invention, there is provided a light emitting part includes plural light emitting elements that are each lit in the on state; plural transfer thyristors that each have an anode, a cathode, a first gate, and a second gate, that each designate a light emitting element to be lit among the plural light emitting elements in the on state, and that successively transfer the on state; plural three-terminal switch elements and plural resistances, each of the plural three-terminal switch elements and each of the plural resistances being connected in series and provided between the second gate of a former transfer thyristor and the first gate of a later transfer thyristor, the former transfer thyristor and the later transfer thyristor being closely arranged upstream and downstream transfer thyristors among the plural transfer thyristors in the order in which the transfer thyristors transfer the on state, the three-terminal switch element and the resistance becoming the on state if the former transfer thyristor becomes the on state and setting the later transfer thyristor in a state in which the later transfer thyristor may be shifted to the on state; and a number N of transfer signal lines, the plural transfer thyristors being selected cyclically and successively in the order in which the transfer thyristors transfer the on state and divided into a number N of groups, N being an integer of 2 or larger, the cathodes or the anodes of transfer thyristors, which belong to each of the N groups, being connected with corresponding one of the N transfer signal lines. In one transfer signal line among the N transfer signal lines, a potential of the transfer signal line when one of the plural transfer thyristors belonging to one of the N groups connected with the transfer signal line is in the on state may be smaller in an absolute value than a potential set for the transfer signal line connected with the later transfer thyristor, when it is assumed that the transfer thyristor in the on state is the former transfer thyristor, and when the later transfer thyristor, which is set in the state in which the later transfer thyristor may be shifted to the on state through the three-terminal switch element and the resistance, is shifted to the on state.

BRIEF DESCRIPTION OF THE DRAWINGS

Exemplary embodiments of the present invention will be described in detail based on the following figures, wherein.

DETAILED DESCRIPTION

An image forming apparatus such as a printer, a copier, or a facsimile, employing an electrophotographic system, executes image formation by irradiating an electrically charged photoconductor member with light with a predetermined wavelength by an optical recording unit in accordance with image information to obtain an electrostatic latent image, then adding a toner to the electrostatic latent image to make the electrostatic latent image visible as a toner image, and transferring and fixing the toner image on and to a recording sheet. As the optical recording unit, in recent years, in addition to an optical scanning system that uses a laser, provides scanning with laser light in a main-scanning direction, and provides exposure to the laser light, there is employed a recording device using a LED print head (LPH), in which plural light emitting diodes (LEDs) are arranged in the main-scanning direction as light emitting elements and serve as a light emitting element array, to meet the demand on reduction in size of the apparatus.

Also, in a light emitting chip, on which a self-scanning light emitting device (SLED) array is mounted, the SLED having plural light emitting elements provided in a row form on a substrate, light-on control being successively executed on the light emitting elements, light emitting thyristors are used as the light emitting elements.

Exemplary embodiments of the invention are described in detail below with reference to the attached drawings.

First Exemplary Embodiment

Image Forming Apparatus 1

Figure 1:
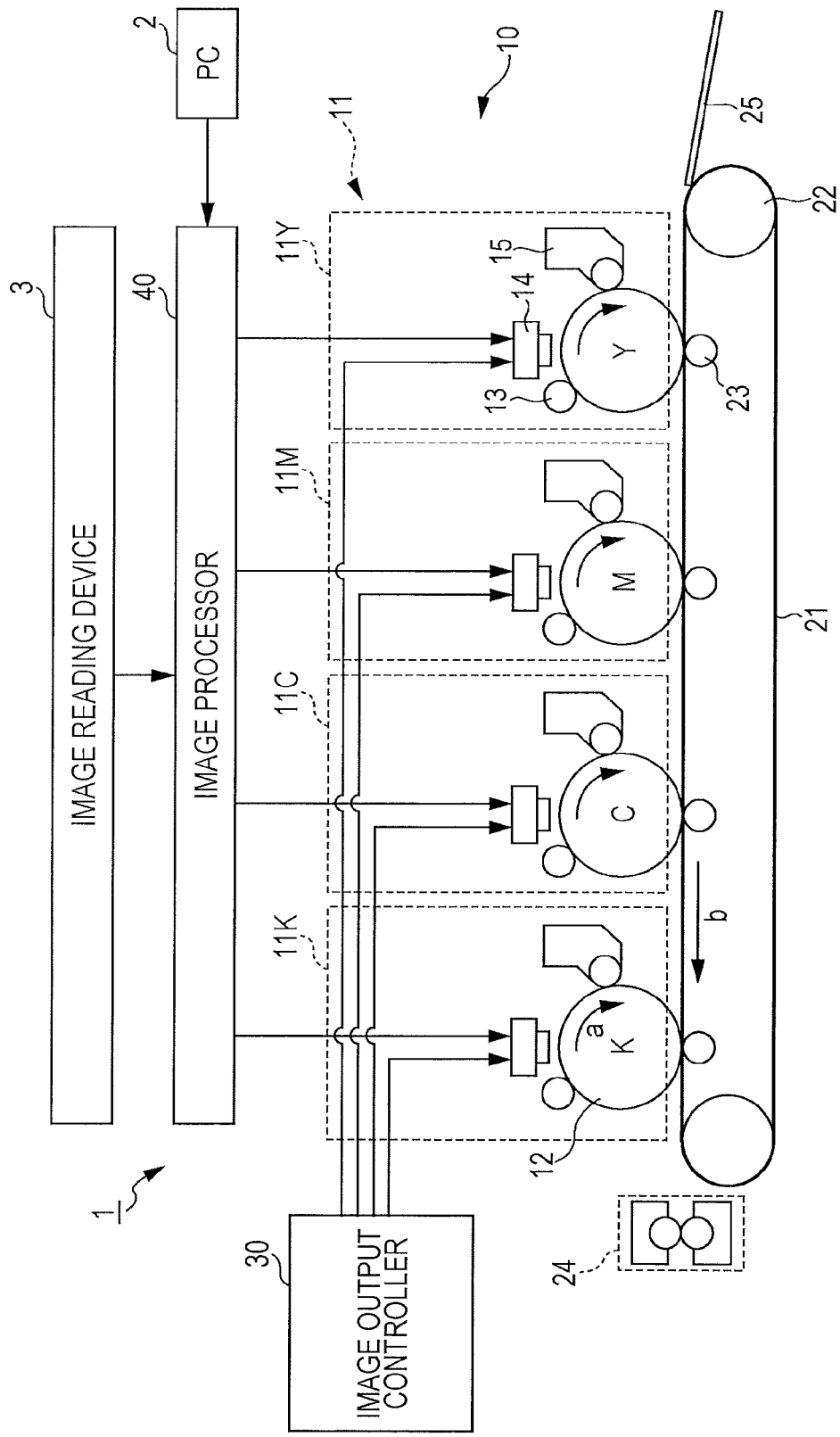
FIG. 1 is an illustration showing an example of a general configuration of an image forming apparatus to which a first exemplary embodiment is applied.

FIG. 1 is an illustration showing an example of a general configuration of an image forming apparatus 1 to which a first exemplary embodiment is applied. The image forming apparatus 1 shown in FIG. 1 is an image forming apparatus typically called tandem type. The image forming apparatus 1 includes an image forming process unit 10 that executes image formation in accordance with image data of each color, an image output controller 30 that controls the image forming process unit 10, and an image processor 40 that is connected with, for example, a personal computer (PC) 2 or an image reading device 3 and provides predetermined image processing on image data received from the PC 2 or the image reading device 3.

The image forming process unit 10 includes an image forming unit 11 having plural engines arranged in parallel at predetermined intervals. The image forming unit 11 includes four image forming units 11Y, 11M, 11C, and 11K. Each of the image forming units 11Y, 11M, 11C, and 11K includes a photoconductor drum 12 as an example of an image holding member that forms an electrostatic latent image and holds a toner image, a charging section 13 as an example of a charging unit that charges the surface of the photoconductor drum 12 with a predetermined potential, a print head 14 as an example of an exposure unit that exposes the photoconductor drum 12 electrically charged by the charging section 13, to light, and a developing section 15 as an example of a developing unit that develops the electrostatic latent image obtained by the print head 14. The image forming units 11Y, 11M, 11C, and 11K form toner images of yellow (Y), magenta (M), cyan (C), and black (K), respectively.

Also, to transfer the toner images of the respective colors formed by the photoconductor drums 12 of the image forming units 11Y, 11M, 11C, and 11K on a recording sheet 25 as an example of a transfer-target material in a superposed manner, the image forming process unit 10 includes a sheet transport belt 21 that transports the recording sheet 25, a driving roller 22 being a roller that drives the sheet transport belt 21, transfer rollers 23 that serve as an example of a transfer unit and transfer the toner images of the photoconductor drums 12 on the recording sheet 25, and a fixing unit 24 that fixes the toner images to the recording sheet 25.

In the image forming apparatus 1, the image forming process unit 10 executes an image forming operation in accordance with various control signals supplied from the image output controller 30. The image processor 40 provides image processing on the image data received from the PC 2 or the image reading device 3 under control by the image output controller 30. The processed image data is supplied to the image forming unit 11. For example, in the image forming unit 11K of black (K) color, the photoconductor drum 12 is charged with the predetermined potential by the charging section 13 while rotating in an arrow a direction. The photoconductor drum 12 is exposed to light by the print head 14 that emits light based on the image data supplied from the image processor 40. Accordingly, an electrostatic latent image relating to the black (K) color image is formed on the photoconductor drum 12. Then, the electrostatic latent image formed on the photoconductor drum 12 is developed by the developing section 15. A toner image of black (K) color is formed on the photoconductor drum 12. Toner images of the respective colors of yellow (Y), magenta (M), and cyan (C) are similarly formed in the image forming units 11Y, 11M, and 11C.

The toner images of the respective colors on the photoconductor drums 12 formed by the image forming units 11 are successively electrostatically transferred on the recording sheet 25 supplied by movement of the sheet transport belt 21, which moves in an arrow b direction, because of a transfer electric field applied to the transfer rollers 23. A composite toner image, in which the respective color toners are superposed, is formed on the recording sheet 25.

Then, the recording sheet 25 having the composite toner image electrostatically transferred thereon is transported to the fixing unit 24. The composite toner image on the recording sheet 25 is transported to the fixing unit 24, receives fixing processing with heat and pressure by the fixing unit 24, and is fixed to the recording sheet 25. The recording sheet 25 after fixing is output from the image forming apparatus 1.

Print Head 14

Figure 2:
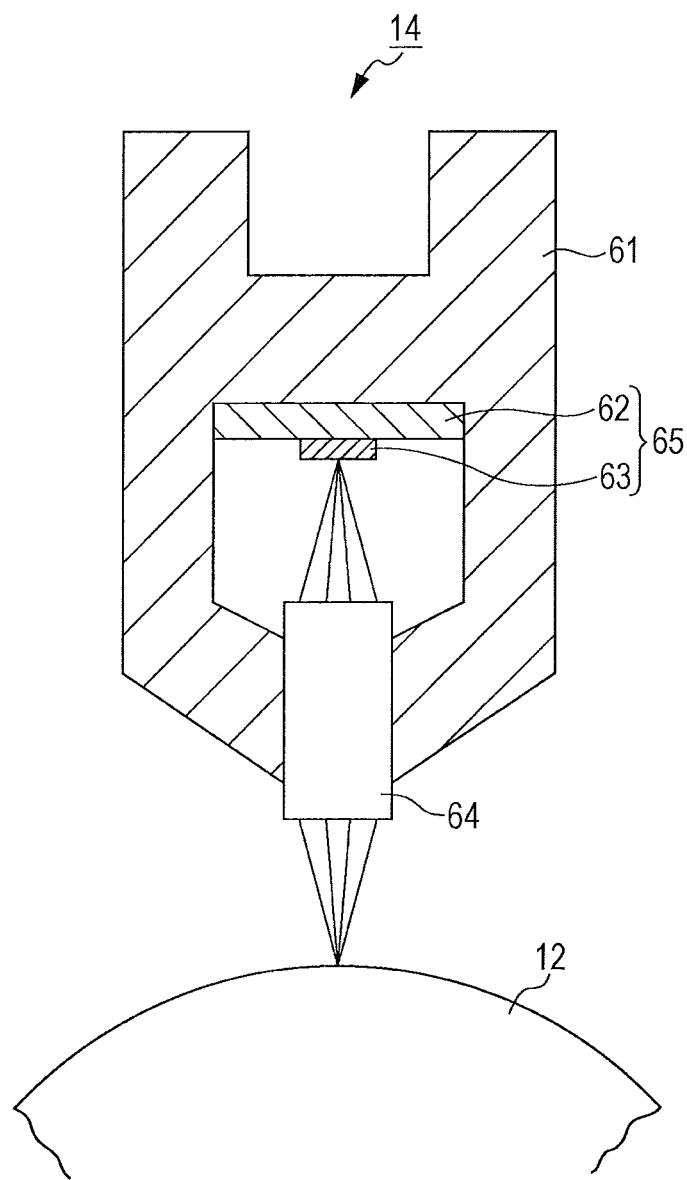
FIG. 2 is a cross-sectional view showing a configuration of a print head.

FIG. 2 is a cross-sectional view showing a configuration of the print head 14. The print head 14 includes a housing 61, a light emitting device 65 as an example of a light emitting unit, and a rod-lens array 64 as an example of an optical unit. The light emitting device 65 includes a light source unit 63 having plural light emitting elements that expose the corresponding photoconductor drum 12 to light (in the first exemplary embodiment, light emitting thyristors). The rod-lens array 64 forms an image of light emitted from the light source unit 63 on the surface of the photoconductor drum 12.

The light emitting device 65 includes the above-described light source unit 63, and a circuit board 62 having a signal generating circuit 110 (see FIG. 3, described later) etc. mounted thereon. The signal generating circuit 110 drives the light source unit 63.

The housing 61 is made of, for example, metal. The housing 61 supports the circuit board 62 and the rod-lens array 64, and is set so that light emitting surfaces of the light emitting elements of the light source unit 63 (a surface of a region 311 in FIGS. 6A and 6B, described later) serve as a focal plane of the rod-lens array 64. Also, the rod-lens array 64 is arranged along the axial direction of the photoconductor drum 12 (i.e., main-scanning direction, or X direction in FIGS. 3 and 4B, described later).

Light Emitting Device 65

Figure 3:
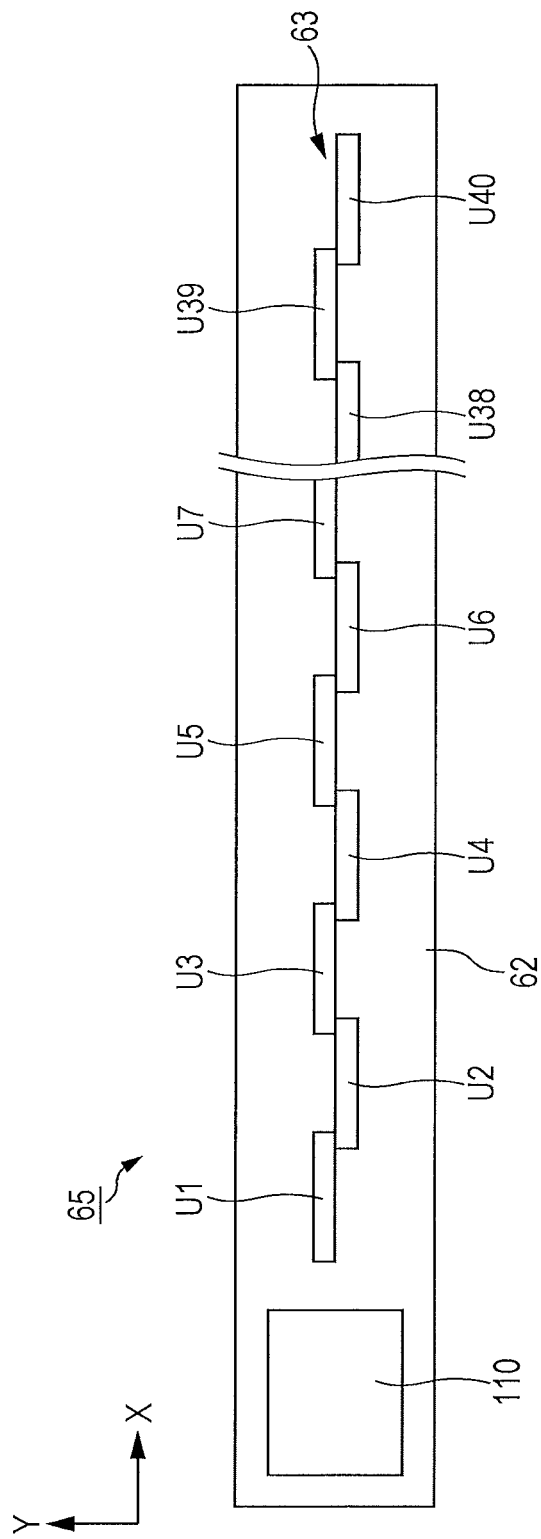
FIG. 3 is a top view of a light emitting device to which the first exemplary embodiment is applied.

FIG. 3 is a top view of the light emitting device 65 to which the first exemplary embodiment is applied.

In the light emitting device 65 shown as an example in FIG. 3, the light source unit 63 includes 40 light emitting chips U1-U40, as an example of a light emitting part, arranged on the circuit board 62 in a staggered manner of two rows in the X direction, which is the main-scanning direction.

In this specification, hyphen "-" represents plural components distinguished from each other by reference signs, and components with reference signs written before and after "-" and components with reference signs between the written reference signs are included. For example, the light emitting chips U1-U40 include light emitting chips from a light emitting chip U1 to a light emitting chip U40 in the order of the numbers.

The light emitting chips U1-U40 may have the same configuration. Therefore, the light emitting chips U1-U40 are called light emitting chip(s) U unless otherwise distinguished from each other.

In the first exemplary embodiment, the number of light emitting chips U is 40 in total; however, the number is not limited to 40.

Also, the light emitting device 65 includes the signal generating circuit 110 that drives the light source unit 63. The signal generating circuit 110 is formed of, for example, an integrated circuit (IC) and other part. Alternatively, the light emitting device 65 may not include the signal generating circuit 110. In this case, the signal generating circuit 110 is provided outside the light emitting device 65, and supplies a control signal for controlling the light emitting chips U1-U40 and other signal to the light emitting device 65 through a cable or other member. Herein, description is given on the assumption that the light emitting device 65 includes the signal generating circuit 110.

The array of the light emitting chips U1-U40 is described later in detail.

Figure 4:
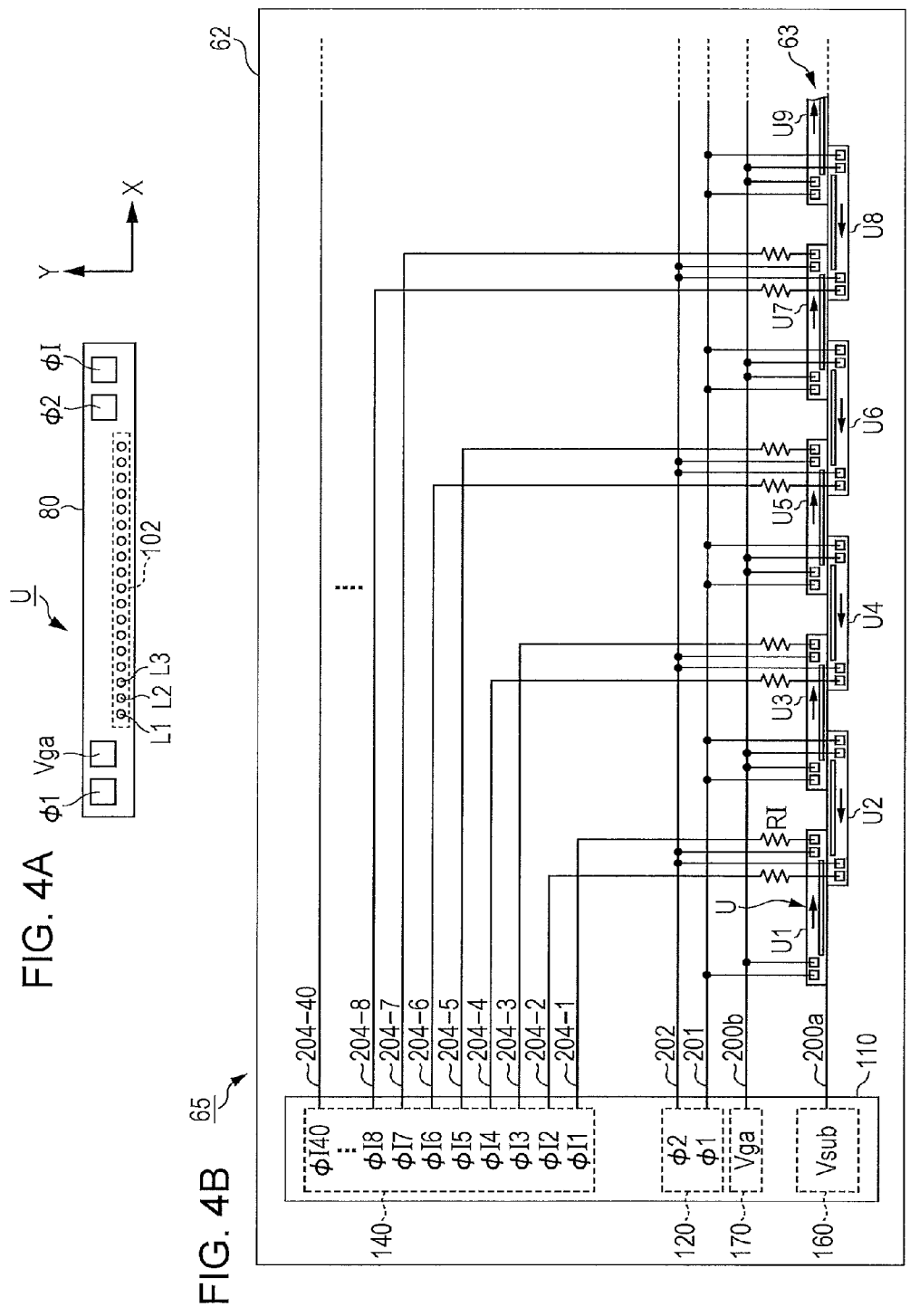
FIGS. 4A and 4B illustrate examples of a configuration of a light emitting chip, a configuration of a signal generating circuit of the light emitting device, and a configuration of wiring (lines) on a circuit board to which the first exemplary embodiment is applied.

FIGS. 4A and 4B illustrate examples of a configuration of a light emitting chip U, a configuration of the signal generating circuit 110 of the light emitting device 65, and a configuration of wiring (lines) on the circuit board 62 to which the first exemplary embodiment is applied. FIG. 4A shows the configuration of the light emitting chip U. FIG. 4B shows the configuration of the signal generating circuit 110 of the light emitting device 65, and the configuration of wiring (lines) on the circuit board 62.

First, the configuration of the light emitting chip U shown in FIG. 4A is described.

The light emitting chip U includes a light emitting section 102 having plural light emitting elements (in the first exemplary embodiment, light emitting thyristors L1, L2, L3, . . . ) provided in a row form along the long side in one long-side portion on the front surface of a substrate 80, which has a rectangular front-surface shape. Further, the light emitting chip U includes terminals (φ1 terminal, φ2 terminal, Vga terminal, φI terminal) serving as plural bonding pads that acquire various control signals and other signals, at both end portions in the long-side direction of the front surface of the substrate 80. The terminals are provided in the order of φ1 terminal, and Vga terminal from one end of the substrate 80, and in the order of the φI terminal and φ2 terminal from the other end of the substrate 80. The light emitting section 102 is provided between the Vga terminal and the φ2 terminal. Further, a back-surface electrode 85 (see FIG. 6B, described later) as a Vsub terminal is provided on the back surface of the substrate 80.

The "row form" is not limited to a form in which plural light emitting elements are arranged in a straight line as shown in FIG. 4A, and also includes a form in which plural light emitting elements are arranged with different displacement amounts in a direction orthogonal to the row direction. For example, if light emitting surfaces of light emitting elements (the surface of the region 311 in FIGS. 6A and 6B, described later) serve as pixels, the light emitting elements may be arranged with displacement amounts by several pixels or several tens of pixels in the direction orthogonal to the row direction. Alternatively, individual adjacent light emitting elements may be alternately arranged, or plural light emitting elements may be arranged in a zigzag form by the unit of certain number of light emitting elements.

Next, the configuration of the signal generating circuit 110 of the light emitting device 65 and the configuration of wiring (lines) on the circuit board 62 are described with reference to FIG. 4B.

As described above, the signal generating circuit 110 and the light emitting chips U1-U40 are mounted on the circuit board 62 of the light emitting device 65, and wiring (lines) for connection between the signal generating circuit 110 and the light emitting chips U1-U40 is provided.

First, the configuration of the signal generating circuit 110 is described.

The signal generating circuit 110 receives image data after image processing and various control signals from the image output controller 30 and the image processor 40 (see FIG. 1). The signal generating circuit 110, for example, sorts the image data and corrects the light quantity, based on the image data and the various control signals.

The signal generating circuit 110 includes a transfer signal generating unit 120 that transmits a first transfer signal φ1 and a second transfer signal φ2 to the light emitting chips U1-U40 based on the various control signals. The first transfer signal φ1 and the second transfer signal φ2 are expressed as transfer signal(s) unless otherwise distinguished from each other.

The signal generating circuit 110 also includes a light-on signal generating unit 140 that transmits light-on signals φI1-φI40 to the light emitting chips U1-U40, respectively, based on the various control signals. The light-on signals φI1-φI40 are expressed as light-on signal(s) φI unless otherwise distinguished from each other.

The signal generating circuit 110 further includes a reference potential supply unit 160 that supplies a reference potential Vsub serving as a reference of a potential to the light emitting chips U1-U40, and a power potential supply unit 170 that supplies a driving power to the light emitting chips U1-U40 by giving a power potential Vga to the light emitting chips U1-U40.

Next, the array of the light emitting chips U1-U40 is described.

The odd-numbered light emitting chips U1, U3, U5, . . . are arranged in a row at intervals in the long-side direction of the substrate 80. The even-numbered light emitting chips U2, U4, U6, . . . are also arranged in a row at intervals in the long-side direction of the substrate 80. The odd-numbered light emitting chips U1, U3, U5, . . . and the even-numbered light emitting chips U2, U4, U6, . . . are arranged in a staggered manner and in a manner rotated by 180° so that the long sides near the light emitting sections 102 on the light emitting chips U of the odd-numbered light emitting chips U1, U3, U5, . . . face those of the even-numbered light emitting chips U2, U4, U6, . . . . Also, the light emitting elements are arranged at predetermined intervals in the main-scanning direction (X direction) even in an area between the light emitting chips U. In each of the light emitting chips U1, U2, U3, . . . in FIG. 4B, the direction of arrangement of the light emitting elements in the light emitting section 102 (in the first exemplary embodiment, in the order of the numbers of the light emitting thyristors L1, L2, L3, . . . ) shown in FIG. 4A is indicated by an arrow.

The wiring (lines) for connection between the signal generating circuit 110 and the light emitting chips U1-U40 is described.

The circuit board 62 has a power line 200a that is connected with the back-surface electrodes 85 as the Vsub terminals provided on the back surfaces (see FIG. 6B, described later) of the substrates 80 of the light emitting chips U, and supplies the reference potential Vsub to the Vsub terminals.

The circuit board 62 also has a power line 200b that is connected with the Vga terminals provided on the light emitting chips U and supplies the power potential Vga for driving to the Vga terminals.

The circuit board 62 further has a first transfer signal line 201 that transmits the first transfer signal φ1 to the φ1 terminals of the light emitting chips U1-U40, and a second transfer signal line 202 that transmits the second transfer signal φ2 to the φ2 terminals of the light emitting chips U1-U40, from the transfer signal generating unit 120 of the signal generating circuit 110. The φ1 terminal and the φ2 terminal are reception terminals for the transfer signals (first transfer signal φ1, second transfer signal φ2).

The circuit board 62 further has light-on signal lines 204-1 to 204-40 that transmit the light-on signals φI1-φI40 to the φI terminals of the light emitting chips U1-U40 through current limiting resistances RI, respectively, from the light-on signal generating unit 140 of the signal generating circuit 110.

The reference potential Vsub and the power potential Vga are commonly supplied to all light emitting chips U1-U40 on the circuit board 62. The first transfer signal φ1 and the second transfer signal φ2 are also commonly (parallely) transmitted to the light emitting chips U1-U40.

In contrast, the light-on signals φI1-φI40 are individually transmitted to the light emitting chips U1-U40, respectively.

If the light emitting device 65 does not include the signal generating circuit 110, the power lines 200a and 200b, the first transfer signal line 201, the second transfer signal line 202, and the light-on signal lines 204-1 to 204-40 on the circuit board 62 are connected with connectors or other members provided instead of the signal generating circuit 110. Then, these signal lines are connected with the signal generating circuit 110 provided outside the circuit board 62 through cables connected with the connectors or other members.

Light Emitting Chip U

Figure 5:
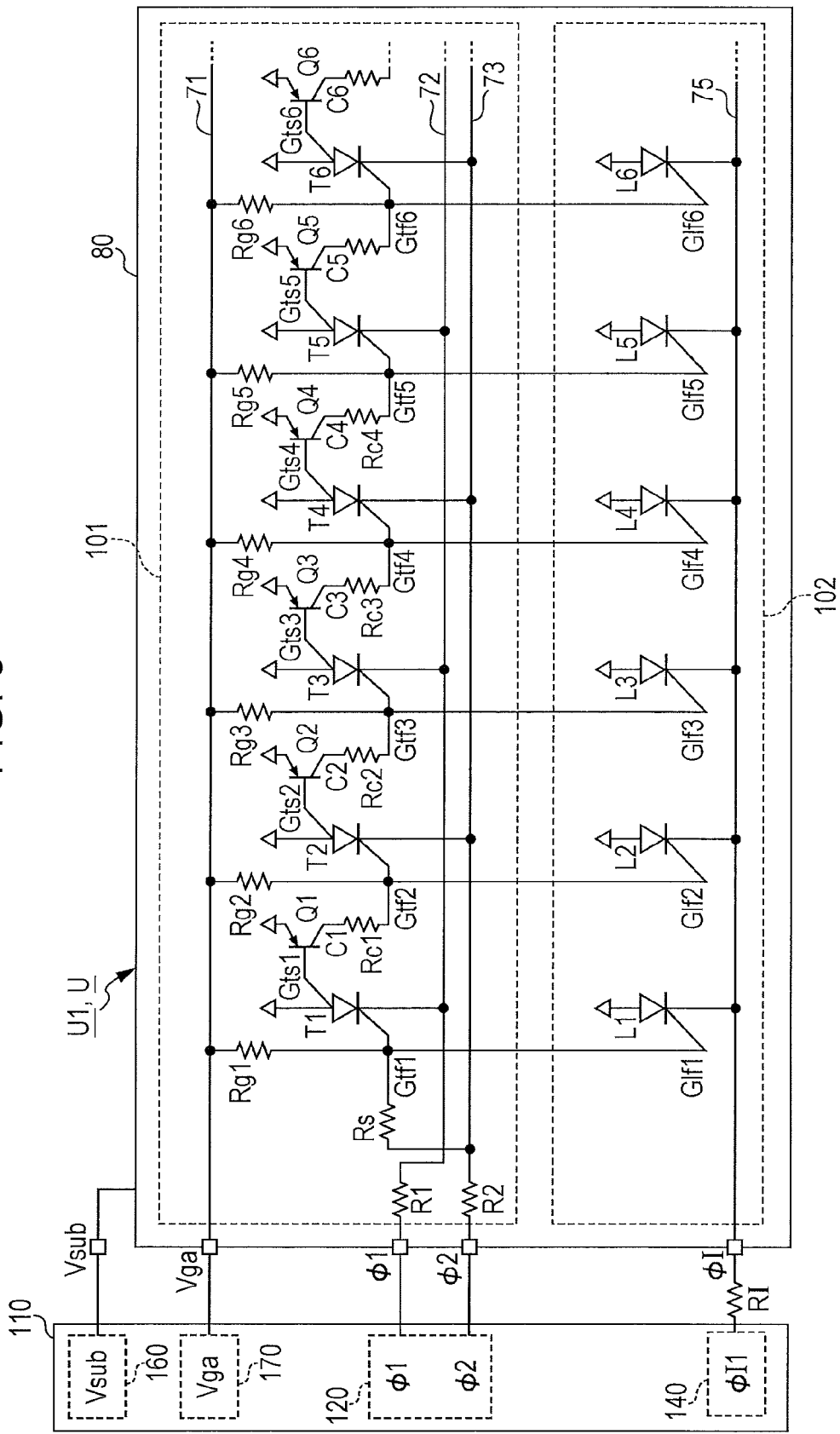
FIG. 5 is an example of an equivalent circuit diagram explaining a circuit configuration of the light emitting chip with a self-scanning light emitting device (SLED) array mounted to which the first exemplary embodiment is applied.

FIG. 5 is an example of an equivalent circuit diagram explaining a circuit configuration of a light emitting chip U with a self-scanning light emitting device (SLED) array mounted to which the first exemplary embodiment is applied. Respective elements, which are described below, are arranged in accordance with a layout on the light emitting chip U (see FIGS. 6A and 6B, described later) except for the terminals (φ1 terminal, φ2 terminal, Vga terminal, φI terminal). The positions of the terminals (φ1 terminal, φ2 terminal, Vga terminal, φI terminal) are illustrated at the left end of the drawing for convenience of the description although the positions are different from those in FIG. 4A. Also, the Vsub terminal provided on the back surface of the substrate 80 is illustrated while being led outside the substrate 80.

Herein, the light emitting chip U1 is described as the light emitting chip U in relation to the signal generating circuit 110. Hence, the light emitting chip U is expressed as light emitting chip U1(U) in the following description, and illustrated as U1, U in FIG. 5. The configurations of the other light emitting chips U2-U40 are the same as the configuration of the light emitting chip U1.

The light emitting chip U1(U) has the light emitting thyristor row including light emitting thyristors L1, L2, L3, . . . (light emitting section 102 (see FIG. 4A)) arranged in a row form on the substrate 80 as described above.

The light emitting chip U1(U) has a transfer thyristor row including transfer thyristors T1, T2, T3, . . . , arranged in a row form similarly to the light emitting thyristor row.

The light emitting chip U1(U) has pairs each including two of the transfer thyristors T1, T2, T3, . . . in the order of the numbers, and has coupling transistors Q1, Q2, Q3, . . . , which are pnp bipolar transistors, each being arranged between the corresponding pair.

The light emitting chip U1(U) includes resistances Rc1, Rc2, Rc3, . . . , and resistances Rg1, Rg2, Rg3, . . . .

Further, the light emitting chip U1(U) includes current limiting resistances R1 and R2 that prevent excessive current from flowing to a first transfer signal line 72 to which the first transfer signal φ1 is transmitted, and a second transfer signal line 73 to which the second transfer signal φ2 is transmitted (described later).

Further, the light emitting chip U1 includes a start resistance Rs.

The light emitting thyristors L1, L2, L3, . . . in the light emitting thyristor row, and the transfer thyristors T1, T2, T3, . . . in the transfer thyristor row are arranged in the order of the numbers from the left side in FIG. 5. Further, the coupling transistors Q1, Q2, Q3, . . . , the resistances Rg1, Rg2, Rg3, . . . , and the resistances Rc1, Rc2, Rc3 are also arranged in the order of the numbers from the left side of the drawing.

The light emitting thyristor row and the transfer thyristor row are arranged in the order of the transfer thyristor row and the light emitting thyristor row from the upper side in FIG. 5.

Herein, the light emitting thyristors L1, L2, L3, . . . , the transfer thyristors T1, T2, T3, . . . , the coupling transistors Q1, Q2, Q3, . . . , the resistances Rc1, Rc2, Rc3, . . . , and the resistances Rg1, Rg2, Rg3, . . . are expressed as light emitting thyristor(s) L, transfer thyristor(s) T, coupling transistor(s) Q, resistance(s) Rc, and resistance(s) Rg unless otherwise distinguished from each other.

The number of light emitting thyristors L in the light emitting thyristor row may be a predetermined number. In the first exemplary embodiment, if the number of light emitting thyristors L is, for example, 128, the number of transfer thyristors T is also 128. Similarly, the number of resistances Rg and the number of resistances Rc is 128. However, the number of coupling transistors Q is 127, which is smaller than the number of transfer thyristors T by one.

Alternatively, the number of transfer thyristors T may be larger than the number of light emitting thyristors L.

FIG. 5 shows a portion around the light emitting thyristors L1-L6, and the transfer thyristors T1-T6.

The thyristors (light emitting thyristors L, transfer thyristors T) are each a semiconductor element having a first gate, a second gate, an anode, and a cathode. The coupling transistors Q are each a semiconductor element including a collector, a base, and an emitter.

Although described later, the thyristor and the coupling transistor Q may be connected such that a p-type ohmic electrode or an n-type ohmic electrode is provided in a portion of a semiconductor layer corresponding to any of a first gate, a second gate, an anode, a cathode, a collector, a base, and an emitter and connection is provided through wiring; or may be connected with each other through a semiconductor layer.

In this case, the thyristor (light emitting thyristor L, transfer thyristor T) and the coupling transistor Q are indicated by circuit symbols, and an anode or a cathode of the thyristor (light emitting thyristor L, transfer thyristor T) may not be occasionally indicated by a circuit symbol whereas a first gate (Glf, Gtf, described later) and a second gate (Gts, described later) are indicated. Similarly, an emitter or a base of the coupling transistor Q may not be occasionally indicated by a circuit symbol whereas a collector (C, described later) is indicated.

Next, electric connection of respective elements in the light emitting chip U1(U) is described.

The anodes of the transfer thyristors T and the light emitting thyristors L are connected with the substrate 80 of the light emitting chip U1(U) (anode common). The emitters of the coupling transistors Q are also connected with the substrate 80 of the light emitting chip U1(U).

The anodes are connected with the power line 200a (see FIG. 4B) through the back-surface electrode 85 (see FIG. 6B, described later) being the Vsub terminal provided on the back surface of the substrate 80. The reference potential Vsub is supplied to the power line 200a from the reference potential supply unit 160.

The cathodes of the odd-numbered (odd-number-th) transfer thyristors T1, T3, . . . are connected with the first transfer signal line 72 along the transfer thyristor row.

The first transfer signal line 72 is connected with the φ1 terminal through the current limiting resistance R1. The φ1 terminal is connected with the first transfer signal line 201 (see FIG. 4B), and the first transfer signal φ1 is transmitted to the φ1 terminal from the transfer signal generating unit 120.

The cathodes of the even-numbered (even-number-th) transfer thyristors T2, T4, . . . are connected with the second transfer signal line 73 along the transfer thyristor row. The second transfer signal line 73 is connected with the φ2 terminal through the current limiting resistance R2. The φ2 terminal is connected with the second transfer signal line 202 (see FIG. 4B), and the second transfer signal φ2 is transmitted to the φ2 terminal from the transfer signal generating unit 120.

Herein, the first transfer signal φ1 and the second transfer signal φ2 are used (N is 2 if the number of transfer signals is N (integer of 2 or larger)). Hence, the cathodes of the odd-numbered transfer thyristors T are connected with the first transfer signal line 72, and the cathodes of the even-numbered transfer thyristors T are connected with the second transfer signal line 73. If three or more transfer signals are used (N>2), the transfer thyristors T are selected by circulation in the order of the numbers (cyclically), and connected with respective transfer signal lines to which respective transfer signals are transmitted.

The cathodes of the light emitting thyristors L are connected with a light-on signal line 75. The light-on signal line 75 is connected with the φI terminal. In the light emitting chip U1, the φI terminal is connected with the light-on signal line 204-1 through the current limiting resistance RI, and the light-on signal φI1 is transmitted from the light-on signal generating unit 140 to the φI terminal. The light-on signal φI1 supplies current which turns on the light emitting thyristors L. The φI terminals of the other light emitting chips U2-U40 are connected with the light-on signal lines 204-2 to 204-40 through the current limiting resistances RI, respectively, and the light-on signals φI2-φI40 are transmitted to the φI terminals from the light-on signal generating unit 140.

First gates Gtf1, Gtf2, Gtf3, . . . of the transfer thyristors T1, T2, T3 . . . are connected with first gates Glf1, Glf2, Glf3, . . . of the corresponding-number light emitting thyristors L1, L2, L3, . . . by one-to-one correspondence. Hence, each of the first gates Gtf1, Gtf2, Gtf3, . . . of the transfer thyristors T1, T2, T3, . . . , and corresponding one of the first gates Glf1, Glf2, Glf3, . . . of the light emitting thyristors L1, L2, L3, . . . have the same potential. Hence, the situation having the same potential is expressed by, for example, first gate Gtf1 (first gate Glf1).

The coupling transistor Q1 and the resistance Rc1 are connected between a second gate Gts1 of the transfer thyristor T1 and the first gate Gtf2 of the transfer thyristor T2. The second gate Gts1 of the transfer thyristor T1 is connected with the base of the coupling transistor Q1, and the first gate Gtf2 of the transfer thyristor T2 is connected with a collector C1 of the coupling transistor Q1 through the resistance Rc1.

Two transfer thyristors T of continuous numbers of 2 or larger are similarly connected through the coupling transistor Q and the resistance Rc.

The coupling transistor Q and the resistance Rc are connected in series. The coupling transistor Q and the resistance Rc are an example of a connection member.

Herein, the first gates Gtf1, Gtf2, Gtf3, . . . , second gates Gts1, Gts2, Gts3, . . . , and the first gates Glf1, Glf2, Glf3, . . . are respectively expressed as first gate(s) Gtf, second gate(s) Gts, and first gate(s) Glf unless otherwise distinguished from each other. The situation having the same potential is expressed by, for example, first gate(s) Gtf (first gate(s) Glf).

The light emitting thyristors L also have second gates; however, the second gates do not have reference signs because the second gates are not connected with other element.

The first gates Gtf (first gates Glf) of the transfer thyristors T are connected with a power line 71 through the resistances Rg provided respectively for the transfer thyristors T. The power line 71 is connected with the Vga terminal. The Vga terminal is connected with the power line 200b (see FIG. 4B) and the power potential Vga is supplied from the power potential supply unit 170 to the Vga terminal.

The first gate Gtf1 of the transfer thyristor T1 at one end of the transfer thyristor row is connected with one terminal of the start resistance Rs. In contrast, the other terminal of the start resistance Rs is connected with the second transfer signal line 73. Accordingly, the transfer thyristor T1 serves as a transfer thyristor T that transfers the on state first.

In FIG. 5, a portion including the transfer thyristors T, the coupling transistors Q, the resistances Rc, the resistances Rg, the start resistance Rs, and the current limiting resistances R1 and R2 of the light emitting chip U1(U) is expressed as transfer section 101. A portion including the light emitting thyristors L corresponds to the light emitting section 102.

Figure 6B:
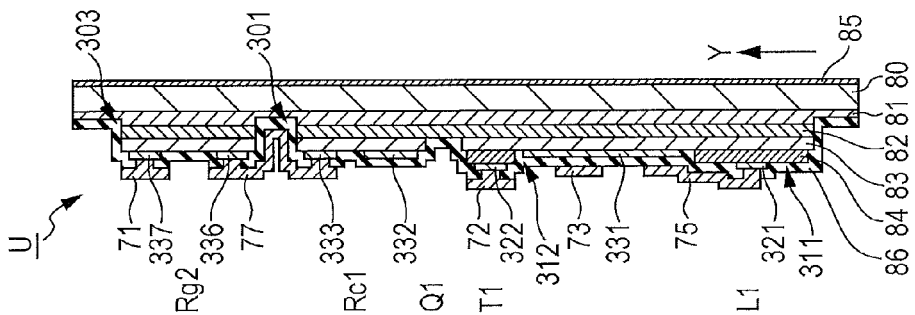
FIGS. 6A and 6B are examples of a plan layout view and a cross-sectional view of the light emitting chip to which the first exemplary embodiment is applied.
Figure 6A:
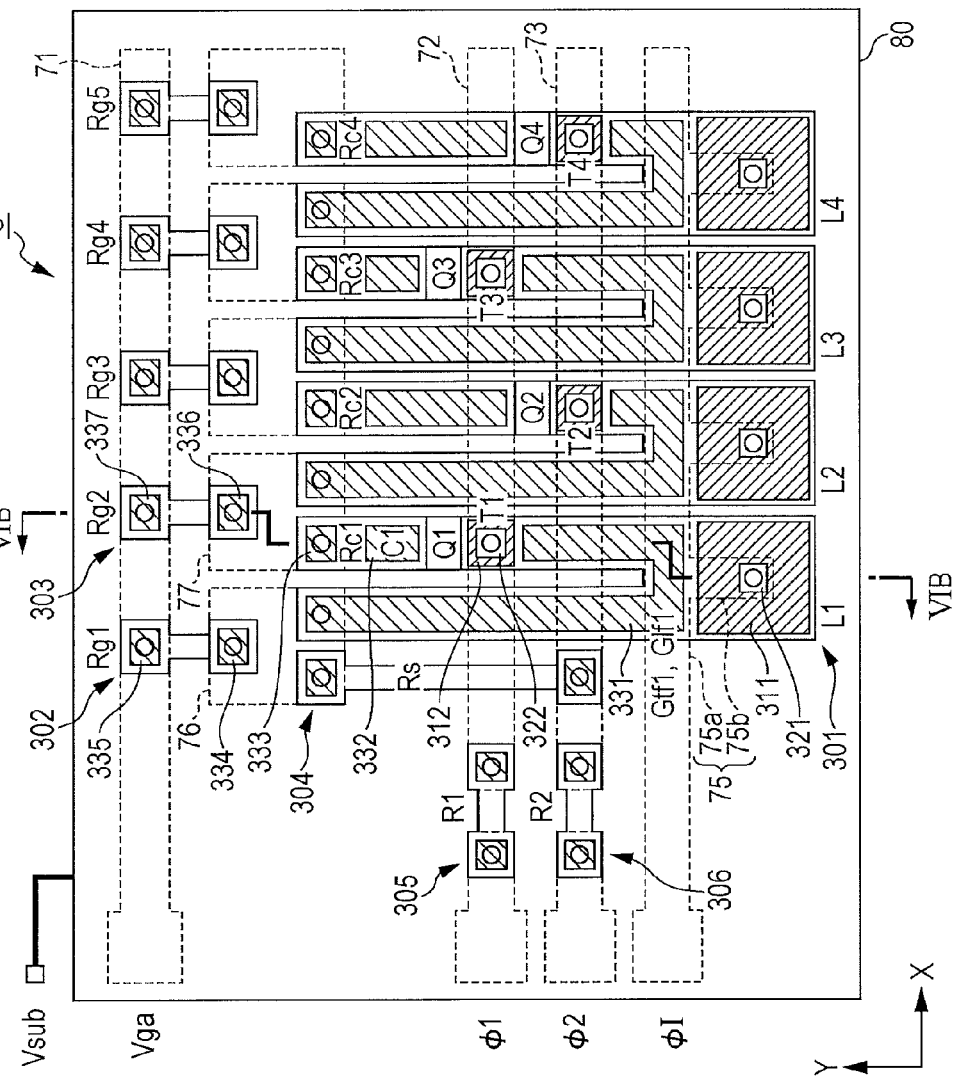

FIGS. 6A and 6B are examples of a plan layout view and a cross-sectional view of a light emitting chip U to which the first exemplary embodiment is applied. Herein, since connection relationship between a light emitting chip U and the signal generating circuit 110 is not illustrated, the light emitting chip U1 does not have to be an example. Hence, the light emitting chip U is used.

FIG. 6A is a plan layout view of a light emitting chip U, and illustrates a portion including the light emitting thyristors L1-L4 and the transfer thyristors T1-T4. The positions of the terminals (φ1 terminal, φ2 terminal, Vga terminal, φI terminal) are illustrated at the left end of the drawing for convenience of the description although the positions are different from those in FIG. 4A. Also, the Vsub terminal serving as the back-surface electrode 85 provided on the back surface of the substrate 80 is illustrated while being led outside the substrate 80. If the terminals are provided according to FIG. 4A, the φ2 terminal, the φI terminal, and the current limiting resistance R2 are provided at a right end portion of the substrate 80 in FIG. 6A. The start resistance Rs is provided in an end portion of the transfer thyristor row, at the side at which transfer is started.

In FIG. 6A, wiring lines (power line 71, first transfer signal line 72, second transfer signal line 73, light-on signal line 75) are indicated by broken lines to illustrate the structure below the wiring lines.

FIG. 6B is a cross-sectional view taken along line VIB-VIB in FIG. 6A. The cross-sectional view of FIG. 6B illustrates cross sections of the light emitting thyristor L1, the transfer thyristor T1, the coupling transistor Q1, the resistance Rc1, and the resistance Rg2 from the lower side of the drawing. FIGS. 6A and 6B illustrate element names, the first gate Gtf1 of the transfer thyristor T1, the first gate Glf1 of the light emitting thyristor L1, and the collector C1 of the coupling transistor Q1.

As shown in FIG. 6B, the light emitting chip U has plural island-shaped regions (islands) (first island 301, second island 302, third island 303, etc., described later). The plural islands are formed by separating a semiconductor stack. The semiconductor stack is formed by laminating a p-type first semiconductor layer 81, an n-type second semiconductor layer 82 as an example of a second conductive type, a p-type third semiconductor layer 83, and an n-type fourth semiconductor layer 84 in that order on a p-type substrate 80 as an example of a first conductive type. That is, as shown in FIG. 6B, in the plural islands, at least the n-type second semiconductor layer 82, the p-type third semiconductor layer 83, and the n-type fourth semiconductor layer 84 are separated. The p-type first semiconductor layer 81 may be separated or may not be separated. In FIG. 6B, a portion of the p-type first semiconductor layer 81 in the thickness direction is removed. Alternatively, the p-type first semiconductor layer 81 may also serve as the substrate 80.

Although described later, with the islands, the light emitting thyristors L, the transfer thyristors T, the coupling transistors Q, the resistances Rc, the resistances Rg, and other members are formed by partly or entirely removing the n-type fourth semiconductor layer 84 or the p-type third semiconductor layer 83.

Also, as shown in FIG. 6B, the light emitting chip U has an insulating layer 86 that covers the front and side surfaces of the islands. The islands are connected with wiring via through holes (indicated by open circles in FIG. 6A) provided in the insulating layer 86. In the following description, the description for the insulating layer 86 and the through holes are omitted.

As shown in FIG. 6A, the first island 301 has a U-shaped plan. The light emitting thyristor L1 is provided at a center portion of the U shape, and the transfer thyristor T1, the coupling transistor Q1, and the resistance Rc are provided at one side (right side in FIG. 6A) of the U shape.

The second island 302 and the third island 303 each have a plan shape in which rectangular portions are provided at both ends (upper and lower sides in FIG. 6A) and are connected. The resistance Rg1 is provided at the second island 302, and the resistance Rg2 is provided at the third island 303.

The fourth island 304, a fifth island 305, and a sixth island 306 have plan shapes similar to the second island 302 and the third island 303. The start resistance Rs is provided at the fourth island 304, the current limiting resistance R1 is provided at the fifth island 305, and the current limiting resistance R2 is provided at the sixth island 306.

On the light emitting chip U, plural islands similar to the first island 301 and the second island 302 (third island 303) are provided in parallel. The light emitting thyristors L2, L3, L4, ..., the transfer thyristors T2, T3, T4, ..., the coupling transistors Q2, Q3, Q4, ..., the resistances Rc2, Rc3, Rc4, ..., the resistances Rg3, Rg4, Rg5, ... are provided at islands similarly to the first island 301 and the second island 302 (third island 303).

Also, as shown in FIG. 6B, the back-surface electrode 85 serving as the Vsub terminal is provided on the back surface of the substrate 80.

The details of the first island 301 to the sixth island 306 are described with reference to FIGS. 6A and 6B.

In the first island 301 with the U-shaped plan, the light emitting thyristor L1 provided at the center portion of the U shape has an anode provided by the p-type first semiconductor layer 81 on the p-type substrate 80, and a cathode provided by the region 311 of the n-type fourth semiconductor layer 84. The region 311 is obtained by removing a peripheral region of the n-type fourth semiconductor layer 84. An n-type ohmic electrode 321 is provided on the region 311 of the n-type fourth semiconductor layer 84. The p-type first semiconductor layer 81 may be expressed as anode layer, the n-type fourth semiconductor layer 84 may be expressed as cathode layer, and the n-type ohmic electrode 321 may be expressed as cathode.

Further, the p-type third semiconductor layer 83 serves as the first gate Glf1, and a p-type ohmic electrode 331 is provided on the p-type third semiconductor layer 83 exposed by removing the n-type fourth semiconductor layer 84. The p-type ohmic electrode 331 extends along the inside of the U shape of the first island 301. At the one side (right side in FIG. 6A) of the U shape, the p-type ohmic electrode 331 extends to a position near the transfer thyristor T provided at the center portion, and at the other side (left side in FIG. 6A) of the U shape, the p-type ohmic electrode 331 extends to an end portion of the U shape. The p-type third semiconductor layer 83 may be expressed as first ohmic layer, and the p-type ohmic electrode 331 may be expressed as first gate Glf1.

The n-type second semiconductor layer 82 serves as second gate. The n-type second semiconductor layer 82 may be expressed as second gate layer.

The light emitting thyristor L emits light at the interface between the n-type second semiconductor layer 82 and the p-type third semiconductor layer 83. The light is emitted from a portion of the front surface (light emitting surface) of the region 311 of the n-type fourth semiconductor layer 84 serving as the cathode, through the insulating layer 86. The portion excludes a portion in which emission of light is interrupted (shielded) by the n-type ohmic electrode 321 and a branch portion 75b for connection of the n-type ohmic electrode 321 with the light-on signal line 75.

The transfer thyristor T1 is provided at a center portion at the one side (right side in FIG. 6A) of the U shape of the first island 301. In the portion provided with the transfer thyristor T1, the p-type first semiconductor layer 81 provided on the p-type substrate 80 serves as an anode, and a region 312 of the n-type fourth semiconductor layer 84 obtained by removing a peripheral portion of the n-type fourth semiconductor layer 84 serves as a cathode. An n-type ohmic electrode 322 is provided on the region 312 of the n-type fourth semiconductor layer 84. The p-type first semiconductor layer 81 may be expressed as anode layer, the n-type fourth semiconductor layer 84 may be expressed as cathode layer, and the n-type ohmic electrode 322 may be expressed as cathode.

Further, the p-type third semiconductor layer 83 serves as a first gate Gtf1. The p-type ohmic electrode 331 on the p-type third semiconductor layer 83 may be expressed as first gate Gtf1. That is, the first gate Glf1 of the light emitting thyristor L1 and the first gate Gtf1 of the transfer thyristor T1 are the p-type ohmic electrode 331, and the first gate Gtf1 (first gate Glf1).

The n-type second semiconductor layer 82 serves as second gate Gts1. The n-type second semiconductor layer 82 may be expressed as second gate layer.

The coupling transistor Q1 is provided next to the transfer thyristor T1 at the one side (right side in FIG. 6A) of the U shape of the first island 301 with the U-shaped plan. The n-type fourth semiconductor layer 84 is removed from a portion in which the coupling transistor Q1 is provided. The p-type first semiconductor layer 81 serves as an emitter, the n-type second semiconductor layer 82 serves as a base, and the p-type third semiconductor layer 83 exposed by removing the n-type fourth semiconductor layer 84 serves as a collector C1. A p-type ohmic electrode 332 is provided on the p-type third semiconductor layer 83. Further, the fourth semiconductor layer 84 and the third semiconductor layer 83 are removed in an area between the transfer thyristor T1 and the coupling transistor Q1, and the second semiconductor layer 82 is exposed.

The p-type first semiconductor layer 81 may be expressed as emitter layer, the n-type second semiconductor layer 82 may be expressed as base layer, the p-type third semiconductor layer 83 may be expressed as collector layer, and the p-type ohmic electrode 332 may be expressed as collector C1.

The resistance Rc1 is provided next to the coupling transistor Q1 at the one side (right side in FIG. 6A) of the U shape of the first island 301 with the U-shaped plan. The n-type fourth semiconductor layer 84 is removed from a portion in which the resistance Rc1 is provided. Also, a p-type ohmic electrode 333 is provided in an end portion at the one side of the U shape, on the p-type third semiconductor layer 83 after the n-type fourth semiconductor layer 84 is removed. That is, the resistance Rc1 uses the p-type third semiconductor layer 83 between the p-type ohmic electrode 332 and the p-type ohmic electrode 333.

As shown in FIG. 6B, the portion of the p-type first semiconductor layer 81 serving as the anode of the light emitting thyristor L1, the portion of the p-type first semiconductor layer 81 serving as the anode of the transfer thyristor T1, the portion of the p-type first semiconductor layer 81 serving as the emitter of the coupling transistor Q1, and the portion of the p-type first semiconductor layer 81 serving as the resistance Rc are continuously arranged.

Also, the portion of the n-type second semiconductor layer 82 serving as the second gate of the light emitting thyristor L1, the portion of the n-type second semiconductor layer 82 serving as the second gate of the transfer thyristor T1, the portion of the n-type second semiconductor layer 82 serving as the base of the coupling transistor Q1, and the portion of the n-type second semiconductor layer 82 serving as the resistance Rc are continuously arranged.

The portion of the p-type third semiconductor layer 83 serving as the first gate Glf1 of the light emitting thyristor L1 and the portion of the p-type third semiconductor layer 83 serving as the first gate Gtf1 of the transfer thyristor T1 are continuously arranged.

Also, the portion of the p-type third semiconductor layer 83 serving as the collector C1 of the coupling transistor Q1 and the portion of the p-type third semiconductor layer 83 serving as the resistance Rc1 are continuously arranged.

However, the portion of the p-type third semiconductor layer 83 serving as the first gate Gtf1 of the transfer thyristor T1 and the portion of the p-type third semiconductor layer 83 serving as the collector C1 of the coupling transistor Q1 are not continuously arranged. The p-type third semiconductor layer 83 may be provided between the transfer thyristor T1 and the coupling transistor Q1 if electric isolation is provided by depletion etc.

The n-type fourth semiconductor layer 84 is removed from the second island 302 in which the resistance Rg1 is provided. A p-type ohmic electrode 334 and a p-type ohmic electrode 335 are provided on the exposed p-type third semiconductor layer 83. Also, a portion of the p-type third semiconductor layer 83 between the p-type ohmic electrode 334 and the p-type ohmic electrode 335 provided on the p-type third semiconductor layer 83 serves as the resistance Rg1. The third island 303 provided with the resistance Rg2 is similarly formed. That is, a portion of the p-type third semiconductor layer 83 between a p-type ohmic electrode 336 and a p-type ohmic electrode 337 provided on the exposed p-type third semiconductor layer 83 serves as the resistance Rg2.

The start resistance Rs provided at the fourth island 304, the current limiting resistance R1 provided at the fifth island 305, and the current limiting resistance R2 provided at the sixth island 306 use respective portions of the p-type third semiconductor layer 83, each of the portions being arranged between two p-type ohmic electrodes (no reference signs), similarly to the resistance Rg1 provided at the second island 302.

In FIG. 6A, connection relationship among respective elements is described.

The light-on signal line 75 includes a trunk portion 75a and plural branch portions 75b. The trunk portion 75a extends along the row direction of the light emitting thyristor row. One of the branch portions 75b is branched from the trunk portion 75a, and is connected with the n-type ohmic electrode 321 (cathode) on the region 311 of the n-type fourth semiconductor layer 84 of the light emitting thyristor L1 provided at the first island 301. The cathodes of the other light emitting thyristors L provided at islands similar to the first island 301 are connected with the light-on signal line 75 likewise. The light-on signal line 75 is connected with the φI terminal.

The first transfer signal line 72 is connected with the n-type ohmic electrode 322 (cathode) on the region 312 of the n-type fourth semiconductor layer 84 of the transfer thyristor T1 provided at the first island 301. The cathodes of the other odd-numbered transfer thyristors T provided at islands similar to the first island 301 are connected with the first transfer signal line 72 likewise. The first transfer signal line 72 is connected with the φ1 terminal through the current limiting resistance R1 provided at the fifth island 305.

In contrast, the second transfer signal line 73 is connected with the cathode of the even-numbered transfer thyristors T provided at islands without a reference sign. The second transfer signal line 73 is connected with the φ2 terminal through the current limiting resistance R2 provided at the sixth island 306.

The power line 71 is connected with the p-type ohmic electrode 335 of the resistance Rg1 provided at the second island 302, and the p-type ohmic electrode 337 of the resistance Rg2 provided at the third island 303. The other resistances Rg provided at islands similar to the second island 302 (third island 303) are connected with the power line 71 likewise. The power line 71 is connected with the Vga terminal.

The p-type ohmic electrode 331 (first gate Gtf1 (first gate Glf1)) provided along the inside of the U shape of the first island 301 with the U-shaped plan extends to an end portion at the other side of the U shape, and is connected with the p-type ohmic electrode 334 of the resistance Rg1 provided at the second island 302 through a connection wiring line 76.

The p-type ohmic electrode 333 (one terminal of the resistance Rc) provided in an end portion at the one side of the U shape of the first island 301 with the U-shaped plan is connected with the p-type ohmic electrode 336 of the resistance Rg2 provided at the third island 303 through a connection wiring line 77.

Although the description is omitted, the other light emitting thyristors L, transfer thyristors T, coupling transistors Q, resistances Rc, and resistances Rg are similarly arranged.

The p-type ohmic electrode 331 (first gate Gtf1 (first gate Glf1)) at the first island 301 and the p-type ohmic electrode 334 (one terminal of the resistance Rg1) at the second island 302 are connected with one p-type ohmic electrode (no reference sign) of the start resistance Rs provided at the fourth island 304 through the aforementioned connection wiring line 76. The other p-type ohmic electrode (no reference sign) of the start resistance Rs is connected with the second transfer signal line 73.

In this way, the light emitting chip U1(U) shown in FIG. 5 is formed.

Transfer Thyristor T, Coupling Transistor Q, and Resistance Rc

Herein, the transfer thyristor T, the coupling transistor Q, and the resistance Rc are described.

Figure 7A:
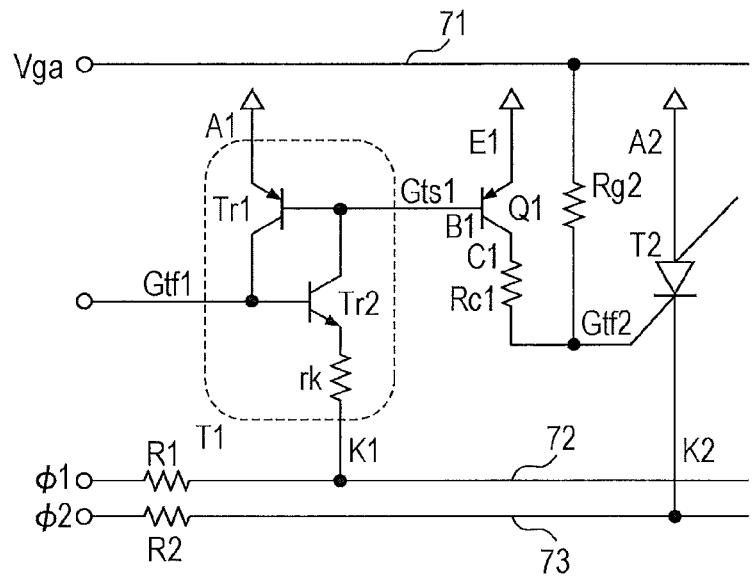
FIGS. 7A and 7B are illustrations explaining a transfer thyristor, a coupling transistor, and a resistance.
Figure 7B:
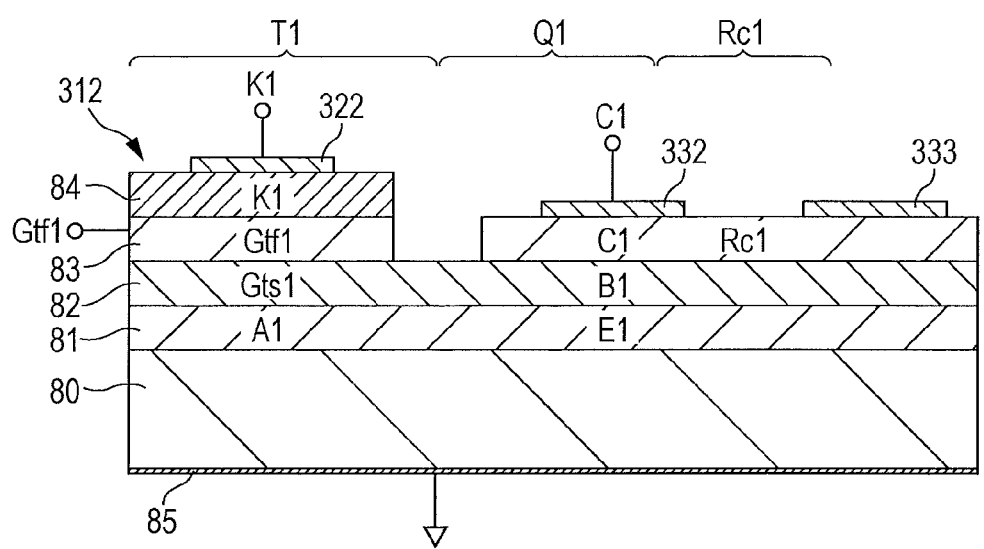

FIGS. 7A and 7B are illustrations explaining the transfer thyristor T1, the transfer thyristor T2, the coupling transistor Q1, and the resistance Rc1. FIG. 7A illustrates the transfer thyristor T1 and the coupling transistor Q1 by using equivalent transistor symbols, and illustrates the transfer thyristor T2 by using a thyristor symbol. FIG. 7B is a cross-sectional view of the transfer thyristor T1, the coupling transistor Q1, and the resistance Rc1. FIG. 7B partly shows the transfer thyristor T1, the coupling transistor Q1, and the resistance Rc1 in an enlarged manner based on the cross-sectional view of FIG. 6B.

In FIGS. 7A and 7B, for easier understanding, it is assumed that the transfer thyristor T1 has an anode A1 and a cathode K1, the transfer thyristor T2 has an anode A2 and a cathode K2, and the coupling transistor Q1 has an emitter E1, a base B1, and a collector C1.

As shown in FIG. 7A, the transfer thyristor T1 has a configuration in which a pnp transistor Tr1 being a pnp bipolar transistor and an npn transistor Tr2 being an npn bipolar transistor are combined. That is, the base of the pnp transistor Tr1 is connected with the collector of the npn transistor Tr2, and the collector of the pnp transistor Tr1 is connected with the base of the npn transistor Tr2. The emitter of the pnp transistor Tr1 is the anode A1 of the transfer thyristor T1, the collector of the pnp transistor Tr1 (the base of the npn transistor Tr2) is the first gate Gtf1 of the transfer thyristor T1, the collector of the npn transistor Tr2 (the base of the pnp transistor Tr1) is the second gate Gts1 of the transfer thyristor T1, and the emitter of the npn transistor Tr2 is the cathode K1 of the transfer thyristor T1. An internal resistance rk of the transfer thyristor T1 in the on state is arranged between the emitter of the npn transistor Tr2 and the cathode K1 of the transfer thyristor T1.

The emitter of the pnp transistor Tr1 being the anode A1 of the transfer thyristor T1 is connected with the substrate 80 at the reference potential Vsub.

The coupling transistor Q1 is a pnp transistor. The base B1 is connected with the collector of the npn transistor Tr2 and the base of the pnp transistor Tr1 being the second gate Gts1 of the transfer thyristor T1. The emitter E1 is connected with the substrate 80 at the reference potential Vsub. The collector C1 is connected with the first gate Gtf2 of the transfer thyristor T2 through the resistance Rc. The first gate Gtf2 of the transfer thyristor T2 is connected with the power line 71 through the resistance Rg2.

As shown in FIG. 7A, the pnp transistor Tr1 of the transfer thyristor T1 and the coupling transistor Q1 form a current mirror circuit. That is, current proportional to current flowing to the pnp transistor Tr1 flows to the coupling transistor Q1.

In the following description, for example, the reference potential Vsub, which is supplied to the back-surface electrode 85 (see FIGS. 5, 6A, and 6B) serving as the Vsub terminal, is expressed as 0 V as a high-level potential (hereinafter, referred to as "H" (0 V) or "H"), and the power potential Vga, which is supplied to the Vga terminal, is expressed as −3.3 V as a low-level potential (hereinafter, referred to as "L" (−3.3 V) or "L"). The light emitting device 65 (see FIG. 3) is driven by a negative potential.

As shown in FIGS. 6A and 6B, the thyristors (transfer thyristors T, light emitting thyristors L) and the coupling transistors Q are formed by laminating the p-type semiconductor layers (p-type first semiconductor layer 81, p-type third semiconductor layer 83), and the n-type semiconductor layers (n-type second semiconductor layer 82, n-type fourth semiconductor layer 84) on the p-type substrate 80. It is assumed that the semiconductor stack is formed of GaAs, GaAlAs, or the like, and a forward potential (diffusion potential) Vd of pn junction between the p-type semiconductor layer and the n-type semiconductor layer is, for example, 1.5 V.

Herein, it is assumed that the signals, such as the first transfer signal ϕ1, the second transfer signal ϕ2, and the light-on signal ϕI, each have potentials of the power potential Vga ("L" (−3.3 V)) and the reference potential Vsub ("H" (0 V)). That is, it is assumed that the light emitting device 65 of the first exemplary embodiment is driven by a single power supply.

First, basic operations of the thyristors (transfer thyristor T, light emitting thyristor L) are described.

The anode A1 of the transfer thyristor T1 has the reference potential Vsub ("H" (0 V)).

In the transfer thyristor T1 in the off state, current flowing between the anode A1 and the cathode K1 is smaller than current in the on state. At this time, the pnp transistor Tr1 and the npn transistor Tr2 forming the transfer thyristor T1 are in the off state.

When the first transfer signal ϕ1 is shifted from "H" to "L," the ϕ1 terminal is shifted from "H" to "L." Then, the first transfer signal line 72 connected with the cathode K1 of the transfer thyristor T1 becomes "L" (−3.3 V) through the current limiting resistance R1.

At this time, if the first gate Gtf1 of the transfer thyristor T1 becomes a value obtained by adding the diffusion potential Vd (1.5 V) to "L" (−3.3 V), in this case, a potential higher than −1.8 V (positive side is higher, and negative side is lower), the portion between the emitter and the base of the npn transistor Tr2 becomes a forward bias, and the npn transistor Tr2 is shifted from the off state to the on state. Then, the collector of the npn transistor Tr2 approaches "L" (−3.3 V), and the portion between the emitter ("H" (0 V)) and the base of the pnp transistor Tr1 becomes a forward bias. The pnp transistor Tr1 is also shifted from the off state to the on state. That is, both the pnp transistor Tr1 and the npn transistor Tr2 become the on state, and the transfer thyristor T1 is shifted from the off state to the on state. A phenomenon in which a thyristor is shifted from the off state to the on state is called being turned on.

In the transfer thyristor T1 in the on state, the first gate Gtf1 becomes the saturation potential Vc of the pnp transistor Tr1. Herein, it is assumed that the saturation voltage Vc is, for example, −0.2 V. Hence, the first gate Gtf1 becomes −0.2 V, the second gate Gts1 becomes a potential (−1.5 V) obtained by subtracting the diffusion potential Vd (1.5 V) from the anode A1 ("H" (0 V)).

In the transfer thyristor T1 in the on state, current flows from the anode A1 ("H" (0 V)) to the terminal ϕ1 ("L" (−3.3 V)). Hence, with regard to the internal resistance rk (assuming that a resistance value is rk) of the transfer thyristor T1 in the on state, the current limiting resistance R1 (assuming that a resistance value is R1), and the diffusion potential Vd, a potential Vk of the cathode K1 of the transfer thyristor T1 in the on state is expressed by Expression (1) as follows.

$$Vk = (Vga + Vd) \times \frac{rk}{(R1 + rk)} - Vd \qquad (1)$$

For example, if the current limiting resistance R1 is 300Ω, and the internal resistance rk is 60Ω, the potential Vk of the cathode K1 becomes −1.8 V. The potential Vk of the cathode K1 is the potential of the first transfer signal line 72.

The potential Vk may be similarly determined for the other odd-numbered transfer thyristors T other than the transfer thyristor T1.

In case of an even-numbered transfer thyristor T, the current limiting resistance R1 may be replaced with the current limiting resistance R2. In this case, if it is assumed that the current limiting resistance R2 is equivalent to the current limiting resistance R1, the potential Vk may be similarly determined similarly to the even-numbered transfer thyristor T.

As described above, if the portion between the emitter (cathode K1) and the base (first gate Gtf1) of the npn transistor Tr2 forming the transfer thyristor T1 becomes the forward bias, the transfer thyristor T1 is turned on.

To cause the portion between the emitter (cathode K1) and the base (first gate Gtf1) of the npn transistor Tr2 to be the forward bias, the potential of the cathode K1 may be set at a value smaller than the potential obtained by subtracting the diffusion potential Vd (1.5 V) from the potential of the first gate Gtf1. The potential obtained by subtracting the diffusion potential Vd from the potential of the first gate Gtf1 is expressed as threshold voltage (threshold). That is, the threshold voltage of the transfer thyristor T1 is determined by the potential of the first gate Gtf1, and if the cathode K1 (first transfer signal line 72) becomes a potential lower than the threshold voltage (a potential larger on the absolute value basis), the transfer thyristor T1 is turned on.

The cathode K1 of the transfer thyristor T1 which is turned on becomes the potential Vk (−1.8 V). Then, the potential Vk (−1.8 V) (sustaining voltage) is applied to the cathode K1, and if current (sustaining current) that may hold the on state from the power supply is continuously supplied, the transfer thyristor T1 holds the on state.

In contrast, if a potential higher than the potential Vk (−1.8 V) (a smaller potential on the absolute value basis) is applied to the cathode K1, the transfer thyristor T1 in the on state is shifted from the on state to the off state. A phenomenon in which a thyristor is shifted from the on state to the off state is called being turned off. For example, if the cathode K1 becomes ("H" 0 V), the value is a higher potential than the potential Vk (−1.8 V) (sustaining voltage), and the cathode K1 and the anode A1 have the same potential. Hence, the transfer thyristor T1 is turned off.

Next, the operation of the coupling transistor Q1 is described.

If the transfer thyristor T1 is in the off state, the portion between the emitter and the base of the pnp transistor Tr1 of the transfer thyristor T1 is not the forward bias, and is in the off state. Hence, the portion between the emitter E1 and the base B1 of the coupling transistor Q1 is not the forward bias, and is in the off state. That is, if the transfer thyristor T1 is in the off state, the coupling transistor Q1 is also in the off state.

In the coupling transistor Q1, the emitter E1 becomes the reference potential Vsub ("H" (0 V)) and the collector C1 becomes the power potential Vga ("L" (−3.3 V)) through the series-connected resistance Rc1 and resistance Rg2.

In contrast, when the transfer thyristor T1 is turned on, the portion between the emitter (anode A1) and the base (second gate Gts1) of the pnp transistor Tr1 becomes the forward bias, and the pnp transistor Tr1 is shifted from the off state to the on state. Then, since the base B1 of the coupling transistor Q1 is connected with the second gate Gts1, the portion between emitter E1 and the base B1 becomes the forward bias, and the coupling transistor Q1 is shifted from the off state to the on state.

Then, the collector C1 of the coupling transistor Q1 becomes the saturation potential Vc (−0.2 V). Then, with regard to the saturation potential Vc of the collector C1 of the coupling transistor Q1, the resistance Rc1 (assuming that a resistance value is Rc), and the resistance Rg2 (assuming that a resistance value is Rg), a potential Vgtf of the first gate Gtf2 of the transfer thyristor T2 is expressed by Expression (2) as follows.

$$Vgtf = (Vga - Vc) \times \frac{Rc}{(Rc + Rg)} + Vc \qquad (2)$$

Then, the threshold voltage of the transfer thyristor T2 is a value (Vgtf−Vd) obtained by subtracting the diffusion potential Vd from the potential Vgtf of the first gate Gtf2 as described above.

Although described later, this threshold voltage is desirably lower than the potential (−1.8 V) of the first transfer signal line 72 or the second transfer signal line 73 connected with the transfer thyristor T in the on state.

Next, a minimum value Vmin of the power potential Vga, at which the transfer section 101 of the light emitting device 65 is operated, is obtained. The minimum value Vmin of the power potential Vga represents a situation in which the light emitting device 65 is operated even if the power potential Vga becomes the minimum value Vmin. This voltage may be obtained based on the assumption that the power potential Vga is equivalent to the threshold voltage of the transfer thyristor T.

Thus, since the threshold voltage of the transfer thyristor T2 is (Vgtf−Vd), if it is assumed that (Vgtf−Vd)=power potential Vga=Vmin in Expression (2), and a solution is obtained for Vmin, Expression (3) is obtained as follows.

$$V\min = -Vd \times \left\{\left(\frac{Rc}{Rg}\right) + 1\right\} + Vc \qquad (3)$$

For example, if the minimum value Vmin is set at −2 V, with the saturation potential Vc (−0.2 V) and the diffusion potential Vd (1.5 V), Rc:Rg=1:5 is obtained.

That is, if Rc:Rg=1:5, the transfer section 101 of the light emitting device 65 is operated even if the power potential Vga becomes smaller from "L" (−3.3 V) to Vmin (−2 V) on the absolute value basis. A value 1.3 V which is the difference between −3.3 V and −2 V may be ensured as an operation margin for the transfer section 101 of the light emitting device 65.

If the power potential Vga is −2 V, the cathode K1 (first transfer signal line 72) of the transfer thyristor T1 in the on state becomes −1.58 V from Expression (1). The threshold voltage of the transfer thyristor T is −2 V.

Hereinafter, the description is given based on the assumption that Rc:Rg=1:5.

In the light emitting chip U, the cathodes of the odd-numbered transfer thyristors T are connected with the first transfer signal line 72. Also, the cathodes of the even-numbered transfer thyristors T are connected with the second transfer signal line 73.

Although described later, in the light emitting chip U, the on state propagates through the transfer thyristor row by repeating periods in the order of a period in which an odd-numbered transfer thyristor T is in the on state, a period in which the odd-numbered transfer thyristor T and an even-numbered transfer thyristor T with a number larger by one successively become the on state, a period in which an even-numbered transfer thyristor T is in the on state, and a period in which the even-numbered transfer thyristor T and an odd-numbered transfer thyristor T with a number larger by one successively become the on state.

Accordingly, it is not desirable that plural odd-numbered transfer thyristors T, the cathodes of which are connected with the first transfer signal line 72, are in the on state in parallel. Similarly, it is not desirable that plural even-numbered transfer thyristors T, the cathodes of which are connected with the second transfer signal line 73, are in the on state in parallel.

Owing to this, if the power potential Vga is "L" (−3.3 V), it is desirable that the threshold voltage (−2.22 V) of the transfer thyristor T (transfer thyristor T2 in FIG. 7A) in the off state, the first gate Gtf of which is connected with the collector C of the coupling transistor Q (coupling transistor Q1 in FIGS. 7A and 7B) in the on state through the resistance Rc is higher than the potential (−1.8 V) of the first transfer signal line 72 or the second transfer signal line 73, with which the cathode of the transfer thyristor T in the on state is connected.

This relationship is established even if the power potential Vga is the minimum value Vmin (−2 V).

In contrast, as shown in FIG. 5, if the light emitting thyristor L is in the on state, current flows to the light emitting thyristor L from the anode, to which the reference potential Vsub ("H" (0 V)) is supplied, through the ϕ1 terminal and the current limiting resistance RI. For example, if the internal resistance of the light emitting thyristor L in the on state is 20Ω and the current limiting resistance RI is 80Ω, calculation may be performed similarly to the calculation for the potential Vk of the cathode K1 of the transfer thyristor T by Expression (1). The cathode of the transfer thyristor L in the on state, that is, the light-on signal line 75 becomes −1.86 V. Hereinafter, the description is given based on the assumption that if the light emitting thyristor L becomes the on state, the light-on signal line 75 becomes −1.86 V.

The potential of the light-on signal line 75 may be set in accordance with the internal resistance of the light emitting thyristor L and the current limiting resistance RI.

Further, hereinafter, the description is given based on the assumption that the start resistance Rs is 2 kΩ. Since Rg:Rs=5:1, the resistance Rg is 10 kΩ.

The above numerical value is merely an example, and other value may be set.

The internal resistance of the light emitting thyristor L is 20Ω, which is smaller than the internal resistance rk of 60Ω of the transfer thyristor T. Since light is acquired from the light emitting thyristors L, the light emitting thyristors L occupy a relatively large area on the substrate 80. In contrast, the transfer thyristors T merely successively transfer the on state, and hence the area of the transfer thyristors T on the substrate 80 does not have to be large. Owing to this, the internal resistance rk of the transfer thyristor T is larger than the internal resistance of the light emitting thyristor L.

The transfer thyristor T1, the coupling transistor Q1, and the resistance Rc1 are further described with reference to FIG. 7B.

As shown in FIG. 7B, the p-type first semiconductor layer 81 serves as the anode A1 in the portion forming the transfer thyristor T1, and serves as the emitter E1 in the portion forming the coupling transistor Q1. The p-type first semiconductor layer 81 is present even in the portion forming the resistance Rc1.

The n-type second semiconductor layer 82 serves as the second gate Gts1 in the portion forming the transfer thyristor T1, and serves as the base B1 in the portion forming the coupling transistor Q1. The n-type second semiconductor layer 82 is present even in the portion forming the resistance Rc1.

The p-type third semiconductor layer 83 serves as the first gate Gtf1 in the portion forming the transfer thyristor T1, and serves as the collector C1 in the portion forming the coupling transistor Q1. The p-type third semiconductor layer 83 serves as the resistance Rc1 in the portion forming the resistance Rc1.

The n-type fourth semiconductor layer 84 serves as the cathode K1 in the portion forming the transfer thyristor T1, but is removed in the portion forming the coupling transistor Q1 and the portion forming the resistance Rc1.

As shown in FIG. 7A, since both the anode A1 of the transfer thyristor T1 and the emitter E1 of the coupling transistor Q1 have the reference potential Vsub ("H" (0 V)), the p-type first semiconductor layer 81 is continuously arranged. Also, the p-type first semiconductor layer 81 is continuously arranged in the portion forming the resistance Rc1.

Also, as shown in FIG. 7A, the second gate Gts1 of the transfer thyristor T1 is connected with the base B1 of the coupling transistor Q1. Hence, the n-type second semiconductor layer 82 is continuously arranged in the portion forming the transfer thyristor T1 and the portion forming the coupling transistor Q1. Also, the n-type second semiconductor layer 82 is continuously arranged in the portion forming the resistance Rc1.

However, as shown in FIG. 7A, the first gate Gtf1 of the transfer thyristor T1 is not connected with the collector C1 of the coupling transistor Q1. Hence, regarding the p-type third semiconductor layer 83, the portion forming the transfer thyristor T1 is separated from the portion forming the coupling transistor Q1.

Also, the resistance Rc1 is connected with the collector C1 of the coupling transistor Q1. Hence, regarding the p-type third semiconductor layer 83, the portion forming the coupling transistor Q1 is connected with the portion forming the resistance Rc1.

As described above, in the p-type third semiconductor layer 83, it is desirable that the portion forming the transfer thyristor T1 is separated from the portion forming the coupling transistor Q1. Alternatively, the p-type third semiconductor layer 83 may be continuously arranged at the portion forming the transfer thyristor T1 and the portion forming the coupling transistor Q1 as long as electric isolation is provided by depletion etc.

Operation of Light Emitting Device 65

Next, the operation of the light emitting device 65 is described.

As mentioned before, the description is given based on the assumption that the reference voltage Vsub is "H" (0 V) and the power potential Vga is "L" (−3.3 V). Also, the description is given based on the assumption that the first transfer signal ϕ1, the second transfer signal ϕ2, and the light-on signal ϕI each have two potentials of "H" (0 V) and "L" (−3.3 V). Herein, "H" (0 V) may be occasionally abbreviated as "H," and "L" (−3.3 V) may be occasionally abbreviated as "L."

As described above, the light emitting device 65 includes the light emitting chips U1-U40 (see FIGS. 3 and 4B).

As shown in 4B, the reference potential Vsub ("H" (0 V)) and the power potential Vga ("L" (−3.3 V)) are commonly supplied to all the light emitting chips U1-U40 on the circuit board 62. The first transfer signal ϕ1 and the second transfer signal ϕ2 are also commonly (parallelly) transmitted to the light emitting chips U1-U40.

In contrast, the light-on signals ϕI1-ϕI40 are individually transmitted to the light emitting chips U1-U40, respectively. The light-on signals ϕI1-ϕI40 are signals that set the respective light emitting thyristors L of each of the light emitting chips U1-U40 to be lit or unlit in accordance with image data.

Hence, the waveforms of the light-on signals φI1-φI40 vary in accordance with image data. However, the light-on signals φI1-φI40 are transmitted in parallel at the same timing.

Since the light emitting chips U1-U40 are driven in parallel, the description for the operation of the light emitting chip U1 may be enough.

Timing Chart

Figure 8:
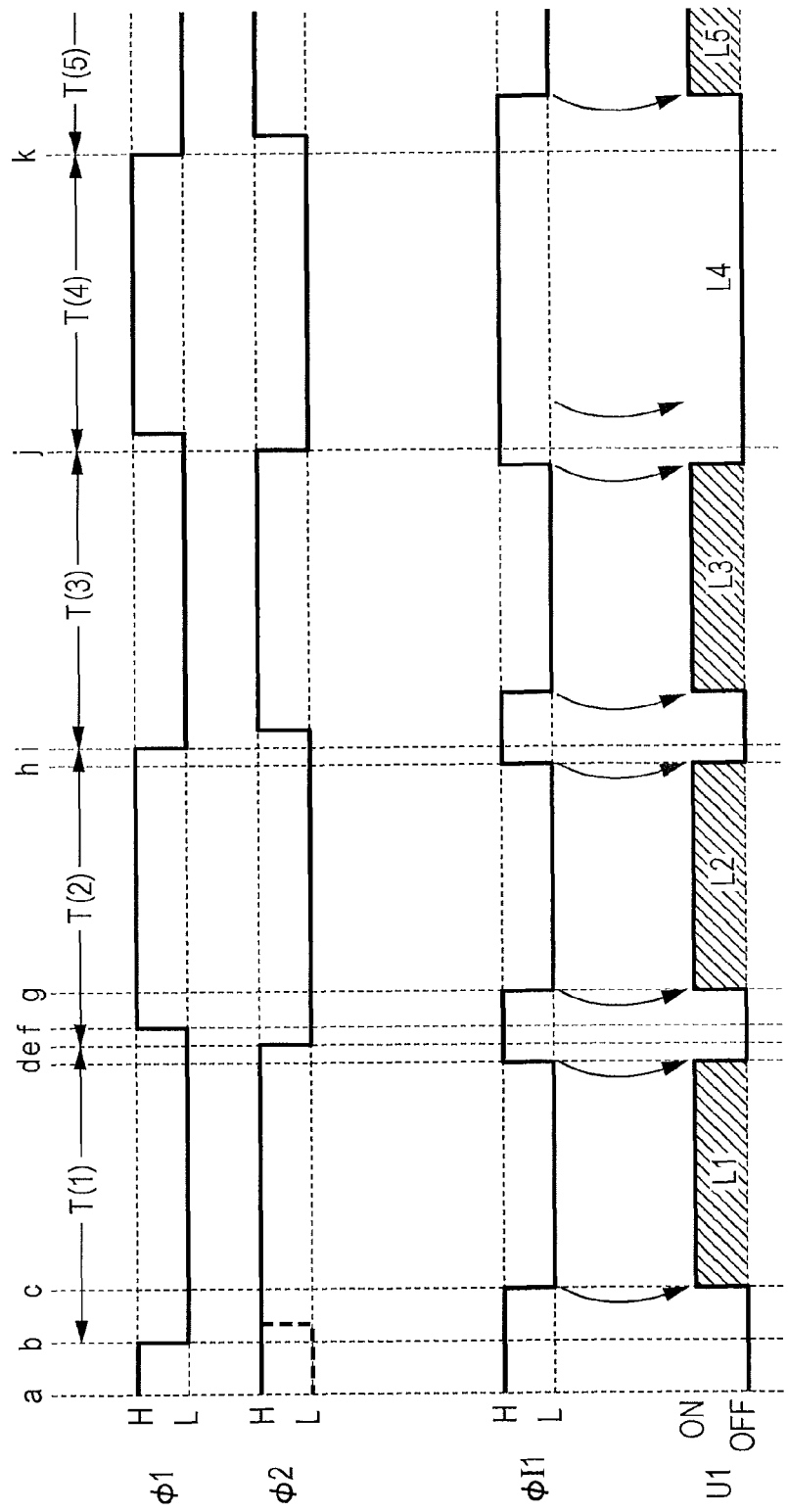
FIG. 8 is a timing chart explaining operations of the light emitting device and the light emitting chip to which the first exemplary embodiment is applied.

FIG. 8 is a timing chart explaining the operations of the light emitting device 65 and the light emitting chip U to which the first exemplary embodiment is applied.

FIG. 8 shows a timing chart of a portion in which light-on or light-off of the five light emitting thyristors L1-L5 of the light emitting chip U1 is controlled (referred to as light-on control). In FIG. 8, the light emitting thyristors L1, L2, L3, and L5 of the light emitting chip U1 are lit, and the light emitting thyristor L4 is unlit.

As described above, since the other light emitting chips U2-U40 are operated in parallel to the light emitting chip U1, the description for the operation of the light emitting chip U1 may be enough.

In FIG. 8, it is assumed that the time elapses in the order of alphabets from a time a to a time k. The light-on control is made on the light emitting thyristor L1 in a period T(1) from a time b to a time e, the light emitting thyristor L2 in a period T(2) from the time e to a time i, the light emitting thyristor L3 in a period T(3) from the time i to a time j, and the light emitting thyristor L4 in a period T(4) from the time j to a time k. Hereinafter, the light emitting thyristors L of the numbers of 5 or larger are controlled to be lit similarly.

Herein, it is assumed that the periods T(1), T(2), T(3) . . . have the same length, and are called period(s) T unless otherwise distinguished from each other.

As long as the relationship among signals (described later) is held, the length of the periods T(1), T(2), T(3) . . . may be variable.

The waveforms of the first transfer signal φ1, the second transfer signal φ2, and the light-on signal φI1 are described. The period from the time a to the time b is a period in which the light emitting chip U1 (or any of light emitting chips U2-U40) starts its operation. Signals in this period are described in the description for the operation.

In the first transfer signal φ1 which is transmitted to the φ1 terminal (see FIGS. 5 and 6A) and the second transfer signal φ2 which is transmitted to the φ2 terminal (see FIGS. 5 and 6A), a unit of two continuous periods T (for example, period T(1) and period T(2)) is repeated.

The first transfer signal φ1 is shifted from "H" to "L" at the start time b of the period T(1), and is shifted from "L" to "H" at a time f. Then, the first transfer signal φ1 is shifted from "H" to "L" at the end time i of the period T(2).

The second transfer signal φ2 is "H" at the start time b of the period T(1), and is shifted from "H" to "L" at the time e. Then, at the end time i of the period T(2), the second transfer signal φ2 is held at "L."

Comparing the first transfer signal φ1 with the second transfer signal φ2, the second transfer signal φ2 corresponds to the first transfer signal φ1 if the first transfer signal φ1 is shifted to the downstream side by a period T on the time axis. In the first transfer signal φ1, the waveforms in the period T(1) and the period T(2) are repeated in the period T(3) and later. In contrast, in the second transfer signal φ2, the waveform indicated by a broken line in the period T(1) and the waveform in the period T(2) are repeated in the period T(3) and later. The waveform in the period T(1) of the second transfer signal φ2 is different from the waveform in the period T(3) and later because the period T(1) is a period in which the light emitting device 65 starts its operation.

A pair of transfer signals including the first transfer signal φ1 and the second transfer signal φ2 designates the light emitting thyristor L having the same number as the transfer thyristor T in the on state, as a subject of light-on control by causing the on state to be transferred (to propagate) in the transfer thyristors T shown in FIGS. 5 and 6A in the order of the numbers.

In two transfer thyristors T having the continuous numbers, the transfer thyristor T with a small number may be expressed as "former one (upstream one)" or "former (upstream) transfer thyristor T," and the transfer thyristor T with a large number may be expressed as "later one (downstream one)" or "later (downstream) transfer thyristor T."

Further, in the light emitting chip U, the side to which the on state is to be transferred in the transfer thyristors T may be expressed as "later (downstream) side," and the side from which the on state has been transferred may be expressed as "former side."

Next, the light-on signal φI1 which is transmitted to the φI terminal of the light emitting chip U1 is described. The light-on signals φI2-φI40 are transmitted to the other light emitting chips U2-U40, respectively.

Herein, the light-on signal φI1 in the period T(1) of light-on control for the light emitting thyristor L1 of the light emitting chip U1 is described.

If the light emitting thyristor L1 is lit, the light-on signal φI1 is "H" at the start time b of the period T(1), and is shifted from "H" to "L" at a time c. Then, the light-on signal φI1 is shifted from "L" to "H" at a time d, and is held at "H" at the end time e of the period T(1).

The operations of the light emitting device 65 and the light emitting chip U1 are described according to the timing chart in FIG. 8 with reference to FIGS. 4B and 5. In the following description, the period T(1), in which light-on control is executed on the light emitting thyristor L1, is described.

(1) Time a

Light Emitting Device 65

At the time a, the reference potential supply unit 160 of the signal generating circuit 110 of the light emitting device 65 sets the reference potential Vsub ("H" (0 V)). The power potential supply unit 170 sets the power potential Vga ("L" (−3.3 V)). Then, the power line 200a on the circuit board 62 of the light emitting device 65 becomes the reference potential Vsub ("H" (0 V)), and the respective Vsub terminals of the light emitting chips U1-U40 become "H." Similarly, the power line 200b becomes the power potential Vga ("L" (−3.3 V)), and the respective Vga terminals of the light emitting chips U1-U40 become "L" (see FIG. 4B). Accordingly, the respective power lines 71 of the light emitting chips U1-U40 become "L" (see FIG. 5).

Also, the transfer signal generating unit 120 of the signal generating circuit 110 sets the first transfer signal φ1 and the second transfer signal φ2 at "H." Then, the first transfer signal line 201 and the second transfer signal line 202 become "H" (see FIG. 4B). Accordingly, the respective φ1 terminals and the respective φ2 terminals of the light emitting chips U1-U40 become "H." The first transfer signal lines 72 connected with the φ1 terminals through the current limiting resistances R1 also become "H", and the second transfer signal lines 73 connected with the φ2 terminals through the current limiting resistances R2 also become "H" (see FIG. 5).

Further, the light-on signal generating unit 140 of the signal generating circuit 110 sets the light-on signals φI1-φI40 at "H." Then, the light-on signal lines 204-1 to 204-40 become "H" (see FIG. 4B). Accordingly, the φI terminals of the light emitting chips U1-U40 become "H" through the current limiting resistances RI, and the light-on signal lines 75 connected with the φI terminals also become "H" (see FIG. 5).

In the description of FIG. 8 and later, the potentials are changed in a step form; however, the potentials are gradually changed. Accordingly, even during the change in potential, as long as the condition (described below) is satisfied, the thyristor may be turned on or turned off, and the coupling transistor Q may be changed between the on state and the off state.

Next, the operation of the light emitting chip U1 is described.

Light Emitting Chip U1

The anodes of the transfer thyristors T and the light emitting thyristors L are connected with the Vsub terminal, and hence are set at "H" (0 V).

The cathodes of the odd-numbered transfer thyristors T1, T3, T5 . . . are connected with the first transfer signal line 72, and are set at "H." The cathode terminals of the even-numbered transfer thyristors T2, T4, T6 . . . are connected with the second transfer signal line 73, and are set at "H." Accordingly, since the anodes and the cathodes of the transfer thyristors T are "H," the transfer thyristors T are in the off state.

The cathodes of the light emitting thyristors L are connected with the light-on signal line 75 at "H." Accordingly, since the anodes and the cathodes of the light emitting thyristors L are "H," the light emitting thyristors L are in the off state.

The first gate Gtf1 of the transfer thyristor T1 at the one end of the transfer thyristor row in FIG. 5 is connected with the power line 71 of "L" (−3.3 V) through the resistance Rg1. Also, the first gate Gtf1 is connected with the one terminal of the start resistance Rs. The other terminal of the start resistance Rs is connected with the second transfer signal line 73. The second transfer signal line 73 is connected with the φ2 terminal of "H" (0 V) through the current limiting resistance R2. Hence, the first gate Gtf1 has a potential obtained by dividing the potential difference between "L" (−3.3 V) of the power line 71 and the "H" (0 V) of the φ2 terminal with the resistance Rg1 (10 kΩ), the start resistance Rs (2 kW, and the current limiting resistance R2 (300Ω). The first gate Gtf1 becomes −0.62 V. Hence, the threshold voltage of the transfer thyristor T1 becomes −2.12 V.

The potential of the first gate Gtf1 may be set in accordance with the resistance Rg1, the start resistance Rs, and the current limiting resistance R2.

Also, since the first gate Glf1 of the light emitting thyristor L1 is connected with the first gate Gtf1 of the transfer thyristor T1, the threshold voltage of the light emitting thyristor L1 is −2.12 V.

At this time, since the transfer thyristor T1 is in the off state, the coupling transistor Q1 may not become the on state and is also in the off state. Hence, the first gate Gtf2 of the transfer thyristor T2 is "L" (−3.3 V) of the power line 71 through the resistance Rg2. Hence, the threshold voltage of the transfer thyristor T2 is −4.8 V. Similarly, the threshold voltages of the other transfer thyristors T3, T4, T5, . . . are −4.8 V.

Also, since the first gates Glf2, Glf3, Glf4, . . . of the light emitting thyristors L2, L3, L4, . . . are respectively connected with the first gates Gtf2, Gtf3, Gtf4, . . . of the transfer thyristors T2, T3, T4, . . . , the threshold voltages of the light emitting thyristors L2, L3, L4, . . . are −4.8 V.

(2) Time b

At the time b, the first transfer signal φ1 is shifted from "H" to "L." Accordingly, the light emitting device 65 starts its operation.

Then, the first transfer signal line 72 is shifted from "H" to "L" (−3.3 V) through the φ1 terminal and the current limiting resistance R1. Then, the transfer thyristor T1 with the threshold voltage being −2.12 V is turned on because the first transfer signal line 72, i.e., the cathode becomes "L" (−3.3 V). However, although the cathodes of the odd-numbered transfer thyristors T of the number of 3 or larger are connected with the first transfer signal line 72, since the threshold voltages of the odd-numbered transfer thyristors T of the numbers of 3 or larger are −4.8 V, the transfer thyristors T are not turned on. In contrast, since the second transfer signal line 73 is "H" (0 V), the even-numbered transfer thyristors T are not turned on.

If the transfer thyristor T1 is turned on, as described above, the first transfer signal line 72 becomes −1.8 V. Then, the first gate Gtf1 of the transfer thyristor T1 becomes −0.2 V. Since the first gate Glf1 of the light emitting thyristor L1 is connected with the first gate Gtf1 (0.2 V) of the transfer thyristor T1, the threshold voltage of the light emitting thyristor L1 becomes −1.7 V.

In contrast, if the transfer thyristor T1 is turned on, the coupling transistor Q1 is shifted from the off state to the on state. Accordingly, the first gate Gtf2 of the transfer thyristor T2 is shifted to −0.72 V, and the threshold voltages of the transfer thyristor T2 and the light emitting thyristor L2 become −2.22 V.

However, since the second transfer signal line 73 is "H" (0 V), the transfer thyristor T2 is not turned on. Also, since the light-on signal line 75 is "H" (0 V), the light emitting thyristor L2 is not turned on.

Since the transfer thyristor T2 is in the off state, the coupling transistor Q2 is also in the off state. Accordingly, the first gate Gtf3 of the transfer thyristor T3 is "L" (−3.3 V), and the threshold voltages of the transfer thyristor T3 and the light emitting thyristor L3 are −4.8 V. Similarly, the transfer thyristors T and the light emitting thyristors L with the numbers of 4 or larger have the threshold voltage of −4.8 V.

Immediately after the time b (herein, a state in which a change in thyristor etc. is generated because of a change in potential of a signal at the time b and then the state becomes a normal state), the transfer thyristor T1 and the coupling transistor Q1 are in the on state and the other transfer thyristors T and coupling transistors Q, and all the light emitting thyristors L are in the off state.

Hereinafter, the transfer thyristors T, coupling transistors Q, and light emitting thyristors L in the on state are described, but the transfer thyristors T, coupling transistors Q, and light emitting thyristors L in the off state are not described.

(3) Time c

At a time c, the light-on signal φI1 is shifted from "H" to "L." Then, the light-on signal line 75 is shifted from "H" (0 V) to "L" (−3.3 V) through the current limiting resistance RI and the φI terminal. Then, the light emitting thyristor L1 with the threshold voltage being −1.7 V is turned on and lit (emits light). Accordingly, the light-on signal line 75 becomes −1.86 V.

While the threshold voltage of the light emitting thyristor L2 is −2.22 V, since the light emitting thyristor L1 with the threshold voltage being as high as −1.7 V is turned on and causes the light-on signal line 75 to become −1.86 V, the light emitting thyristor L2 is not turned on.

Immediately after the time c, the transfer thyristor T1 and the coupling transistor Q1 are in the on state, and the light emitting thyristor L1 is in the on state and is lit.

(4) Time d

At the time d, the light-on signal φI1 is shifted from "L" to "H." Then, the light-on signal line 75 is shifted from −1.86 V to "H" (0 V) through the current limiting resistance RI and the φI terminal. Then, both the anode and cathode of the light emitting thyristor L1 become "H," and the light emitting thyristor L1 is turned off and is unlit (light-off). The light-on period of the light emitting thyristor L1 is a period form the time c at which the light-on signal φI1 is shifted from "H" to "L," to the time d at which the light-on signal φI1 is shifted from "L" to "H."

Immediately after the time d, the transfer thyristor T1 and the coupling transistor Q1 are in the on state.

(5) Time e

At the time e, the second transfer signal φ2 is shifted from "H" to "L." Herein, the period T(1) for light-on control of the light emitting thyristor L1 is ended, and the period T(2) for light-on control of the light emitting thyristor L2 is started.

Then, the φ2 terminal is shifted from "H" to "L" (−3.3 V). Since the transfer thyristor T1 is in the on state, the first gate Gtf1 of the transfer thyristor T1 is at −0.2 V. Hence, the second transfer signal line 73 has a value obtained by dividing the potential difference between "L" (−3.3 V) and −0.2 V with the start resistance Rs (2 kΩ) and the current limiting resistance R2 (300 Ω). That is, the second transfer signal line 73 becomes −2.9 V.

At the time b, since the threshold voltage of the transfer thyristor T2 is −2.22 V, the transfer thyristor T2 is turned on. Accordingly, the first gate Gtf2 (first gate Glf2) of the transfer thyristor T2 becomes −0.2 V, and the threshold voltage of the light emitting thyristor L2 becomes −1.7 V.

If the transfer thyristor T2 is turned on, the second transfer signal line 73 becomes −1.8 V.

Further, if the transfer thyristor T2 is turned on, the coupling transistor Q2 is shifted from the off state to the on state, and the first gate Gtf3 of the transfer thyristor T3 becomes −0.72 V. Hence, the threshold voltages of the transfer thyristor T3 and the light emitting thyristor L3 become −2.22 V. The transfer thyristors T and the light emitting thyristors L with the numbers of 4 or larger hold the threshold voltage of −4.8 V.

Since the light-on signal φI1 is "H" (0 V), any light emitting thyristor L is not turned on.

Immediately after the time e, the transfer thyristors T1 and T2, and the coupling transistors Q1 and Q2 are in the on state.

(6) Time f

At the time f, the first transfer signal φ1 is shifted from "L" to "H." Then, the potential of the first transfer signal line 72 is shifted from "L" to "H" through the φ1 terminal. Then, both the anode and cathode of the transfer thyristor T1 in the on state become "H," and the transfer thyristor T1 is turned off.

The first gate Gtf1 (first gate Glf1) is connected with the power line 71 ("L" (−3.3 V)) through the resistance Rg1, and is connected with the second transfer signal line 73 being "L" (−3.3 V) through the start resistance Rs. Accordingly, the first gate Gtf1 (first gate Glf1) of the transfer thyristor T1 is shifted from −0.2 V to "L" (−3.3 V), and the threshold voltages of the transfer thyristor T1 and the light emitting thyristor L1 become −4.8 V.

Immediately after the time f, the transfer thyristor T2 is in the on state.

(7) Others

At a time g, when the light-on signal φI1 is shifted from "H" to "L," the light emitting thyristor L2 is turned on and lit, similarly to the light emitting thyristor L1 at the time c.

At a time h, when the light-on signal φI1 is shifted from "L" to "H," the light emitting thyristor L2 is turned off and unlit, similarly to the light emitting thyristor L1 at the time d.

Further, at the time i, when the first transfer signal φ1 is shifted from "H" to "L," the transfer thyristor T3 with the threshold voltage being −2.22 V is turned on, similarly to the transfer thyristor T1 at the time b and the transfer thyristor T2 at the time e. At this time, since the threshold voltage of the transfer thyristor T1 is −4.8 V, the transfer thyristor T1 is not turned on.

At the time i, the period T(2) for light-on control of the light emitting thyristor L2 is ended, and the period T(3) for light-on control of the light emitting thyristor L3 is started.

Hereinafter, the above-described operation is repeated.

If the light emitting thyristor L is not lit and is held unlit, the light-on signal φI may be held at "H" (0 V) similarly to the light-on signal φI1 in the period T(4) in which light-on control is executed on the light emitting thyristor L4 in FIG. 8. Accordingly, even if the threshold voltage of the light emitting thyristor L4 is −1.7 V, the light emitting thyristor L4 is held unlit.

As described above, the transfer thyristors T are connected with each other through the coupling transistors Q. Hence, if the upstream transfer thyristor T is turned on, the coupling transistor Q is shifted from the off state to the on state, and the coupling transistor Q increases the threshold voltage of the downstream transfer thyristor T. That is, the coupling transistor Q causes the downstream transfer thyristor T to be in a state in which the downstream transfer thyristor T may be shifted from the off state to the on state. Accordingly, the downstream thyristor T is turned on at a timing at which the first transfer signal φ1 or the second transfer signal φ2 connected with the cathode of the downstream transfer thyristor T is shifted from "H" (0 V) to "L" (−3.3 V).

Then, if the transfer thyristor T is turned on, the first gate Gtf becomes −0.2 V. Since the first gate Gtf of the transfer thyristor T is connected with the first gate Glf of the light emitting thyristor L, the threshold voltage of the light emitting thyristor L also becomes −1.7 V. Hence, the light emitting thyristor L is turned on an lit at a timing at which the light-on signal φI is shifted from "H" (0 V) to "L" (−3.3 V).

That is, since the transfer thyristor T becomes the on state, the transfer thyristor T designates the light emitting thyristor L as a subject of light-on control, and sets the light emitting thyristor L in a state in which the light emitting thyristor L may be lit (or may be shifted). The light-on signal φI sets the light emitting thyristor L in the state, in which the light emitting thyristor L may be lit as the subject of light-on control, to be lit or unlit.

In this way, as shown in FIG. 8, by setting the waveform of the light-on signal φI in accordance with image data, light-on control is executed on each light emitting thyristor L.

Figure 9:
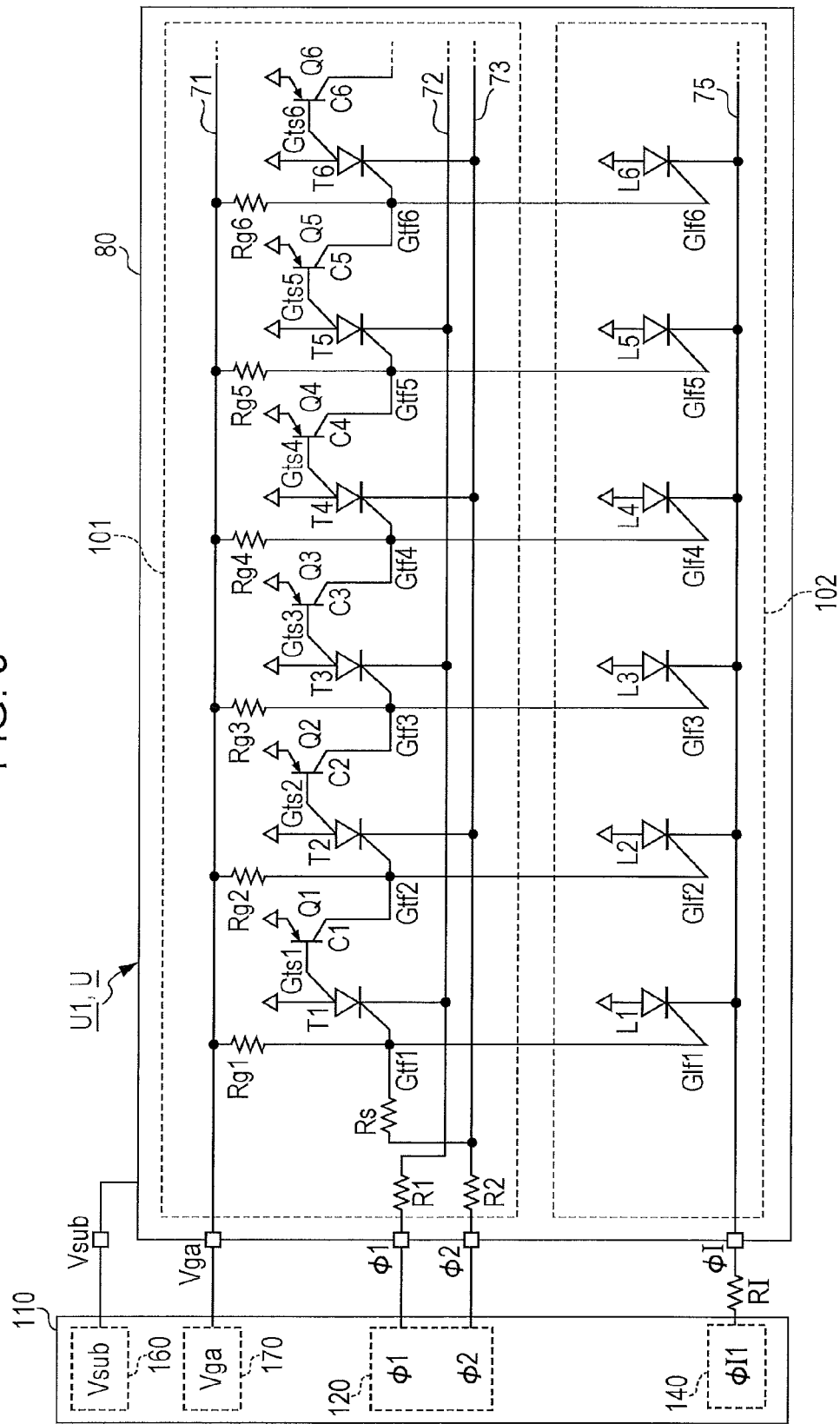
FIG. 9 is an equivalent circuit diagram explaining a circuit configuration of a light emitting chip with a self-scanning light emitting device (SLED) array mounted to which the first exemplary embodiment is not applied.

FIG. 9 is an equivalent circuit diagram explaining a circuit configuration of a light emitting chip U with a self-scanning light emitting device (SLED) array mounted to which the first exemplary embodiment is not applied. Similarly to FIG. 5, the description is based on the light emitting chip U1(U).

In the light emitting chip U1(U) shown in FIG. 5 to which the first exemplary embodiment is applied, the first gate Gtf of the transfer thyristor T with a number of 2 or larger is connected with the collector C of the (upstream) coupling transistor Q with a smaller number by one, through the resistance Rc.

In contrast, the light emitting chip U1(U) shown in FIG. 9 to which the first exemplary embodiment is not applied does not include the resistance Rc. The other configuration is similar to that of the light emitting chip U1(U) shown in FIG. 5 to which the first exemplary embodiment is applied, and hence the description is omitted.

In FIG. 9, a state in which the coupling transistor Q is in the on state is described by using the coupling transistor Q1 and the transfer thyristor T2. Also in this case, it is assumed that the reference potential Vsub is "H" (0 V), the power potential Vga is "L" (−3.3 V), and signals, such as the first transfer signal φ1, the second transfer signal φ2, and the light-on signal φI, each have potentials of the power potential Vga ("L" (−3.3 V)) and the reference potential Vsub ("H" (0 V)). Further, it is assumed that the current limiting resistances R1, R2, and RI, the start resistance Rs, and the resistances Rg are similar to those described in FIG. 5.

Also, it is assumed that the light emitting device 65 and the light emitting chip U are operated according to the timing chart shown in FIG. 8.

In FIG. 9, the state in which the coupling transistor Q is in the on state is described by using the coupling transistor Q1 and the transfer thyristor T2.

When the coupling transistor Q1 is shifted from the off state to the on state, the collector C1 is shifted from "L" (−3.3 V) to −0.2 V. Since the resistance Rc is not provided between the collector C1 and the first gate Gtf2 of the transfer thyristor T2, the potential of the first gate Gtf2 of the transfer thyristor T2 also becomes −0.2 V. Accordingly, the threshold voltage of the transfer thyristor T2 becomes −1.7 V.

In contrast, in the light emitting chip U1(U) shown in FIG. 5 to which the first exemplary embodiment is applied, as described above with reference to FIGS. 7A and 7B, the coupling transistor Q1 is shifted from the off state to the on state, and the potential of the collector C1 is shifted from "L" (−3.3 V) to −0.2 V. Since the resistance Rc is provided between the collector C1 and the first gate Gtf2 of the transfer thyristor T2, the first gate Gtf2 of the transfer thyristor T2 becomes −0.72 V and the threshold voltage thereof becomes −2.22 V.

That is, the threshold voltage of the transfer thyristor T2 is −1.7 V if the resistance Rc is not provided as shown in FIG. 9, and is smaller than −2.22 V when the resistance Rc is provided as shown in FIG. 5, by 0.52 V on the absolute value basis. Hence, the potential of the second transfer signal line 73 may be smaller on the absolute value basis if the resistance Rc is not provided. That is, the operation margin seems to be wide.

However, a malfunction may be generated as described below.

The operation of the light emitting chip U1(U) shown in FIG. 9 is described with reference to the timing chart shown in FIG. 8. Hereinafter, a portion of the operation of the light emitting chip U1(U) shown in FIG. 9 different from that of the light emitting chip U1(U) shown in FIG. 5 is described, and description for a similar portion is omitted.

φTime a

At the time a, the first gate Gtf1 of the transfer thyristor T1 at the one end of the transfer thyristor row in FIG. 9 is connected with the power line 71 of "L" (−3.3 V) through the resistance Rg1. The first gate Gtf1 is connected with the φ2 terminal of "H" (0 V) through the start resistance Rs and the current limiting resistance R2. Then, the first gate of the transfer thyristor T1 becomes −0.62 V, and the threshold voltage thereof becomes −2.12 V similarly to the light emitting chip U1 shown in FIG. 5.

At this time, since the transfer thyristor T1 is in the off state, the coupling transistor Q1 is in the off state, the first gate Gtf2 of the transfer thyristor T2 becomes "L" (−3.3 V) of the power line 71 through the resistance Rg2, and the threshold voltage thereof is −4.8 V. Similarly, the threshold voltages of the other transfer thyristors T3, T4, T5, . . . are −4.8 V.

Also, since the first gates Glf2, Glf3, Glf4, . . . of the light emitting thyristors L2, L3, L4, . . . are respectively connected with the first gates Gtf2, Gtf3, Gtf4, . . . of the transfer thyristors T2, T3, T4, . . . , the threshold voltages of the light emitting thyristors L2, L3, L4, . . . are −4.8 V.

(2) Time b

At the time b, when the first transfer signal φ1 is shifted from "H" to "L," the potential of the first transfer signal line 72 is shifted from "H" to "L" (−3.3 V) through the φ1 terminal and the current limiting resistance R1. Then, the transfer thyristor T1 with the threshold voltage being −1.7 V is turned on. However, since the threshold voltages of the odd-numbered transfer thyristors T of the number of 3 or larger with the cathodes thereof connected with the first transfer signal line 72 are −4.8 V, the transfer thyristors T are not turned on.

If the transfer thyristor T1 is turned on, as described above, the first transfer signal line 72 becomes −1.8 V. Then, the first gate Gtf1 (first gate Glf1) of the transfer thyristor T1 becomes −0.2 V, and the threshold voltage of the light emitting thyristor L1 becomes −1.7 V.

In contrast, if the transfer thyristor T1 is turned on, the second gate Gts1 of the transfer thyristor T1 becomes −1.5 V. Accordingly, the coupling transistor Q1 has a forward bias between the emitter and the base, and the coupling transistor Q1 is shifted form the off state to the on state. Accordingly, the collector C1 (the first gate Gtf2 of the transfer thyristor T2) of the coupling transistor Q1 is shifted to −0.2 V. Hence, the threshold voltages of the transfer thyristor T2 and the light emitting thyristor L2 become −1.7 V.

Since the transfer thyristor T2 is in the off state, the coupling transistor Q2 is also in the off state. The first gate Gtf3 of the transfer thyristor T3 is "L" (−3.3 V), and the threshold voltages of the transfer thyristor T3 and the light emitting thyristor L3 are held at −4.8 V. Similarly, the transfer thyristors T and the light emitting thyristors L with the numbers of 4 or larger have a threshold voltage of −4.8 V.

In this state, the threshold voltages of both the light emitting thyristors L1 and L2 are −1.7 V.

However, since the second transfer signal line 73 is "H" (0 V), the light emitting thyristors L1 and L2 are not turned on.

Immediately after the time b, the transfer thyristor T1 and the coupling transistor Q1 are in the on state.

(3) Time c

At the time c, when the light-on signal φI1 is shifted from "H" to "L," the light-on signal line 75 is shifted from "H" (0 V) to "L" (−3.3 V) through the current limiting resistance RI and the φI terminal. Then, the light emitting thyristor L1 or the light emitting thyristor L2 with the threshold voltage being −1.7 V is turned on and lit (emits light). At this time, since the light emitting thyristor L1 is closer to the φI terminal as compared with the light emitting thyristor L2, the light emitting thyristor L1 may be likely turned on. However, the light emitting thyristor L2 may be possibly turned on.

Accordingly, the potential of the light-on signal line 75 becomes −1.86 V. Hence, since the threshold voltage of the light emitting thyristor L1 or the light emitting thyristor L2, which is not turned on, is −1.7 V, the light emitting thyristor L1 or the light emitting thyristor L2, which is not turned on, is turned on. The light-on signal line 75 becomes −1.7 V.

As described with reference to FIG. 5, at the time c, since the thyristor L1 is intended to be lit, it is not desirable that the light emitting thyristor L2 is lit.

Immediately after the time c, the transfer thyristor T1 and the coupling transistor Q1 are in the on state, and the light emitting thyristors L1 and L2 are in the on state and are lit.

This is because, since the transfer thyristor T1 becomes the on state, the coupling transistor Q1 is shifted from the off state to the on state, and both the first gate Gtf1 of the transfer thyristor T1 and the first gate Gtf2 of the transfer thyristor T2 become −0.2 V.

(4) Time d

At the time d, when the light-on signal φI1 is shifted from "L" to "H," the potential of the light-on signal line 75 is shifted to "H" (0 V). Since the anodes and the cathodes of the light emitting thyristors L1 and L2 become "H," the light emitting thyristors L1 and L2 are turned off and are unlit.

Immediately after the time d, the transfer thyristor T1 and the coupling transistor Q1 are in the on state.

(5) Time e

At the time e, the second transfer signal φ2 is shifted from "H" to "L." Since the transfer thyristor T1 is in the on state, as described above, the second transfer signal line 73 becomes −2.9 V. At the time b, since the threshold voltage of the transfer thyristor T2 is −1.7 V, the transfer thyristor T2 is turned on. Then, the first gate Gtf2 (first gate Glf2) becomes −0.2 V. However, the first gate Gtf2 (first gate Glf2) is already −0.2 V because of the coupling transistor Q1 in the on state.

If the transfer thyristor T2 is turned on, the potential of the second transfer signal line 73 becomes −1.8 V.

Further, if the transfer thyristor T2 is turned on, the coupling transistor Q2 is shifted from the off state to the on state. Then, similarly to the operation described at the time b, the first gate Gtf3 of the transfer thyristor T3 becomes −0.2 V, and the threshold voltage thereof becomes −1.7 V.

At the time b, the transfer thyristor T1 is turned on, and the first transfer signal line 72 is −1.8 V. This potential is lower than the threshold voltage (−1.7 V) of the transfer thyristor T3. Thus, the transfer thyristor T3 is turned on.

The transfer thyristors T1 and T3 in the on state respectively having internal resistances rk are connected in parallel with the first transfer signal line 72. Hence, the first transfer signal line 72 becomes −1.66 V obtained when the internal resistance rk is replaced with rk/2 in Expression (1).

Further, if the transfer thyristor T3 is turned on, the coupling transistor Q3 is shifted from the off state to the on state. Then, the first gate Gtf4 of the transfer thyristor T4 becomes −0.2 V, and the threshold voltages of the transfer thyristor T4 and the light emitting thyristor L4 become −1.7 V.

The second transfer signal line 73 is −1.8 V because the transfer thyristor T2 is in the on state. Thus, the transfer thyristor T4 is turned on. Then, the second transfer signal line 73 becomes −1.66 V similarly to the first transfer signal line 72.

Further, if the transfer thyristor T4 is turned on, the coupling transistor Q4 is shifted from the off state to the on state. Then, the first gate Gtf5 (first gate Glf5) of the transfer thyristor T5 becomes −0.2 V, and the threshold voltages of the transfer thyristor T5 and the light emitting thyristor L5 become −1.7 V.

However, since the first transfer signal line 72 is −1.66 V, the transfer thyristor T5 with the threshold voltage being −1.7 V is not turned on.

Immediately after the time e, the transfer thyristors T1, T2, T3, and T4, and the coupling transistors Q1, Q2, Q3, and Q4 are in the on state.

As described above, in the light emitting chip U1(U) shown in FIG. 9, if the transfer thyristor T2 is turned on at the time e at which the transfer thyristor T1 is in the on state, the transfer thyristors T3 and T4 are successively turned on like dominos.

This is because, if the transfer thyristor T2 is turned on when the transfer thyristor T1 is in the on state, the threshold voltage of the transfer thyristor T3 becomes higher than the potential of the first transfer signal line 72. Also, this is because, since the transfer thyristor T3 is turned on, the threshold voltage of the transfer thyristor T4 becomes higher than the potential of the first transfer signal line 72.

(6) Time f

At the time f, when the first transfer signal φ1 is shifted from "L" to "H," the potential of the first transfer signal line 72 is shifted from −1.66 V to "H" (0 V). Accordingly, the transfer thyristors T1 and T3 are turned off. Also, the coupling transistors Q1 and Q3 are shifted from the on state to the off state.

However, since the transfer thyristors T2 and T4 are in the on state, the first gates Gtf2 and Gtf4 (first gates Glf2 and Glf4) are −0.2 V. Also, since the coupling transistors Q2 and Q4 are in the on state, the first gates Gtf3 and Gtf5 (first gates Glf3 and Glf5) of the transfer thyristors T3 and T5 are −0.2 V, and the threshold voltages thereof being −1.7 V. Hence, the threshold voltages of the light emitting thyristors L2, L3, L4, and L5 are held at −1.7 V.

Immediately after the time f, the transfer thyristors T2 and T4, and the coupling transistors Q2 and Q4 are in the on state.

(7) Time g

At the time g, when the light-on signal φI1 is shifted from "H" to "L," the light-on signal line 75 is shifted from "H" (0 V) to "L" (−3.3 V). Then, similarly to the light emitting thyristors L1 and L2 at the time c, any of the light emitting thyristors L2, L3, L4, and L5 with the threshold voltage being −1.7 V is turned on and lit. The light-on signal line 75 becomes −1.86 V. Then, any light emitting thyristor L among the light emitting thyristors L2, L3, L4, and L5, which is not turned on, is turned on and lit. The light-on signal line 75 becomes −1.7 V. Further, any light emitting thyristor L among the light emitting thyristors L2, L3, L4, and L5, which is not turned on, is turned on and lit. The light-on signal line 75 becomes −1.64 V. This potential is higher than the threshold voltages of the light emitting thyristors L2, L3, L4, and L5, and hence the light emitting thyristor L, which is not turned on, is not turned on. That is, in this example, three light emitting thyristors L become the on state.

At the time g, since the light emitting thyristor L2 is intended to be lit, it is not desirable that three light emitting thyristors L among the light emitting thyristors L2, L3, L4, and L5 are lit.

Immediately after the time f, the transfer thyristors T2 and T4, and the coupling transistor Q2 and Q4 are in the on state, and three light emitting thyristors L among the light emitting thyristors L2, L3, L4, and L5 are in the on state and lit.

(8) Time h

At the time h, when the light-on signal φI1 is shifted from "L" to "H," the light-on signal line 75 is shifted from −1.7 V to "H" (0 V). Then, the anodes and the cathodes of the three light emitting thyristors L being lit among the light emitting thyristors L2, L3, L4, and L5 become "H," and hence the three light emitting thyristors L being lit are turned off and unlit.

(9) Time i

At the time i, if the first transfer signal φ1 is shifted from "H" (0 V) to "L" (−3.3 V), the transfer thyristors T3 and T5 with the threshold voltages being −1.7 V are turned on. Then, the coupling transistors Q3 and Q5 are shifted form the off state to the on state. Then, the first gates Gtf2, Gtf3, Gtf4, Gtf5, and Gtf6 (first gates Glf2, Glf3, Glf4, Glf5, and Glf6) of the transfer thyristors T2, T3, T4, T5, and T6 become −0.2 V. Hence, the threshold voltages of the light emitting thyristors L2, L3, L4, L5, and L6 become −1.7 V.

Immediately after the time i, the transfer thyristors T2, T3, T4, and T5, and the coupling transistors Q2, Q3, Q4, and Q5 are in the on state.

As described above, in the light emitting chip U1(U) shown in FIG. 9, if the first transfer signal φ1 is shifted from "H" (0 V) to "L" (−3.3 V) (for example, time i in FIG. 8), two closely arranged odd-numbered transfer thyristors T connected with the first transfer signal line 72 simultaneously become the on state. Also, if the second transfer signal φ2 is shifted from "H" (0 V) to "L" (−3.3 V) (time e), two closely arranged even-numbered transfer thyristors T connected with the second transfer signal line 73 simultaneously become the on state. Then, every time when each of the first transfer signal φ1 and the second transfer signal φ2 is changed between "H" (0 V) and "L" (−3.3 V), the on state is shifted to the transfer thyristor T with a larger number.

The threshold voltages of the two light emitting thyristors L, the first gates Glf of which are connected with the first gates Gtf of the two transfer thyristors T connected with the first transfer signal line 72 or the second transfer signal line 73, and the threshold voltages of the two light emitting thyristors L, which are connected with the collectors C of the two coupling transistors Q connected with the two transfer thyristors T, that is, the threshold voltages of the four light emitting thyristors L in total become −1.7 V. Hence, if the light-on signal φI is shifted from "H" (0 V) to "L" (−3.3 V) (time g), three light emitting thyristors L among the four light emitting thyristors L are turned on and lit.

That is, a malfunction, in which a light emitting thyristor L other than a designated light emitting thyristor L is lit, may occur.

The two transfer thyristors T connected with the first transfer signal line 72 or the second transfer signal line 73 become the on state because, when current, which flows from the two transfer thyristors T to the first transfer signal line 72 or the second transfer signal line 73, is increased as compared with the case of a single transfer thyristor T, the potential of the first transfer signal line 72 or the second transfer signal line 73 becomes higher than the threshold voltage of the transfer thyristor T, the first gate Gtf of which is connected with the collector C of the coupling transistor Q in the on state.

Depending on the potential of the first transfer signal line 72 or the second transfer signal line 73, the further transfer thyristors T may be successively turned on like dominos.

Describing with reference to FIGS. 7A and 7B, since the pnp transistor Tr1 of the transfer thyristor T1 and the coupling transistor Q1 form a current mirror circuit, the potential of the first gate Gtf1 of the transfer thyristor T1 in the on state becomes the same as the potential of the collector C1 of the coupling transistor Q1 in the on state (in the above example, −0.2 V).

Hence, in the light emitting chip U1(U) according to the first exemplary embodiment shown in FIG. 5, referring to FIG. 5, the resistance Rc is provided between the collector C of the coupling transistor Q and the first gate Gtf of the transfer thyristor T connected with the collector C, so that the potential of the first gate Gtf of the transfer thyristor T in the on state is different from the potential of the first gate Gtf of the transfer thyristor T connected with the collector C of the coupling transistor Q in the on state through the resistance Rc.

That is, in FIGS. 7A and 7B, if the transfer thyristor T1 is in the on state, the potential of the first gate Gtf1 becomes the same as the potential of the collector C1 of the coupling transistor Q1 (−0.2 V). However, since the collector C1 and the first gate Gtf2 of the transfer thyristor T2 are connected through the resistance Rc, the first gate Gtf2 of the transfer thyristor T2 becomes −0.72 V and the threshold voltage of the transfer thyristor T2 become −2.22 V. Even if the potential of the second transfer signal line 73 is −1.8 V, the transfer thyristor T2 is not turned on.

Accordingly, a malfunction during propagation of the on state in the transfer section 101 is restricted.

If the resistance Rc is not provided, the first gate Gtf2 of the transfer thyristor T2 becomes −0.2 V, and the threshold voltage thereof becomes −1.7 V. Hence, if the second transfer signal line 73 is −1.8 V, the transfer thyristor T2 is turned on.

Further description is provided with reference to FIG. 5.

At the time e in FIG. 8, even if the transfer thyristor T2 is turned on and the coupling transistor Q2 is shifted from the off state to the on state, the first gate Gtf3 of the transfer thyristor T3 is −0.72 V, and the threshold voltage thereof is −2.22 V.

At this time, since the transfer thyristor T1 is in the on state, the first transfer signal line 72 is −1.8 V. However, since the threshold voltage of the transfer thyristor T3 is −2.22 V, the transfer thyristor T3 is not turned on. In this way, the phenomenon, in which the plural odd-numbered transfer thyristors T connected with the first transfer signal line 72 are successively turned on like dominos, is restricted. That is, a malfunction, in which a light emitting thyristor L other than a designated light emitting thyristor L is lit, is prevented from occurring.

At the time e, the transfer thyristors T2 and T3 shown in FIG. 5 correspond to the above-described transfer thyristors T1 and T2 in FIGS. 7A and 7B.

In the above description, the light emitting element is described as the light emitting thyristor L; however, the light emitting element may be a light emitting diode using pn junction.

Second Exemplary Embodiment

An image forming apparatus 1 and a print head 14 to which the second exemplary embodiment is applied are similar to the image forming apparatus 1 and the print head 14 shown in FIGS. 1 and 2 according to the first exemplary embodiment. Also, configurations of a light emitting device 65 and a light emitting chip U, a configuration of a signal generating circuit 110 of the light emitting device 65, and a wiring configuration on a circuit board 62 to which the second exemplary embodiment is applied are similar to the configurations of the light emitting device 65 and the light emitting chip U, the configuration of the signal generating circuit 110 of the light emitting device 65, and the wiring configuration on the circuit board 62 shown in FIGS. 3, 4A, and 4B in the first exemplary embodiment. Hereinafter, description is started from the light emitting chip U.

Figure 10:
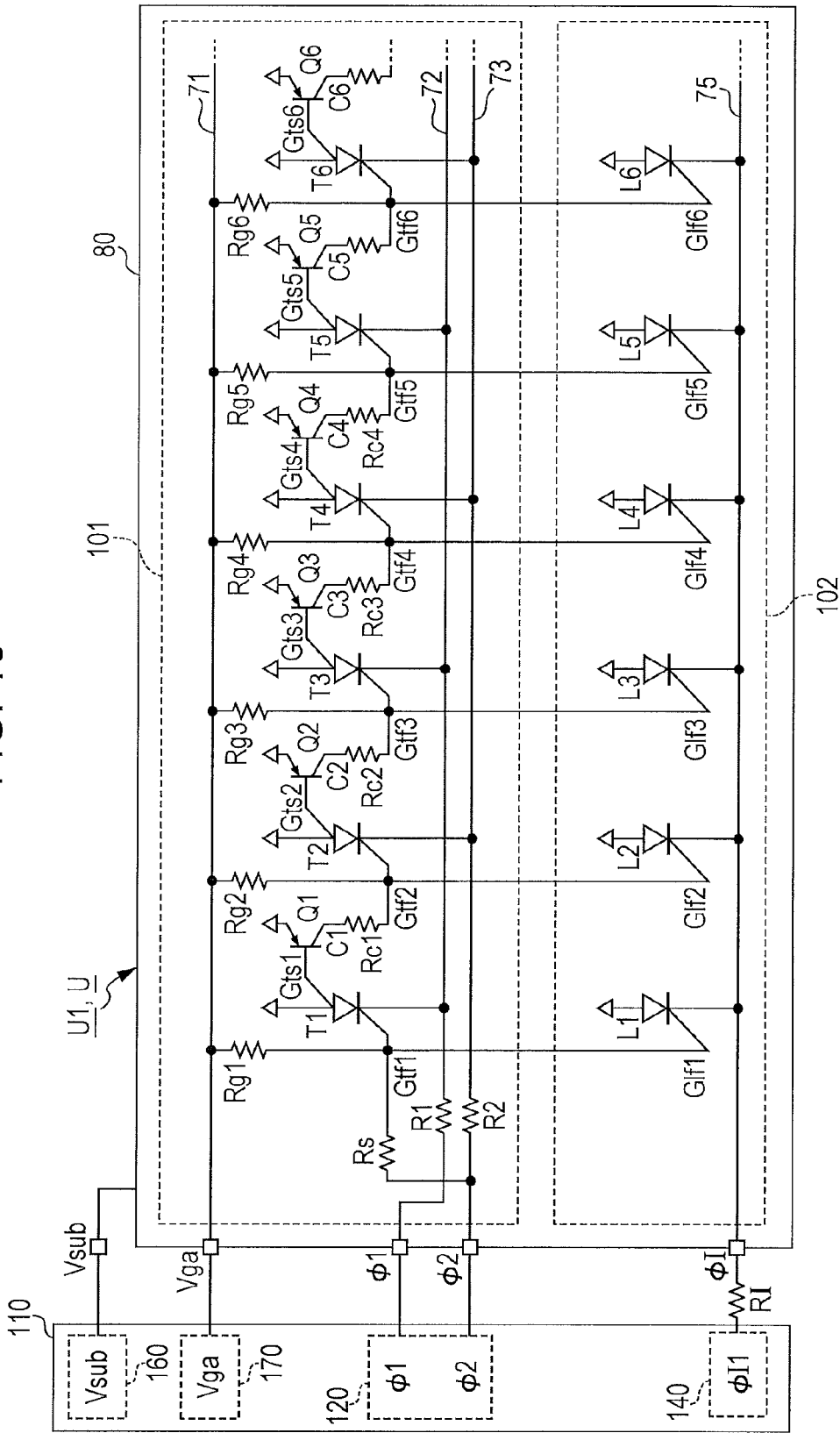
FIG. 10 is an equivalent circuit diagram explaining a circuit configuration of the light emitting chip with a self-scanning light emitting device (SLED) array mounted to which a second exemplary embodiment is applied.

FIG. 10 is an equivalent circuit diagram explaining a circuit configuration of a light emitting chip U with a self-scanning light emitting device (SLED) array mounted to which the second exemplary embodiment is applied. Herein, the light emitting chip U1 is exemplified as the light emitting chip U in relation to the signal generating circuit 110. Hence, the light emitting chip U is expressed as light emitting chip U1(U) in the following description, and illustrated as U1, U in FIG. 10.

In the light emitting chip U1(U) according to the first exemplary embodiment shown in FIG. 5, the one terminal (terminal at the right side in FIG. 5) of the start resistance Rs is connected with the gate Gtf1 of the transfer thyristor T1, and the other terminal (terminal at the left side in FIG. 5) is connected with the second transfer signal line 73. The other terminal of the start resistance Rs is connected with the φ2 terminal through the current limiting resistance R2.

In the light emitting chip U1(U) according to the second exemplary embodiment shown in FIG. 10, the one terminal (terminal at the right side in FIG. 10) of the start resistance Rs is connected with the gate Gtf1 of the transfer thyristor T1, and the other terminal (terminal at the left side in FIG. 10) is connected with the φ2 terminal not through the current limiting resistance R2. The other portion is similar to the first exemplary embodiment. Therefore, description for the similar portion is omitted.

First, in the light emitting chip U1(U) according to the first exemplary embodiment shown in FIG. 5, at the time e of the timing chart in FIG. 8, when the second transfer signal φ2 is shifted from "H" (0 V) to "L" (−3.3 V), the second transfer signal line 73 becomes −2.9 V. This is because the potential of the second transfer signal line 73 is affected by the transfer thyristor T1 in the on state through the start resistance Rs.

At the time j in FIG. 8, if the second transfer signal φ2 is shifted from "H" (0 V) to "L" (−3.3 V) and the transfer thyristor T4 is turned on, the transfer thyristor T1 is in the off state. The first gate Gtf1 is connected with the power potential Vga ("L" (−3.3 V)) through the resistance Rg1. Hence, when the second transfer signal φ2 is shifted from "H" (0 V) to "L" (−3.3 V) and the φ2 terminal is shifted from "H" (0 V) to "L" (−3.3 V), the second transfer signal line 73 becomes "L" (−3.3 V). That is, at the time j, the potential of the second transfer signal line 73 is not affected by the transfer thyristor T1 through the start resistance Rs.

Also, since the first transfer signal line 72 is not connected with the start resistance Rs, the first transfer signal line 72 is not affected through the start resistance Rs.

As described above, the potential (−2.9 V) of the second transfer signal line 73 at the timing (time e) at which the transfer thyristor T2 is turned on regulates the operation of the light emitting chip U1(U) to which the first exemplary embodiment is applied. The threshold voltage of the transfer thyristor T2 is −2.22 V.

Hence, in the light emitting chip U1(U) to which the second exemplary embodiment is applied shown in FIG. 10, the other terminal (terminal at the left side in FIG. 10) of the start resistance Rs is connected with the φ2 terminal. The φ2 terminal holds "L" (−3.3 V) if the second transfer signal φ2 becomes "L" (−3.3 V). Hence, the potential of the second transfer signal line 73 is not affected even if the transfer thyristor T1 is in the on state and the first gate Gtf1 becomes −0.2 V.

Therefore, the first transfer signal line 72 and the second transfer signal line 73 may be changed to "L" (−3.3 V). Thus, the operation margin of the transfer thyristor T with respect to the threshold voltage −2.22 V is 1.08 V, which is larger than 0.68 V of the light emitting chip U1(U) to which the first exemplary embodiment is applied shown in FIG. 5.

It is desirable that the start resistance Rs is substantially equivalent to the resistance Rc. In the first exemplary embodiment, for example, the start resistance Rs and the resistance Rc are each 2 kΩ. Accordingly, at the time a, the first gate Gtf of the transfer thyristor T1 becomes −0.55 V, and the threshold voltage thereof becomes −2.05 V. The threshold voltage is close to −2.22 V which is the threshold voltage when the other transfer thyristor T is turned on.

As described above, if the value of the start resistance Rs is substantially equivalent to the value of the resistance Rc, a difference is prevented from being generated in threshold voltage of the transfer thyristor T.

Herein, the start resistance Rs and the resistance Rc may be substantially equivalent by a certain degree as long as a difference in threshold voltage of the transfer thyristors T is restricted.

Third Exemplary Embodiment

Since an image forming apparatus 1 and a print head 14 to which the third exemplary embodiment is applied are similar to the image forming apparatus 1 and the print head 14 shown in FIGS. 1 and 2 according to the first exemplary embodiment, the description of the image forming apparatus 1 and the print head 14 is omitted, and description is started from the light emitting device 65.

Light Emitting Device 65

Figure 11:
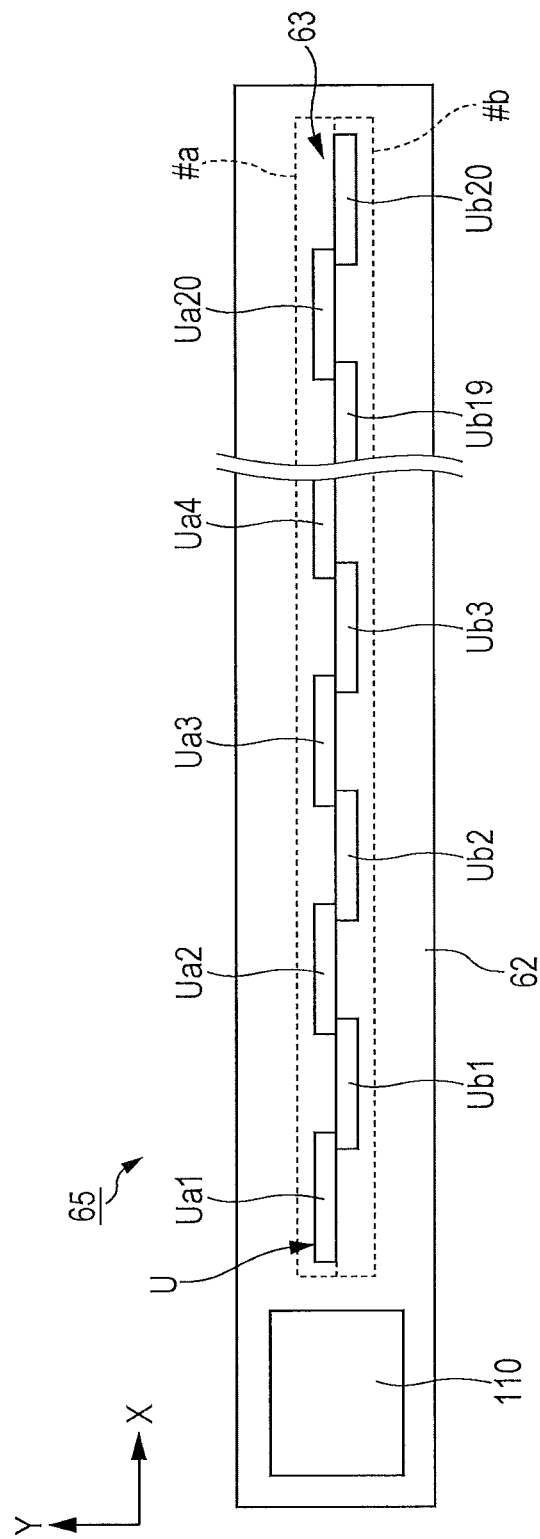
FIG. 11 is a top view of a light emitting device to which a third exemplary embodiment is applied.

FIG. 11 is a top view of the light emitting device 65 to which the third exemplary embodiment is applied.

As shown in FIG. 11, in the light emitting device 65 according to the third exemplary embodiment, the light source unit 63 includes 20 light emitting chips Ua1-Ua20 (light emitting chip group #a) and 20 light emitting chips Ub1-Ub20 (light emitting chip group #b) arranged on the circuit board 62 in a staggered manner of two rows in the main-scanning direction. That is, in the third exemplary embodiment, the 40 light emitting chips U in the first exemplary embodiment are divided into two light emitting chip groups (light emitting chip group #a and light emitting chip group #b). Herein, the light emitting chip group may be occasionally abbreviated as group. The facing arrangement of the light emitting chip group #a and the light emitting chip group #b is described later in detail.

Similarly to the first exemplary embodiment, the light emitting device 65 has mounted thereon the signal generating circuit 110 that drives the light source unit 63.

The configuration of the light emitting chips Ua1-Ua20 may be the same as the configuration of the light emitting chips Ub1-Ub20. Hence, the light emitting chips Ua1-Ua20 are expressed as light emitting chip(s) Ua, and the light emitting chips Ub1-Ub20 are expressed as light emitting chip(s) Ub, unless otherwise distinguished from each other. Also, the light emitting chips Ua and the light emitting chips Ub are expressed as light emitting chip(s) U unless otherwise distinguished from each other.

In the third exemplary embodiment, the number of light emitting chips U is 40 in total; however, the number is not limited to 40.

Figure 12:
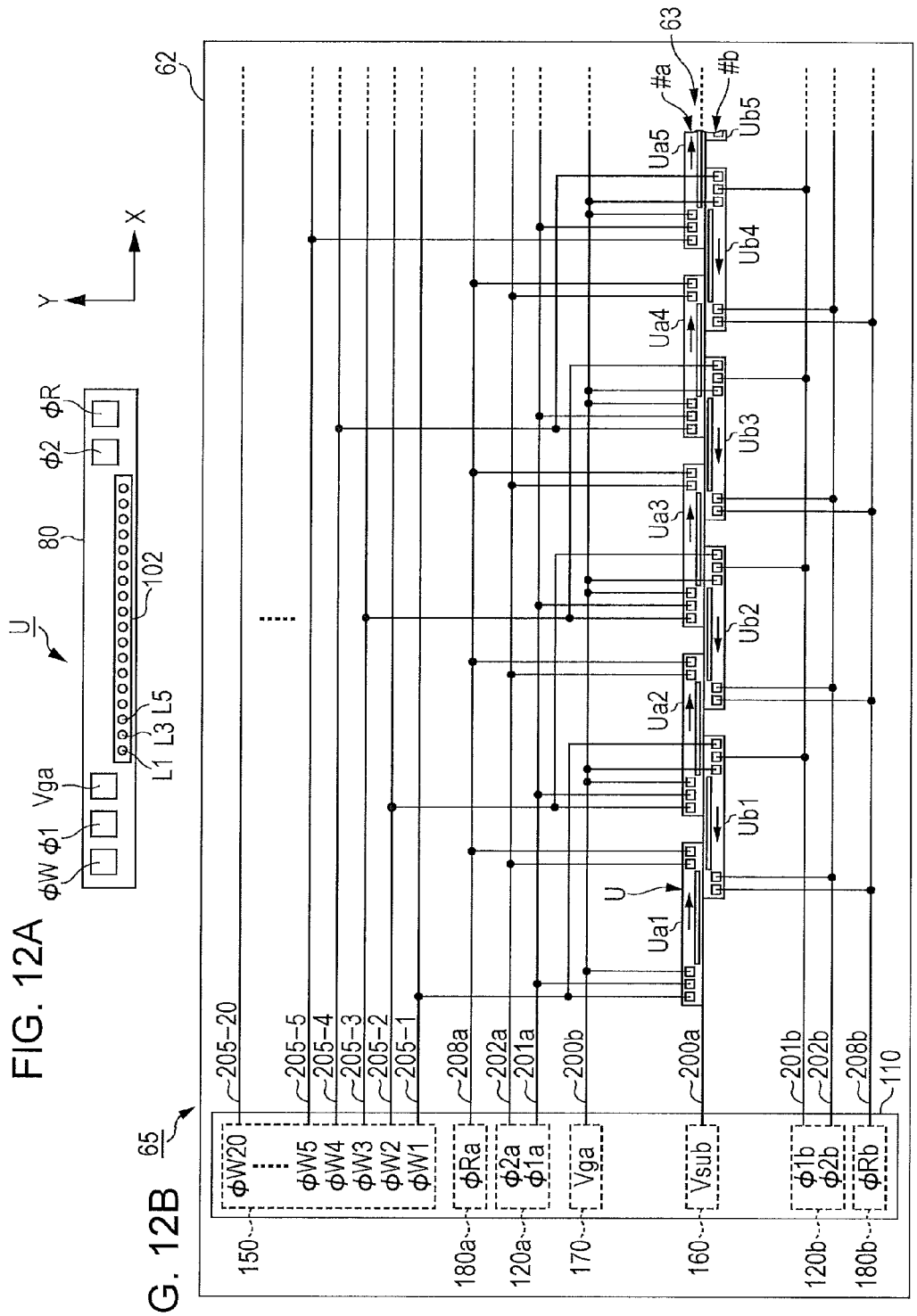
FIGS. 12A and 12B illustrate a configuration of a light emitting chip, a configuration of a signal generating circuit of the light emitting device, and a wiring configuration on a circuit board to which the third exemplary embodiment is applied.

FIGS. 12A and 12B illustrate a configuration of the light emitting chip U, a configuration of the signal generating circuit 110 of the light emitting device 65, and a wiring configuration on the circuit board 62 to which the third exemplary embodiment is applied. FIG. 12A shows the configuration of the light emitting chip U. FIG. 12B shows the configuration of the signal generating circuit 110 of the light emitting device 65, and the wiring configuration on the circuit board 62.

First, the configuration of the light emitting chip U shown in FIG. 12A is described.

The light emitting chip U includes the light emitting section 102 having plural light emitting elements (in the third exemplary embodiment, light emitting thyristors L1, L3, L5, . . . ) provided in a row form along the long side in a long-side portion on the rectangular substrate 80. Further, the light emitting chip U includes terminals (φ1 terminal, φ2 terminal, Vga terminal, φW terminal, φR terminal) serving as plural bonding pads that acquire various control signals and other signals, at both end portions in the long-side direction of the substrate 80. The input terminals are provided in the order of the φW terminal, φ1 terminal, and Vga terminal from one end of the substrate 80, and in the order of the φR terminal and φ2 terminal from the other end of the substrate 80. The light emitting section 102 is provided between the Vga terminal and the φ2 terminal.

Next, the configuration of the signal generating circuit 110 of the light emitting device 65 and the wiring configuration on the circuit board 62 are described with reference to FIG. 12B.

The circuit board 62 of the light emitting device 65 has mounted thereon the signal generating circuit 110 and the light emitting chips U (light emitting chips Ua1-Ua20, light emitting chips Ub1-Ub20), and provided therein wiring that connects the signal generating circuit 110 with the light emitting chips Ua1-Ua20 and the light emitting chips Ub1-Ub20.

First, the configuration of the signal generating circuit 110 is described.

The signal generating circuit 110 receives image data after image processing and various control signals from the image output controller 30 and the image processor 40 (see FIG. 1). The signal generating circuit 110, for example, sorts the image data and corrects the light quantity, based on the image data and the various control signals.

Also, the signal generating circuit 110 includes a transfer signal generating unit 120a that transmits a first transfer signal φ1a and a second transfer signal φ2a to the light emitting chip group #a (light emitting chips Ua1-Ua20), and a transfer signal generating unit 120b that transmits a first transfer signal φ1b and a second transfer signal φ2b to the light emitting chip group #b (light emitting chips Ub1-Ub20), based on the various control signals.

Also, the signal generating circuit 110 includes a light-off signal generating unit 180a that transmits a light-off signal φRa to the light emitting chip group #a (light emitting chips Ua1-Ua20), and a light-off signal generating unit 180b that transmits a light-off signal φRb to the light emitting chip group #b (light emitting chips Ub1-Ub20), based on the various control signals.

Further, the signal generating circuit 110 includes a write signal generating unit 150 that transmits a write signal φW1 to a light emitting chip pair #1 including the light emitting chip Ua1 belonging to the light emitting chip group #a and the light emitting chip Ub1 belonging to the light emitting chip group #b; transmits a write signal φW2 to a light emitting chip pair #2 including the light emitting chip Ua2 belonging to the light emitting chip group #a and the light emitting chip Ub2 belonging to the light emitting chip group #b; respectively transmits signals φW3-φW19 to light emitting chip pairs #3-#19 similarly; and transmits a write signal φW20 to a light emitting chip pair #20 including the light emitting chip Ua20 belonging to the light emitting chip group #a and the light emitting chip Ub20 belonging to the light emitting chip group #b, based on the various control signals.

That is, the signal generating circuit 110 includes the write signal generating unit 150 that, while a light emitting chip U belonging to the light emitting chip group #a and a light emitting chip U belonging to the light emitting chip group #b form a pair (light emitting chip pair #1, #2, . . . #20), transmits a write signal φW to each light emitting chip pair. Herein, the light emitting chip pairs #1, #2, . . . #20 may be occasionally expressed as light emitting chip pair(s) and abbreviated as pair(s) unless otherwise distinguished from each other.

As described above, in FIG. 12B, while the transfer signal generating unit 120a and the transfer signal generating unit 120b are separately illustrated, the transfer signal generating units 120a and 120b may be collectively expressed as transfer signal generating unit 120.

Further, while the light-off signal generating unit 180a and the light-off signal generating unit 180b are separately illustrated, the light-off signal generating units 180a and 180b may be collectively expressed as light-off signal generating unit 180.

Similarly, the first transfer signal φ1a and the first transfer signal φ1b are called first transfer signal(s) φ1 unless otherwise distinguished, and the second transfer signal φ2a and the second transfer signal φ2b are called second transfer signal(s) φ2 unless otherwise distinguished from each other. The light-off signals φRa and φRb are expressed as light-off signal(s) φR unless otherwise distinguished from each other. The write signals φW1-φW20 are expressed as write signal(s) φW unless otherwise distinguished from each other.

The φ1 terminal and the φ2 terminal are reception terminals for the transfer signals (first transfer signals φ1a and φ1b, second transfer signals φ2a and φ2b).

Next, the array of the light emitting chips Ua1-Ua20 and the light emitting chips Ub1-Ub20 is described.

The light emitting chips Ua1-Ua20 belonging to the light emitting chip group #a are arranged in a row at intervals in the long-side direction. The light emitting chips Ub1-Ub20 belonging to the light emitting chip group #b are also arranged in a row at intervals in the long-side direction. The light emitting chips Ua1-Ua20 belonging to the light emitting chip group #a and the light emitting chips Ub1-Ub20 belonging to the light emitting chip group #b are arranged in a staggered manner so that the light emitting chips Ua1-Ua20 face the light emitting chips Ub1-Ub20 and so that the light emitting elements are arranged at predetermined intervals in the main-scanning direction even in an area between the light emitting chips U. In each of the light emitting chips Ua1, Ua2, Ua3, . . . and the light emitting chips Ub1, Ub2, Ub3, . . . in FIG. 12B, the direction of arrangement of the light emitting elements in the light emitting section 102 (in the order of the light emitting thyristors L1, L3, L5, . . . ) shown in FIG. 12A is indicated by an arrow.

Wiring that connects the signal generating circuit 110 with the light emitting chip U (light emitting chips Ua1-Ua20, light emitting chips Ub1-Ub20) is described.

The circuit board 62 has the power line 200a that is connected with the Vsub terminal (see FIG. 14, described later) provided on the back surface of the substrate 80 of the light emitting chip U, and supplies the reference potential Vsub.

The circuit board 62 also has the power line 200b that is connected with the Vga terminal provided on the light emitting chip U and supplies the power potential Vga for driving.

Also, the circuit board 62 includes a first transfer signal line 201a that transmits the first transfer signal φ1a to φ1 terminals of the light emitting chips Ua1-Ua20 of the light emitting chip group #a, and a second transfer signal line 202a that transmits the second transfer signal φ2a to φ2 terminals of the light emitting chips Ua1-Ua20 of the light emitting chip group #a, from the transfer signal generating unit 120a of the signal generating circuit 110. The first transfer signal φ1a and the second transfer signal φ2a are transmitted commonly (parallely) to the light emitting chips Ua1-Ua20 of the light emitting chip group #a.

Similarly, the circuit board 62 includes a first transfer signal line 201b that transmits the first transfer signal φ1b to φ1 terminals of the light emitting chips Ub1-Ub20 of the light emitting chip group #b, and a second transfer signal line 202b that transmits the second transfer signal φ2b to φ2 terminals of the light emitting chips Ub1-Ub20 of the light emitting chip group #b, from the transfer signal generating unit 120b of the signal generating circuit 110. The first transfer signal φ1b and the second transfer signal φ2b are transmitted commonly (parallely) to the light emitting chips Ub1-Ub20 of the light emitting chip group #b.

Also, the circuit board 62 includes a light-off signal line 208a that transmits the light-off signal φRa from the light-off signal generating unit 180a of the signal generating circuit 110 to φR terminals of the light emitting chips Ua1-Ua20 of the light emitting chip group #a. The light-off signal φRa is transmitted commonly (parallely) to the light emitting chips Ua1-Ua20 of the light emitting chip group #a.

Similarly, the circuit board 62 includes a light-off signal line 208b that transmits the light-off signal φRb from the light-off signal generating unit 180b of the signal generating circuit 110 to φR terminals of the light emitting chips Ub1-Ub20 of the light emitting chip group #b. The light-off signal φRb is transmitted commonly (parallely) to the light emitting chips Ub1-Ub20 of the light emitting chip group #b.

Further, the circuit board 62 includes write signal lines 205-1 to 205-20 that transmit the write signals φW1, and φW2-φW20 from the write signal generating unit 150 of the signal generating circuit 110 to the respective light emitting chip pairs each including a light emitting chip Ua belonging to the light emitting chip group #a and a light emitting chip Ub belonging to the light emitting chip group #b.

That is, the write signal line 205-1 is connected with φW terminals of the light emitting chip pair #1 including the light emitting chip Ua1 belonging to the light emitting chip group #a and the light emitting chip Ub1 belonging to the light emitting chip group #b, and transmits the write signal φW1 to the φW terminals. The write signal line 205-2 is connected with φW terminals of the light emitting chip pair #2 including the light emitting chip Ua2 belonging to the light emitting chip group #a and the light emitting chip Ub2 belonging to the light emitting chip group #b, and transmits the write signal φW2 to the φW terminals. Write signal lines 205-3 to 205-19 are provided and respectively transmit the write signals φW3 to φW19, similarly. Then, the write signal line 205-20 is connected with φW terminals of the light emitting chip pair #20 including the light emitting chip Ua20 belonging to the light emitting chip group #a and the light emitting chip Ub20 belonging to the light emitting chip group #b, and transmits the write signal φW20 to the φW terminals.

As described above, the reference potential Vsub and the power potential Vga are commonly supplied to all light emitting chips U on the circuit board 62.

The first transfer signal φ1*a*, the second transfer signal φ2*a*, and the light-off signal φRa are commonly transmitted to the light emitting chip group #a. The first transfer signal φ1*b*, the second transfer signal φ2*b*, and the light-off signal φRb are commonly transmitted to the light emitting chip group #b.

In contrast, the write signals (write signals φW1-φW20) are transmitted commonly to the respective light emitting chip pairs (light emitting chip pairs #1-#20) each including a light emitting chip Ua belonging to the light emitting chip group #a and a light emitting chip Ub belonging to the light emitting chip group #b.

If the light emitting device 65 does not include the signal generating circuit 110, the power lines 200*a* and 200*b*, the first transfer signal lines 201*a* and 201*b*, the second transfer signal lines 202*a* and 202*b*, the light-off signal lines 208*a* and 208*b*, and the write signal lines 205-1 to 205-20 on the circuit board 62 are connected with connectors or other members provided instead of the signal generating circuit 110. Then, these signal lines are connected with the signal generating circuit 110 provided outside the circuit board 62 through cables connected with the connectors or other members.

Figure 13:
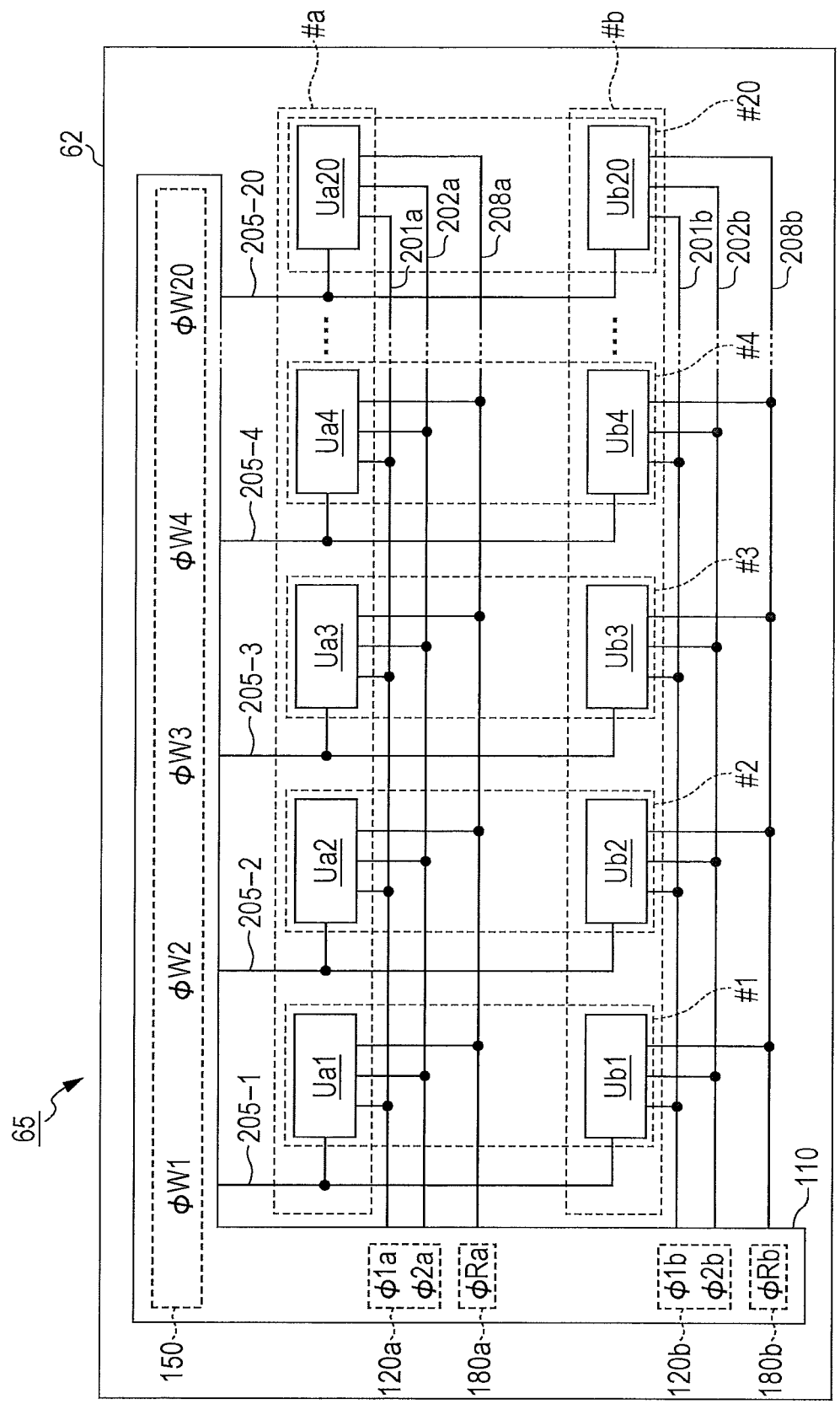
FIG. 13 is an illustration showing the light emitting chips arranged as elements of a matrix of the light emitting device to which the third exemplary embodiment is applied.

FIG. 13 is an illustration showing the light emitting chips U of the light emitting device 65 to which the third exemplary embodiment is applied, the light emitting chips U being arranged as elements of a matrix.

In FIG. 13, the light emitting chips U (light emitting chips Ua1-Ua20, light emitting chips Ub1-Ub20) are arranged as elements of 2×20 matrix. Also, FIG. 13 illustrates wiring (lines) for the signals (first transfer signals φ1*a* and φ1*b*, second transfer signals φ2*a* and φ2*b*, light-off signals φRa and φRb, and write signals φW1-φW20) for connection between the signal generating circuit 110 and the light emitting chips U (light emitting chips Ua1-Ua20, light emitting chips Ub1-Ub20).

As described above, it may be easily understood that the first transfer signal φ1*a*, the second transfer signal φ2*a*, and the light-off signal φRa are commonly transmitted to the light emitting chip group #a. Also, it may be easily understood that the first transfer signal φ1*b*, the second transfer signal φ2*b*, and the light-off signal φRb are commonly transmitted to the light emitting chip group #b.

In contrast, it may be easily understood that the write signals φW1-φW20 are transmitted commonly to the respective light emitting chip pairs #1-#20 each including a light emitting chip Ua belonging to the light emitting chip group #a and a light emitting chip Ub belonging to the light emitting chip group #b.

Herein, the number of wiring lines (lines) provided on the circuit board 62 is described.

In the first exemplary embodiment (see FIG. 4B) in which the light emitting chips U are not divided into light emitting chip groups or light emitting chip pairs in the light emitting device 65, since the light-on signal φI is transmitted to each of the light emitting chips U, if the number of light emitting chips U is 40, the 40 light-on signal lines 204-1 to 204-40 are required. In addition, the first transfer signal line 201, the second transfer signal line 202, and the power lines 200*a* and 200*b* are required. Hence, the number of wiring lines provided on the light emitting device 65 is 44.

Also, the resistance of the 40 light-on signal lines 204 is required to be small because current for lighting is applied to the light emitting thyristors L. Hence, wide wiring lines (lines) are required for the 40 light-on signals 204. Owing to this, if the light emitting chips U are not divided into light emitting chip groups or light emitting chip pairs in the first exemplary embodiment, multiple wiring lines with large widths have to be provided on the circuit board 62, and the area of the circuit board 62 may be increased.

In the third exemplary embodiment, as shown in FIGS. 12B and 13, if the number of light emitting chip groups is two, the write signal lines 205-1 to 205-20 are required in addition to the light-off signal lines 208*a* and 208*b*, the first transfer signal lines 201*a* and 201*b*, the second transfer signal lines 202*a* and 202*b*, and the power lines 200*a* and 200*b*. Hence, the number of wiring lines (lines) provided on the light emitting device 65 is 28.

In the case in which the light emitting chips U are divided into the light emitting chip groups and the light emitting chip pairs according to the third exemplary embodiment, as compared with the second exemplarily embodiment in which the light emitting chips U are not divided into the light emitting chip groups or the light emitting chip pairs, the number of wiring lines (lines) on the circuit board 62 becomes 7/11.

Further, in the third exemplary embodiment, the light-off signal lines 208*a* and 208*b* are used instead of wiring lines (lines) with large widths through which current flows for lighting the light emitting thyristors L. The light-off signals φRa and φRb that cause light-off thyristors RT to be turned on (described later) are transmitted to the light-off signal lines 208*a* and 208*b*. Hence, large current does not flow to the light-off signal line 208*a* or 208*b*.

Also, the write signals φW for causing write thyristors S (described later) to be turned on are transmitted to the write signal lines 205-1 to 205-20. Hence, large current does not flow to the write signal lines 205-1 to 205-20.

Accordingly, if the light emitting chip U to which the third exemplary embodiment is applied is used, the number of wiring lines (lines) on the circuit board 62 is reduced, and multiple wiring lines with large widths do not have to be provided.

Light Emitting Chip U

Figure 14:
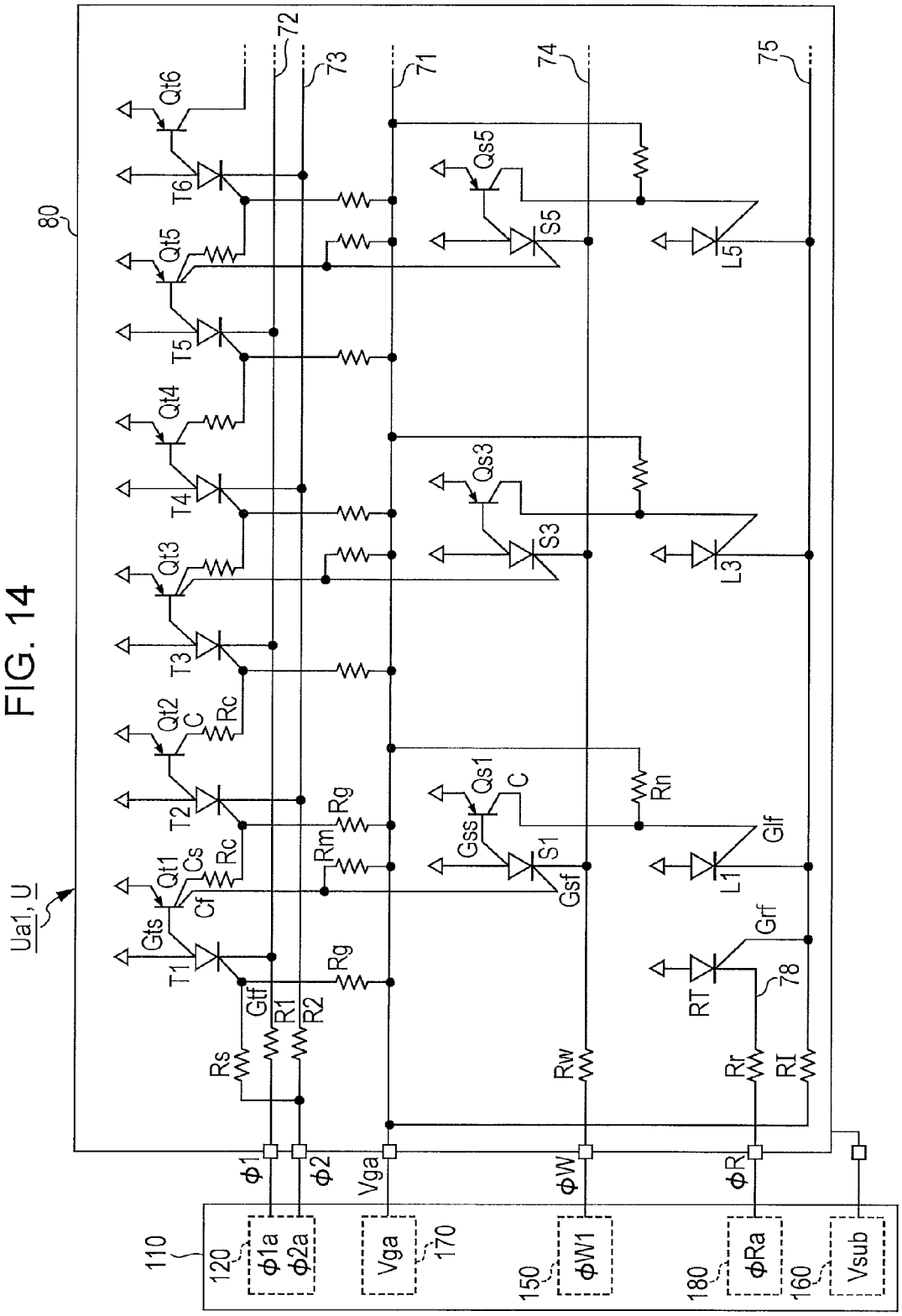
FIG. 14 is an equivalent circuit diagram explaining a circuit configuration of the light emitting chip with a self-scanning light emitting device (SLED) array mounted to which the third exemplary embodiment is applied.

FIG. 14 is an equivalent circuit diagram explaining the circuit configuration of the light emitting chip U with a self-scanning light emitting device (SLED) array mounted to which the third exemplary embodiment is applied. The positions of the terminals (φ1 terminal, φ2 terminal, Vga terminal, φW terminal, φR terminal) are illustrated at the left end of FIG. 14 for convenience of the description although the positions are different from those in FIG. 12A.

Herein, the light emitting chip Ua1 is described as an example of the light emitting chip U in relation to the signal generating circuit 110. Hence, the light emitting chip U is expressed as light emitting chip Ua1(U) in the following description, and illustrated as Ua1, U in FIG. 14. The other light emitting chips Ua2-Ua20 and light emitting chips Ub1-Ub20 have the same configuration as the light emitting chip Ua1.

The light emitting chip Ua1(U) has the light emitting thyristor row including the odd-numbered light emitting thyristors L1, L3, L5, ... arranged in a row form on the substrate 80.

Also, the light emitting chip Ua1(U) has a transfer thyristor row including odd-numbered and even-numbered transfer thyristors T1, T2, T3, ... arranged in a row form similarly to the light emitting thyristor row, and a write thyristor row including odd-numbered write thyristors S1, S3, S5, ... arranged in a row form similarly to the transfer thyristor row.

Herein, the light emitting thyristors L1, L3, L5, ..., the transfer thyristors T1, T2, T3, ..., and the write thyristors S1, S3, S5, ..., are respectively expressed as light emitting thyristor(s) L, transfer thyristor(s) T, and write thyristor(s) S unless otherwise distinguished from each other.

Further, the light emitting chip Ua1(U) includes the light-off thyristor RT.

In the light emitting chip Ua1(U) to which the third exemplary embodiment is applied, the number of write thyristors S and the number of light emitting thyristors L are each the half of the number of transfer thyristors T. That is, for the odd-numbered transfer thyristors T, the write thyristors S and the light emitting thyristors L of the corresponding numbers are provided, and for the even-numbered transfer thyristors T, the write thyristors S or the light emitting thyristors L are not provided.

The light emitting chip U1(U) has pairs each including two of the transfer thyristors T1, T2, T3, ... in the order of the numbers, and has coupling transistors Qt1, Qt2, Qt3, ..., which are pnp bipolar transistors, each being arranged between the corresponding pair. The coupling transistors Qt1, Qt2, Qt3, ... are an example of three-terminal switch element(s).

Further, the light emitting chip Ua1(U) includes odd-numbered write transistors Qs1, Qs3, Qs5, ..., respectively for the write thyristors S1, S3, S5, ....

Herein, the coupling transistors Qt1, Qt2, Qt3, ... and the write transistors Qs1, Qs3, Gs5, ... are expressed as coupling transistor(s) Qt and write transistor(s) Qs unless otherwise distinguished from each other.

The light emitting chip Ua1(U) includes a start resistance Rs. Also, provided herein are the current limiting resistance R1 and the current limiting resistance R2 that prevent current from excessively flowing respectively to the first transfer signal line 72, to which the first transfer signal φ1 (in light emitting chip Ua1, first transfer signal φ1a) is transmitted, and the second transfer signal line 73, to which the second transfer signal φ2 (in light emitting chip Ua1, second transfer signal φ2a) is transmitted. Similarly, provided is a current limiting resistance Rw that prevents current from excessively flowing to a write signal line 74 that transmits the write signal φW (in light emitting chip Ua1, write signal φW1). Further, provided is a current limiting resistance Rr that prevents current from excessively flowing to a light-off signal line 78 that transmits the light-off signal φR (in light emitting chip Ua1, light-off signal φRa). Further, provided is the current limiting resistance RI that prevents current excessively flowing to the light-on signal line 75.

Alternatively, any of or all of the current limiting resistances R1, R2, Rw, Rr, and RI may be provided outside the light emitting chip Ua1(U).

Further, the light emitting chip Ua1(U) includes plural resistances (resistances Rc, Rg, Rm, and Rn), which will be described later.

The light emitting thyristors L1, L3, L5, ... in the light emitting thyristor row, the transfer thyristors T1, T2, T3, ... in the transfer thyristor row, and the write thyristors S1, S3, S5, ... in the write thyristor row are arranged in the order of the numbers from the left side in FIG. 14. Also, the coupling transistors Qt1, Qt2, Qt3, ... are arranged in the order of the numbers from the left side in the drawing. Further, the write transistors Qs1, Qs3, Qs5, ... are arranged respectively in parallel to the write thyristors S1, S3, S5, ... in the write thyristor row. The light-off thyristor RT is arranged in parallel to the light emitting thyristors L1, L3, L5, ... in the light emitting thyristor row.

The light emitting thyristor row, the transfer thyristor row, and the write thyristor row are arranged in the order of the transfer thyristor row, the write thyristor row, and the light emitting thyristor row from the upper side in FIG. 14.

The write thyristor S and the light-off thyristor RT are semiconductor elements each having a first gate, a second gate, an anode, and a cathode, similarly to the light emitting thyristor L and the transfer thyristor T. The light-off thyristor RT uses a first gate, but does not use a second gate.

While the coupling transistors Qt and the write transistors Qs are semiconductor elements each having a collector, a base, and an emitter, the odd-numbered coupling transistors Qt each have two collectors (multi-connectors).

In the description for the third exemplary embodiment, regardless of the numbers of the transfer thyristor T, the write thyristor S, and the light emitting thyristor L, the gates of the transfer thyristor T are expressed as first gate Gtf and second gate Gts, the gates of the write thyristor S are expressed as first gate Gsf and second gate Gss, and the gate of the light emitting thyristor L is expressed as first gate Glf. The gate of the light-off thyristor RT is expressed as first gate Grf. Similarly, regardless of the numbers of the coupling thyristor Qt, the collectors of the odd-numbered multi-collector coupling transistor Qt are expressed as first collector Cf and second collector Cs, and the collector of the even-numbered coupling transistor Qt is expressed as collector C. Also, the collector of the write transistor Qs is expressed as collector C regardless of the number.

Next, electric connection of respective elements in the light emitting chip Ua1(U) is described.

The anodes of the transfer thyristor T, the write thyristor S, the light emitting thyristor L, and the light-off thyristor RT are connected with the substrate 80 of the light emitting chip Ua1(U) (anode common). The emitter of the coupling transistor Qt and the emitter of the write transistor Qs are also connected with the substrate 80 of the light emitting chip Ua1(U).

The anodes and emitters are connected with the power line 200a (see FIG. 12B) through the Vsub terminal provided on the back surface of the substrate 80. The reference potential Vsub is supplied to the power line 200a from the reference potential supply unit 160.

The cathodes of the odd-numbered transfer thyristors T1, T3, T5, ... are connected with the first transfer signal line 72 along the transfer thyristor row. The first transfer signal line 72 is connected with the φ1 terminal through the current limiting resistance R1. The first transfer signal line 201a (see FIG. 12B) is connected with the φ1 terminal, and the first transfer signal φ1a is transmitted to the φ1 terminal.

The cathodes of the even-numbered transfer thyristors T2, T4, T6, ... are connected with the second transfer signal line 73 along the transfer thyristor row. The second transfer signal line 73 is connected with the φ2 terminal through the current limiting resistance R2. The second transfer signal line 202a (see FIG. 12B) is connected with the φ2 terminal, and the second transfer signal φ2a is transmitted to the φ2 terminal.

In the case of the light emitting chip Ub1, the first transfer signal line 201b (see FIG. 12B) is connected with the φ1 terminal, and the first transfer signal φ1b is transmitted to the φ1 terminal. Similarly, the second transfer signal line 202b (see FIG. 12B) is connected with the φ2 terminal, and the second transfer signal φ2b is transmitted to the φ2 terminal.

The cathodes of the write thyristors S are connected with the write signal line 74 along the write thyristor row. The write signal line 74 is connected with the φW terminal through the current limiting resistance Rw. In the case of the light emitting chip Ua1, the write signal line 205-1 (see FIG. 12B) is connected with the φW terminal, and the write signal φW1 is transmitted to the φW terminal.

The cathodes of the light emitting thyristors L are connected with the light-on signal line 75 along the light emitting thyristor row. The light-on signal line 75 is connected with the power line 71 through the current limiting resistance RI. The power line 71 is connected with the power line 200b (see FIG. 12B) and the power potential Vga is supplied to the power line 71.

The cathode of the light-off thyristor RT is connected with the light-off signal line 78. The light-off signal line 78 is connected with the φR terminal through the current limiting resistance Rr. In the case of the light emitting chip Ua1, the light-off signal line 208a (see FIG. 12B) is connected with the φR terminal, and the write signal φRa is transmitted to the φR terminal.

In the case of the light emitting chip Ub1, the light-off signal line 208b (see FIG. 12B) is connected with the φR terminal, and the write signal φRb is transmitted to the φR terminal.

The first gate Gtf of the odd-numbered transfer thyristor T is connected with the power line 71 through a resistance Rg along the transfer thyristor row. The second gate Gts is connected with the base of the coupling transistor Qt of the same number.

The first collector Cf of the odd-numbered coupling transistor Qt is connected with the power line 71 through a resistance Rm, and is connected with the first gate Gsf of the write thyristor S of the same number. The second collector Cs is connected with the first gate Gtf of the even-numbered (downstream) transfer thyristor T with the number larger by one than the coupling transistor Qt through a resistance Rc.

The first gate Gtf of the even-numbered transfer thyristor T is connected with the power line 71 through a resistance Rg. The second gate Gts is connected with the base of the coupling transistor Qt of the same number.

The collector C of the even-numbered coupling transistor Qt is connected with the first gate Gtf of the odd-numbered (downstream) transfer thyristor T with the number larger by one than the coupling transistor Qt through a resistance Rc.

The second gate Gss of the write thyristor S is connected with the base of the write transistor Qs of the same number. The collector C of the write transistor Qs is connected with the power line 71 through the resistance Rn, and is connected with the first gate Glf of the light emitting thyristor L of the same number.

The first gate Grf of the light-off thyristor RT is connected with the light-on signal line 75.

As described above, in the light emitting chip Ua1(U) of the third exemplary embodiment, the odd-numbered transfer thyristor T is connected with the write thyristor S of the same number, and the write thyristor S is connected with the light emitting thyristor L of the same number. That is, the odd-numbered transfer thyristor T executes light-on control of the light emitting thyristor L.

The odd-numbered coupling transistor Qt has the multi-connector (first collector Cf, second collector Cs); however, the first gate Gsf of the write thyristor S and the first gate Gtf of the transfer thyristor T may be connected with the collector C through the resistance Rc, as a single collector C.

In the following description, the odd-numbered coupling transistor Qt is described as having the multi-connector (first collector Cf, second collector Cs) as shown in FIG. 14.

The light emitting chip U to which the third exemplary embodiment is applied shown in FIG. 14 may be formed on the basis of the structure shown in FIGS. 6A and 6B of the first exemplary embodiment. The description for the layout and manufacturing method is omitted.

Timing Chart

Next, the operation of the light emitting device 65, to which the third exemplary embodiment is applied, is described.

Also in the third exemplary embodiment, it is assumed that the reference potential Vsub is "H" (0 V) and the power potential Vga is "L" (−3.3 V). Also, it is assumed that signals (first transfer signals φ1a and φ1b, second transfer signals φ2a and φ2b, light-off signals φRa and φRb, write signals φW1-φW20) each have potentials of "H" (0 V) and "L" (−3.3 V).

Further, for example, it is assumed that the current limiting resistances Rw and Rr, and the resistances Rm and Rn are 300Ω, 300Ω, 10 kΩ), and 10 kΩ, respectively. The other current limiting resistances R1 (300Ω), R2 (300Ω), and RI (80Ω), the start resistance Rs (2 kΩ), the resistance Rc (2 kΩ), and the resistance Rg (10 kΩ) are similar to those of the first exemplary embodiment.

It is assumed that the internal resistance of the write thyristor S in the on state is 60Ω, which is the same as the internal resistance rk of the transfer thyristor T in the on state. That is, if the write thyristor S becomes the on state, the write signal line 74 becomes −1.8 V, which is similar to the first transfer signal line 72 and the second transfer signal line 73.

Also, it is assumed that the internal resistance of the light emitting thyristor L is 10Ω unlike the first exemplary embodiment. Then, the cathode (light-on signal line 75) of the light emitting thyristor L in the on state becomes −1.7 V.

It is assumed that the coupling transistor Qt and the write transistor Qs are saturated in the on state, and the first collector Cf, the second collector Cs, and the collector C become the saturation potential Vc (−0.2 V). Further, it is assumed that when the transfer thyristor T, the write thyristor S, and the light emitting thyristor L are in the on state, the respective first gates Gtf, Gsf, and Glf also become the saturation potential Vc (−0.2 V).

The above numerical values are merely examples, and other value may be set.

The light emitting device 65 includes the light emitting chips Ua1-Ua20 belonging to the light emitting chip group #a and the light emitting chips Ub1-Ub20 belonging to the light emitting chip group #b (see FIGS. 11, 12B, and 13).

As shown in FIG. 12B, the reference potential Vsub and the power potential Vga are commonly supplied to all the light emitting chips U (light emitting chips Ua1-Ua20, light emitting chips Ub1-Ub20) on the circuit board 62.

Also, as described above, the first transfer signal φ1a, the second transfer signal φ2a, and the light-off signal φRa are commonly transmitted to the light emitting chips Ua1-Ua20 belonging to the light emitting chip group #a. Hence, the light emitting chips Ua1-Ua20 belonging to the light emitting chip group #a are driven in parallel.

Similarly, as described above, the first transfer signal φ1b, the second transfer signal φ2b, and the light-off signal φRb are commonly transmitted to the light emitting chips Ub1-Ub20 belonging to the light emitting chip group #b. Hence, the light emitting chips Ub1-Ub20 belonging to the light emitting chip group #b are driven in parallel.

In contrast, the write signals φW1-φW20 are respectively transmitted commonly to the light emitting chip pairs #1-#20 each including a light emitting chip U belonging to the light emitting chip group #a and a light emitting chip U belonging to the light emitting chip group #b. For example, the light emitting chip Ua1 of the light emitting chip group #a and the light emitting chip Ub1 of the light emitting chip group #b form the light emitting chip pair #1, and the write signal φW1 is commonly transmitted to the light emitting chip pair #1. Also, the write signals φW1-φW20 are transmitted in parallel at the same timing. Hence, the light emitting chip pairs #1-#20 are driven in parallel.

Alternatively, the timings of the write signals φW1-φW20 may be shifted, for example, to adjust the light quantities of the light emitting thyristors L.

Since the light emitting chips Ua2-Ua20 belonging to the light emitting chip group #a are driven in parallel to the light emitting chip Ua1, and the light emitting chips Ub2-Ub20 belonging to the light emitting chip group #b are driven in parallel to the light emitting chip Ub1, the description for the operations of the light emitting chip Ua1 and the light emitting chip Ub1 in the light emitting chip pair #1 may be enough. Similarly, since the light emitting chip pairs #2-#20 are driven in parallel to the light emitting chip pair #1, the description for the light emitting chip pair #1 including the light emitting chip Ua1 and the light emitting chip Ub1 may be enough.

The operations of the light emitting chip Ua1 and the light emitting chip Ub1 belonging to the light emitting chip pair #1 are described below.

Figure 15:
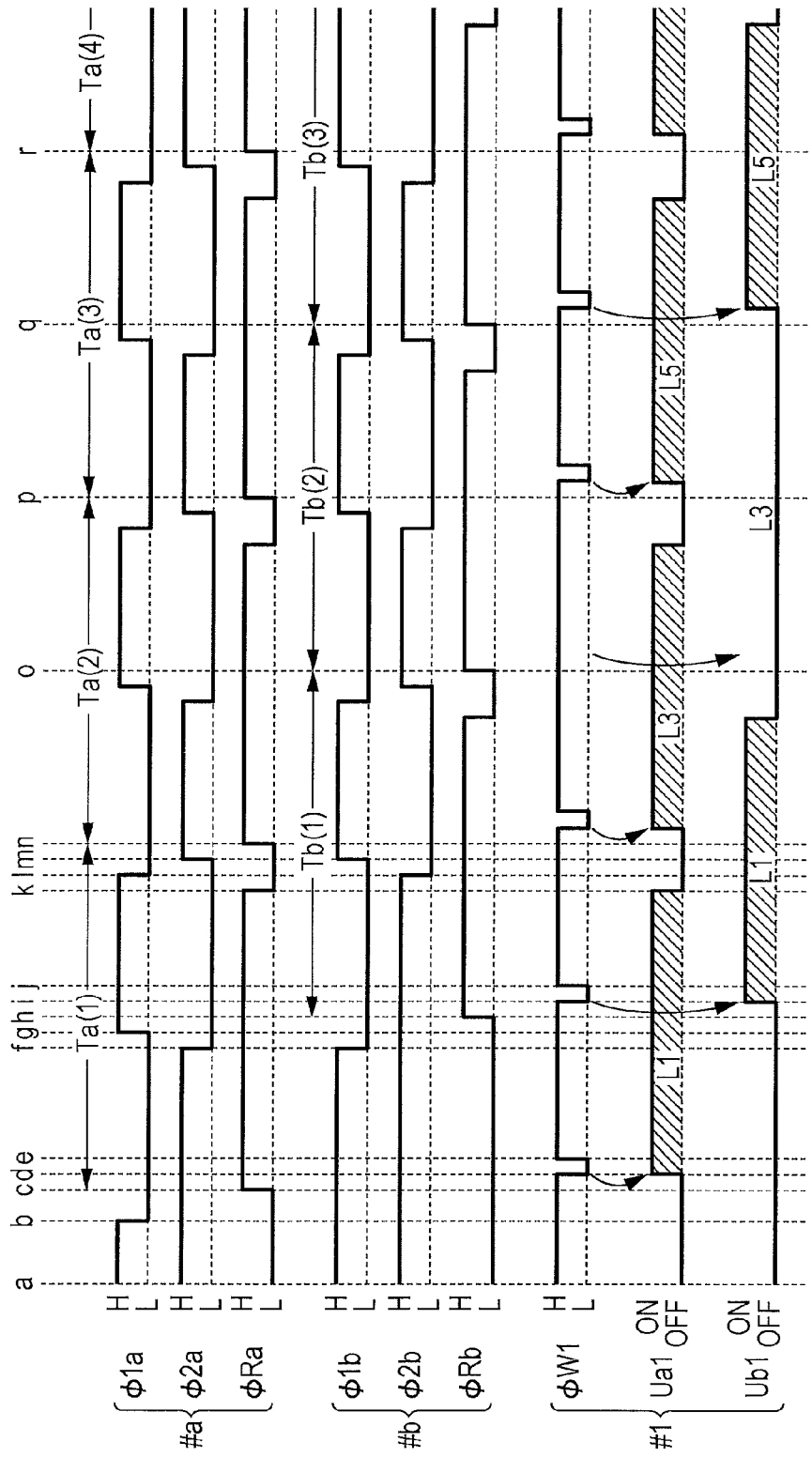
FIG. 15 is a timing chart explaining an operation of light emitting chip to which the third exemplary embodiment is applied.

FIG. 15 is a timing chart explaining operations of light emitting chips U to which the third exemplary embodiment is applied. The operation of the light emitting chip pair #1 (light emitting chip Ua1 and light emitting chip Ub1) is described below with reference to FIG. 15.

FIG. 15 shows a timing chart for that, in each light emitting chip U, light-on control is executed on three light emitting thyristors L including light emitting thyristors L1, L3, and L5.

In the light emitting chip Ua1 of the light emitting chip pair #1, light emitting thyristors L1, L3, and L5 are lit. In contrast, in the light emitting chip Ub1, the light emitting thyristors L1 and L5 are lit, and the light emitting thyristor L3 is unlit.

In FIG. 15, it is assumed that the time elapses in the order of alphabets from a time a to a time r. Light-on control is made on the light emitting thyristor L1 of the light emitting chip Ua1 of the light emitting chip group #a in a period Ta(1) from a time c to a time n, the light emitting thyristor L3 in a period Ta(2) from the time n to a time p, and the light emitting thyristor L5 in a period Ta(3) from the time p to the time r.

Also, light-on control is made on the light emitting thyristor L1 of the light emitting chip Ub1 of the light emitting chip group #b in a period Tb(1) from a time h to a time o, the light emitting thyristor L3 in a period Tb(2) from the time o to a time q, and the light emitting thyristor L5 in a period Tb(3) from the time q.

Hereinafter, light-on control is executed on the odd-numbered light emitting thyristors L of the number of 7 or larger similarly.

In the third exemplary embodiment, it is assumed that the periods Ta(1), Ta(2), Ta(3), . . . and the periods Tb(1), Tb(2), Tb(3), . . . have the same length, and are called period(s) T unless otherwise distinguished from each other.

Also, it is assumed that the periods Ta(1), Ta(2), Ta(3), . . . for control of the light emitting chips Ua1, Ua2, Ua3, . . . of the light emitting chip group #a, are shifted from the periods Tb(1), Tb(2), Tb(3), . . . for control of the light emitting chips Ub1, Ub2, Ub3, . . . of the light emitting chip group #b, by the ½ (half) length of the period T (in terms of phase, 180°). That is, the period Tb(1) is started from a timing at which the ½ period of the period T elapses since the period Ta(1) is started.

Therefore, the following description is focused on the periods Ta(1), Ta(2), Ta(3), . . . for control of the light emitting chips Ua1, Ua2, Ua3 of the light emitting chip group #a.

Alternatively, as long as the relationship among signals (described later) are held, the length of the period T may be variable.

Signal waveforms in the periods Ta(1), Ta(2), Ta(3), . . . are repetition of the same waveforms except for the write signal φW1, which is changed in accordance with image data.

In the following description, the period Ta(1) from the time c to the time n is described. In a period from the time a to time c, the light emitting chip Ua1(C) starts its operation. Signals in this period are described in the description for the operation.

The signal waveforms of the first transfer signal φ1a, the second transfer signal φ2a, and the light-off signal φRa in the period Ta(1) are described.

The first transfer signal φ1a is "L" at the time c, and is shifted from "L" to "H" at a time g. Then, the first transfer signal φ1a is shifted from "H" to "L" at a time 1, and is held at "L" at the time n.

The second transfer signal φ2a is "H" at the time c, and is shifted from "H" to "L" at a time f. Then, the second transfer signal φ2a is shifted from "L" to "H" at a time m, and is held at "H" at the time n.

Herein, when the first transfer signal φ1a is compared with the second transfer signal φ2a, the waveform of the first transfer signal φ1a in the period Ta(1) is shifted to the downstream side by ½ of the period Ta(1) (the time c is shifted to the time g) and becomes the waveform of the second transfer signal φ2a.

The first transfer signal φ1a and the second transfer signal φ2a each have a repetitive signal waveform in which the waveform for the period T is repeated. Also, "H" and "L" are alternately repeated with a period, in which both the signals become "L," like a period from the time f to the time g interposed. Also, a period, in which both the first transfer signal φ1a and the second transfer signal φ2a are simultaneously at "H" is not provided, except for a period from the time a to a time b.

A pair of signals of the first transfer signal φ1a and the second transfer signal φ2a cause the transfer thyristors T shown in FIG. 14 to become the on state in the order of the numbers.

The light-off signal φRa is shifted from "L" to "H" at the time c, and is shifted from "H" to "L" at a time k. Then, the light-off signal φRa is shifted from "L" to "H" at the time n.

The light-off signal φRa is a signal that causes the lit light emitting thyristor L to be unlit, as described later.

Next, the write signal φW1 in the period Ta(1) is described.

The write signal φW1 is "H" at the time c, is shifted from "H" to "L" at a time d, and is shifted from "L" to "H" at a time e. Further, the write signal φW1 is shifted from "H" to "L" at a time i, and is shifted from "L" to "H" at a time j. That is, the write signal φW1 has two periods of "L" in the period Ta(1). The later period of "L" (from time i to time j) is shifted from the former period of "L" (from time d to time e) to the downstream side by ½ of the period T.

The former period in which the write signal φW1 is "L" (from time d to time e) corresponds to a period in which the first transfer signal φ1a is "L," and a period in which the transfer thyristor T1 of the light emitting chip Ua1 is in the on state. The light emitting thyristor L1 of the light emitting chip Ua1 is turned on and lit.

The later period in which the write signal φW1 is "L" (from time i to time j) corresponds to a period in which the first transfer signal φ1b is "L," being later by ½ of the period T, and a period in which the transfer thyristor T1 of the light emitting chip Ub1 is in the on state. The light emitting thyristor L1 of the light emitting chip Ub1 is turned on and lit.

The operation of the light emitting device 65 is described according to the timing chart in FIG. 15 with reference to FIGS. 12B and 14.

(1) Time a

A state (initial state) at the time a, at which supply of the reference potential Vsub and the power potential Vga to the light emitting device 65 is started, is described.

Light Emitting Device 65

At the time a in the timing chart shown in FIG. 15, the power line 200a is set at the reference potential Vsub of "H" (0 V), and the reference power line 200b is set at the power potential Vga of "L" (−3.3 V) (see FIG. 12B). Hence, the Vsub terminals of all the light emitting chips U (light emitting chips Ua1-Ua20, light emitting chips Ub1-Ub20) are set at "H" and the Vga terminals thereof are set at "L" (see FIG. 14). Accordingly, the back-surface electrodes 85 serving as the Vsub terminals of the light emitting chips U (light emitting chips Ua1-Ua20, light emitting chips Ub1-Ub20) become the reference potential Vsub ("H" (0 V)), and the power lines 71 become the power potential Vga ("L" (−3.3 V)). Since the light-on signal lines 75 are connected with the power lines 71 through the current limiting resistances RI, the light-on signal lines 75 become the power potential Vga ("L" (−3.3 V)).

Also, in the signal generating circuit 110, the transfer signal generating unit 120a sets the first transfer signal φ1a and the second transfer signal φ2a at "H," and the transfer signal generating unit 120b sets the first transfer signal φ1b and the second transfer signal φ2b at "H." Then, the first transfer signal lines 201a and 201b, and the second transfer signal lines 202a and 202b become "H" (see FIG. 12B). Accordingly, the φ1 terminals and the φ2 terminals of the light emitting chips U (light emitting chips Ua1-Ua20, light emitting chips Ub1-Ub20) become "H." The first transfer signal lines 72 connected with the φ1 terminals through the current limiting resistances R1 also become "H", and the second transfer signal lines 73 connected with the φ2 terminals through the current limiting resistances R2 also become "H" (see FIG. 14).

Further, in the signal generating circuit 110, the light-off signal generating unit 180a sets the light-off signal φRa at "L," and the light-off signal generating unit 180b sets the light-off signal φRb at "L." Then, the light-off signal lines 208a and 208b become "L" (see FIG. 12B). Accordingly, the φR terminals of the light emitting chips U (light emitting chips Ua1-Ua20, light emitting chips Ub1-Ub20) become "L." The light-off signal line 78 connected with the OR terminal also becomes "L" (see FIG. 14).

In the signal generating circuit 110, the write signal generating unit 150 sets the write signals φW1-φW20 at "H." Then, the write signal lines 205-1 to 205-20 become "H" (see FIG. 12B). Accordingly, the φW terminals of the light emitting chips U (light emitting chips Ua1-Ua20, light emitting chips Ub1-Ub20) become "H" (see FIG. 14). The write signal lines 74 connected with the φW terminals through the current limiting resistances Rw also become "H" (see FIG. 14).

Next, the operations of the light emitting chips U (light emitting chips Ua1-Ua20, light emitting chips Ub1-Ub20) are described by using the light emitting chip Ua1 and the light emitting chip Ub1 belonging to the light emitting chip pair #1, with reference to FIG. 14, according the timing chart shown in FIG. 15.

Light Emitting Chip Ua1

The anodes of the transfer thyristors T, the write thyristors S, the light emitting thyristors L, and the light-off thyristor RT are connected with the Vsub terminal, and hence are set at "H."

The cathodes of the odd-numbered transfer thyristors T1, T3, T5, . . . are connected with the first transfer signal line 72 of "H," and the cathodes of the even-numbered transfer thyristors T2, T4, T6, . . . are connected with the second transfer signal line 73 of "H." Hence, the anodes and cathodes of the transfer thyristors T become "H" and the transfer thyristors T are in the off state.

The bases of the coupling transistors Qt are connected with the second gates Gts of the transfer thyristors T. Since the transfer thyristors T are in the off state, the second gates Gts are "H." Hence, since the emitters and the bases of the coupling transistors Qt are "H," the coupling transistors Qt are in the off state.

The first gates Gtf of the transfer thyristors T are connected with the power line 71 with the power potential Vga ("L" (−3.3 V)) through the resistances Rg. Hence, the first gates Gtf of the transfer thyristors T are "L" (−3.3 V) and the threshold voltage thereof is −4.8 V except for the first gate Gtf of the transfer thyristor T1 (described later).

Similarly, the cathodes of the write thyristors S are connected with the write signal line 74 of "H." Hence, the anodes and cathodes of the write thyristors S become "H" and the write thyristors S are in the off state.

The bases of the write transistors Qs are connected with the second gates Gss of the write thyristors S. Since the write thyristors S are in the off state, the second gates Gss are "H." Hence, since the emitters and the bases of the write transistors Qs are "H," the write transistors Qs are in the off state.

Also, since the first gates Gsf of the write thyristors S are connected with the power line 71 of "L" through the resistances Rm, the threshold voltage is −4.8 V.

In contrast, the cathodes of the light emitting thyristors L are connected with the light-on signal line 75 of "L" (−3.3 V) through the current limiting resistance RI. However, since the write transistors Qs are in the off state, the first gates Glf of the light emitting thyristors L are connected with the power line 71 of "L" (−3.3 V) through the resistances Rn. Hence, the light emitting thyristors L are not turned on even if the threshold voltage is −4.8 V and the light-on signal line 75 is "L" (−3.3 V), and is in the off state.

Further, the first gate Grf of the light-off thyristor RT is connected with the light-on signal line 75 of "L" (−3.3 V), and the threshold voltage thereof is −4.8 V. The light-off thyristor RT is not turned on even if the light-off signal line 78 connected with the cathode of the light-off thyristor RT is "L" (−3.3 V), and is in the off state.

Alternatively, when the signal generating circuit 110 is started at the time a, the light-off thyristor RT may be turned on. In this case, the first gate Grf of the light-off thyristor RT becomes −0.2 V. Hence, the light-on signal line 75, which is connected with the first gate Grf of the light-off thyristor RT, also becomes −0.2 V.

At the time a, since the light emitting thyristor L is not lit, the light-on signal line 75 may be −0.2 V.

The first gate Gtf of the transfer thyristor T1 at one end of the transfer thyristor row in FIG. 14 is connected with the φ2 terminal of "H" (0 V) through the start resistance Rs, and is connected with the power line 71 of "L" (−3.3 V) through the resistance Rg. Accordingly, as described in the second exemplary embodiment, the first gate Gtf1 of the transfer thyristor T1 is −0.55 V, and the threshold voltage is −2.05 V.

Light Emitting Chip Ub1

The initial state of the light emitting chip Ub1 is similar to the initial state of the light emitting chip Ua1, and hence the description is omitted.

(2) Time b

At the time b, the first transfer signal φ1a, which is transmitted to the light emitting chip group #a, is shifted from "H" (0 V) to "L" (−3.3 V). Accordingly, the light emitting device 65 is brought into operating state.

Light Emitting Chip Ua1

Then, the first transfer signal line 72 is shifted from "H" to "L" through the current limiting resistance R1. The transfer thyristor T1 with the threshold voltage being −2.02 V is turned on. Since the threshold voltages of the odd-numbered transfer thyristors T with the number of 3 or larger are −4.8 V, the transfer thyristors T are not turned on. In contrast, since the second transfer signal φ2a of the even-numbered transfer thyristors T is "H" (0 V), the transfer thyristors T are not turned on.

If the transfer thyristor T1 is turned on, the first gate Gtf becomes −0.2 V, and the second gate Gts becomes −1.5 V. Further, the cathode (first transfer signal line 72 in FIG. 14) becomes −1.8 V. Then, since the base of the coupling transistor Qt1 is connected with the second gate Gts (−1.5 V), the coupling transistor Qt1 has a forward bias between the emitter and the base, and the coupling transistor Qt1 is shifted from the off state to the on state. Then, the first collector Cf and the second collector Cs of the coupling transistor Qt1 become −0.2 V.

Since the first gate Gtf of the transfer thyristor T2 is connected with the second collector Cs of the coupling transistor Qt1 through the resistance Rc, the first gate Gtf becomes −0.72 V, and the threshold voltage becomes −2.22 V.

In contrast, if the first collector Cf of the coupling transistor Qt1 becomes −0.2 V, the first gate Gsf of the write thyristor S1 connected with the first collector Cf becomes −0.2 V, and the threshold voltage thereof becomes −1.7 V.

However, since the write signal line 74 is "H," the write thyristor S1 is not turned on.

The other write thyristors S hold the threshold voltage of −4.8 V.

That is, at the time b, the transfer thyristor T1 is turned on. Then, immediately after the time b, the transfer thyristor T1 and the coupling transistor Qt1 are in the on state, and the other transfer thyristors T, the write thyristors S, the light emitting thyristors L, the coupling transistors Qt, the write transistors Qs, and the light-off thyristor RT are in the off state.

Hereinafter, the thyristor in the on state (transfer thyristor T, write thyristor S, light emitting thyristor L, light-off thyristor RT) and the transistor in the on state (coupling transistor Qt, write transistor Qs) are described, but the description for the thyristor in the off state (transfer thyristor T, write thyristor S, light emitting thyristor L, light-off thyristor RT) and the transistor in the off state (coupling transistor Qt, write transistor Qs) is omitted.

Light Emitting Chip Ub1

Since the signal transmitted to the light emitting chip group #b including the light emitting chip Ub1 is not changed, the light emitting chip Ub1 holds the initial state.

(3) Time c

At the time c, the light-off signal φRa, which is transmitted to the light emitting chip group #a, is shifted from "L" (−3.3 V) to "H" (0 V).

Light Emitting Chip Ua1

Then, the light-off signal line 78 is shifted from "L" to "H" through the current limiting resistance Rr. Then, both the anode and cathode of the light-off thyristor RT become "H," and the light-off thyristor RT is turned off even if the light-off thyristor RT is in the on state. Also, even if the light-off thyristor RT is in the on state and the light-on signal line 75 is −0.2 V, the light-on signal line 75 is shifted to the power potential Vga ("L" (−3.3 V)) of the power line 71.

Even if the light-on signal line 75 is shifted to "L" (−3.3 V), the light emitting thyristor L is not turned on because the threshold voltage thereof is −4.8 V.

Immediately after the time c, the transfer thyristor T1 and the coupling transistor Qt1 are in the on state.

Light Emitting Chip Ub1

Since the signal transmitted to the light emitting chip group #b including the light emitting chip Ub1 is not changed, the light emitting chip Ub1 holds the initial state.

(4) Time d

At the time d, the write signal φW1, which is transmitted to the light emitting chip pair #1 including the light emitting chip Ua1 of the light emitting chip group #a and the light emitting chip Ub1 of the light emitting chip group #b, is shifted from "H" (0 V) to "L" (−3.3 V).

Light Emitting Chip Ua1

Then, the write signal line 74 is shifted from "H" to "L" through the current limiting resistance Rw. The write thyristor S1 with the threshold voltage being −1.7 V is turned on. Since the threshold voltages of the write thyristors S with the number of 3 or larger are −4.8 V, the write thyristors S are not turned on.

Then, if the write thyristor S1 is turned on, the second gate Gss becomes −1.5 V. Then, the write transistor Qs1 is shifted from the off state to the on state. Then, the collector C of the write transistor Qs1 becomes −0.2 V. Further, the cathode (write signal line 74) of the write transistor Qs1 becomes −1.8 V.

Since the first gate Glf of the light emitting thyristor L1 is connected with the collector C of the write transistor Qs1, the first gate Glf becomes −0.2 V, and the threshold voltage thereof becomes −1.7 V.

The light-on signal line 75 connected with the cathode of the light emitting thyristor L1 is "L" (−3.3 V) at the time c. Hence, the light emitting thyristor L1 is turned on and lit.

Then, the first gate Glf of the light emitting thyristor L1 becomes −0.2 V, and the cathode (light-on signal line 75) thereof becomes −1.7 V as described above.

Since the first gate Grf of the light-off thyristor RT is connected with the light-on signal line 75 of −1.7 V, the threshold voltage thereof becomes −3.2 V.

Immediately after the time d, the transfer thyristor T1, the coupling transistor Qt1, the write thyristor S1, and the write transistor Qs1 are in the on state, and the light emitting thyristor L1 is in the on state and is lit.

Light Emitting Chip Ub1

When the write signal line 74 is shifted from "H" to "L," the write signal line 74 is shifted from "H" to "L." However, the threshold voltages of the write thyristors S are −4.8 V. Hence, the write thyristors S are not turned on.

(5) Time e

At the time e, the write signal φW1, which is transmitted to the light emitting chip pair #1 including the light emitting chip Ua1 of the light emitting chip group #a and the light emitting chip Ub1 of the light emitting chip group #b, is shifted from "L" (−3.3 V) to "H" (0 V).

Light Emitting Chip Ua1

Then, the write signal line 74 is shifted from −1.8 V to "H" (0 V). Since both the cathode and anode of the write thyristor S1 in the on state become "H," the write thyristor S1 is turned off. Then, the write transistor Qs1 is shifted from the on state to the off state.

Since the light-on signal line 75 holds −1.7 V (sustaining voltage), the light emitting thyristor L1 in the on state holds the on state.

Immediately after the time e, the transfer thyristor T1 and the coupling transistor Qt1 are in the on state, and the light emitting thyristor L1 is in the on state and is lit.

Light Emitting Chip Ub1

When the write signal φW1 is shifted from "L" to "H," the write signal line 74 at "L" is shifted to "H."

(6) Time f

At the time f, the second transfer signal φ2a, which is transmitted to the light emitting chip group #a, is shifted from "H" (0 V) to "L" (−3.3 V). Also, the first transfer signal φ1b, which is transmitted to the light emitting chip group #b, is shifted from "H" (0 V) to "L" (−3.3 V).

Light Emitting Chip Ua1

Then, the second transfer signal line 73 is shifted from "H" to "L" (−3.3 V), and the transfer thyristor T2 with the threshold voltage being −2.22 V is turned on. However, since the threshold voltages of the even-numbered transfer thyristors T with the number of 4 or larger are −4.8 V, the transfer thyristors T are not turned on.

If the transfer thyristor T2 is turned on, the cathode of the transfer thyristor T2 (second transfer signal line 73 in FIG. 14) becomes −1.8 V similarly to the situation when the transfer thyristor T1 is turned on at the time b.

If the transfer thyristor T2 becomes the on state, the coupling transistor Qt2 is shifted from the off state to the on state, and the collector C of the coupling transistor Qt2 becomes −0.2 V.

Then, the first gate Gtf of the transfer thyristor T3 connected with the collector C becomes −0.72 V, and the threshold voltage thereof becomes −2.22 V.

Since the light-on signal line 75 holds −1.7 V (sustaining voltage), the light emitting thyristor L1 in the on state holds the on state.

Immediately after the time f, the transfer thyristors T1 and T2, and the coupling transistors Qt1 and Qt2 are in the on state, and the light emitting thyristor L1 is in the on state and is lit.

Light Emitting Chip Ub1

The operation is similar to the operation of the light emitting chip Ua1 at the time b, and hence the description is omitted.

The light emitting chip Ub1 is operated similarly to the operation of the light emitting chip Ua1 at a timing shifted to the downstream side by ½ of the period T (relationship in which the phase is shifted by 180°).

(7) Time g

At the time g, the first transfer signal φ1a, which is transmitted to the light emitting chip group #a, is shifted from "L" (−3.3 V) to "H" (0 V).

Light Emitting Chip Ua1

Then, the first transfer signal line 72 is shifted from −1.8 V to "H" (0 V). Since both the on state and anode of the transfer thyristor T1 in the on state become "H," the transfer thyristor T1 is turned off. Accordingly, the coupling transistor Qt1 is shifted from the on state to the off state. Hence, the first gate Gsf of the write thyristor S1 becomes "L" (−3.3 V) of the power line 71 connected with the first gate Gsf through the resistance Rm, and the threshold voltage thereof becomes −4.8 V. That is, the threshold voltage of all the write thyristors S becomes −4.8 V.

Further, the first gate Glf of the light emitting thyristor L1 becomes "L" (−3.3 V) of the power line 71 connected with the first gate Glf through the resistance Rn, and the threshold voltage thereof becomes −4.8 V.

However, since the light-on signal line 75 holds −1.7 V (sustaining voltage), the light emitting thyristor L1 in the on state holds the on state.

Since the light-off signal φRa is "H" (0 V), the light emitting thyristor L1 in the on state holds the on state.

Immediately after the time g, the transfer thyristor T2 and the coupling transistor Qt2 are in the on state, and the light emitting thyristor L1 is in the on state and is lit.

Light Emitting Chip Ub1

Since the signal transmitted to the light emitting chip group #b including the light emitting chip Ub1 is not changed, the light emitting chip Ub1 holds the state at the time f.

(8) Time h

At the time h, the light-off signal φRb which is transmitted to the light emitting chip group #b is shifted from "L" (−3.3 V) to "H" (0 V).

Light Emitting Chip Ua1

Since the signal transmitted to the light emitting chip group #a including the light emitting chip Ua1 is not changed, the light emitting chip Ua1 holds the state at the time g.

Light Emitting Chip Ub1

The operation is similar to the operation of the light emitting chip Ua1 at the time c, and hence the description is omitted.

(9) Time i

At the time i, the write signal φW1, which is transmitted to the light emitting chip pair #1 including the light emitting chip Ua1 of the light emitting chip group #a and the light emitting chip Ub1 of the light emitting chip group #b, is shifted from "H" (0 V) to "L" (−3.3 V).

Light Emitting Chip Ua1

Then, the write signal line 74 is shifted from "H" to "L." However, since the threshold voltages of the write thyristors S are −4.8 V, the write thyristors S are not turned on.

Immediately after the time i, the transfer thyristor T2 and the coupling transistor Qt2 are in the on state, and the light emitting thyristor L1 is in the on state and is lit.

Light Emitting Chip Ub1

The operation is similar to the operation of the light emitting chip Ua1 at the time d, and hence the description is omitted.

(10) Time j

At the time j, the write signal φW1, which is transmitted to the light emitting chip pair #1 including the light emitting chip Ua1 of the light emitting chip group #a and the light emitting chip Ub1 of the light emitting chip group #b, is shifted from "L" (−3.3 V) to "H" (0 V).

Light Emitting Chip Ua1

Then, the write signal line 74 is shifted from "L" to "H."

Immediately after the time j, the transfer thyristor T2 and the coupling transistor Qt2 are in the on state, and the light emitting thyristor L1 is in the on state and is lit.

Light Emitting Chip Ub1

The operation is similar to the operation of the light emitting chip Ua1 at the time e, and hence the description is omitted.

(11) Time k

At the time k, the light-off signal φRa, which is transmitted to the light emitting chip group #a, is shifted from "H" (0 V) to "L" (-3.3 V).

Light Emitting Chip Ua1

Then, the light-off signal line 78 is shifted from "H" (0 V) to "L" (-3.3 V) through the current limiting resistance Rr. Since the threshold voltage of the light-off thyristor RT is -3.2 V, the light-off thyristor RT is turned on. The first gate Grf of the light-off thyristor RT becomes -0.2 V, and hence the light-on signal line 75 becomes -0.2 V.

Then, since the potential between the anode and cathode of the light emitting thyristor L1 in the on state becomes -0.2 V, which is smaller than the sustaining voltage (-1.7 V) on the absolute value basis, the light emitting thyristor L1 is turned off and unlit (light-off).

That is, the light emitting thyristor L1 of the light emitting chip Ua1 is lit (turned on) at the timing at which the write signal φW1 is shifted from "H" to "L" at the time d, and is unlit (turned off) at the timing at which the light-off signal φRa is shifted from "H" to "L" at the time k. The period from the time d to the time k corresponds to the light-on (light emitting) period of the light emitting thyristor L1 of the light emitting chip Ua1.

Immediately after the time k, the transfer thyristor T2, the coupling transistor Qt2, and the light-off thyristor RT are in the on state.

Light Emitting Chip Ub1

Since the signal transmitted to the light emitting chip group #b including the light emitting chip Ub1 is not changed, the light emitting chip Ub1 holds the state at the time j.

(12) Time l

At the time l, the first transfer signal φ1a, which is transmitted to the light emitting chip group #a, is shifted from "H" (0 V) to "L" (-3.3 V). Also, the second transfer signal φ2b, which is transmitted to the light emitting chip group #b, is shifted from "H" (0 V) to "L" (-3.3 V).

Light Emitting Chip Ua1

Then, the first transfer signal line 72 is shifted from "H" to "L." Then, the transfer thyristor T3 with the threshold voltage being -2.22 V, is turned on. However, since the threshold voltages of the odd-numbered transfer thyristors T with the number of 5 or larger are -4.8 V, the transfer thyristors T are not shifted to the on state. Also, the transfer thyristor T1 is in the off state, the first gate Gtf of the transfer thyristor T1 is connected with the φ2 terminal of "L" (-3.3 V) through the start resistance Rs, and the first gate Gtf is connected with the power line 71 of "L" (-3.3 V) through the resistance Rg. Hence, the threshold voltage of the transfer thyristor T1 is -4.8 V and is not turned on.

Then, the coupling transistor Qt3 is shifted from the off state to the on state. Accordingly, the first collector Cf and the second collector Cs of the coupling transistor Qt3 become -0.2 V.

Then, the first gate Gtf of the transfer thyristor T4 becomes -0.72 V, and the threshold voltage thereof becomes -2.22 V similarly to the transfer thyristor T2 at the time b.

In contrast, the first gate Gsf of the write thyristor S3 connected with the first collector Cf becomes -0.2 V, and the threshold voltage thereof becomes -1.7 V.

Immediately after the time l, the transfer thyristors T2 and T3, the coupling transistors Qt2 and Qt3, and the light-off thyristor RT are in the on state.

Light Emitting Chip Ub1

The operation is similar to the operation of the light emitting chip Ua1 at the time f, and hence the description is omitted.

(13) Time m

At the time m, the second transfer signal φ2a, which is transmitted to the light emitting chip group #a, is shifted from "L" (-3.3 V) to "H" (0 V). Also, the first transfer signal φ1b, which is transmitted to the light emitting chip group #b, is shifted from "L" (-3.3 V) to "H" (0 V).

Light Emitting Chip Ua1

Then, the second transfer signal line 73 is shifted from "L" to "H." Since both the cathode and anode of the transfer thyristor T2 in the on state become "H," the transfer thyristor T2 is turned off. Accordingly, the coupling transistor Qt2 is shifted from the on state to the off state.

Immediately after the time m, the transfer thyristor T3, the coupling transistor Qt3, and the light-off thyristor RT are in the on state.

Light Emitting Chip Ub1

The operation is similar to the operation of the light emitting chip Ua1 at the time g, and hence the description is omitted.

(14) Time n

At the time n, the light-off signal φRa, which is transmitted to the light emitting chip group #a, is shifted from "L" (-3.3 V) to "H" (0 V).

Light Emitting Chip Ua1

Then, the light-off signal line 78 is shifted from the potential of the cathode of the light-off thyristor RT in the on state to "H" (0 V). Since both the cathode and anode of the light-off thyristor RT are "H," the light-off thyristor RT is turned off. The light-on signal line 75 is shifted from -0.2 V of the first gate Grf of the light-off thyristor RT in the on state to "L" (-3.3 V) of the power line 71.

Since the first gate Grf of the light-off thyristor RT is connected with the light-on signal line 75, the threshold voltage thereof becomes -3.2 V.

Immediately after the time n, the transfer thyristor T3 and the coupling transistor Qt3 are in the on state.

Light Emitting Chip Ub1

Since the signal transmitted to the light emitting chip group #b including the light emitting chip Ub1 is not changed, the light emitting chip Ub1 holds the state at the time j.

In the above description, the period Ta(1) for control of the light emitting thyristor L1 in the light emitting chip Ua1 of the light emitting chip group #a is described.

Hereinafter, the period Ta(1) from the time c to the time n is repeated.

Also, the light emitting chip Ub1 is operated similarly to the operation of the light emitting chip Ua1 at a timing shifted by ½ of the period T.

If the light emitting thyristor L is not lit, in the period from the time o to the time p, which is the period Tb(2) for the light emitting thyristor L3 of the light emitting chip Ub1, the write signal φW1 may be held at "H" (0 V) without being shifted to "L" (-3.3 V). The write thyristor S is not turned on unless the write signal φW1 becomes "L" (-3.3 V). Accordingly, the write transistor Qs may also hold the off state. Hence, the threshold voltage of the corresponding light emitting thyristor L is held at -4.8 V, and hence the light emitting thyristor L is not turned on.

When the write thyristor S becomes the on state, the light emitting thyristor L designated by the transfer thyristor T in the on state is set such that the light emitting thyristor L may be lit.

As described above, in the third exemplary embodiment, the resistance Rc is provided between the second collector Cs of the odd-numbered coupling transistor Qt and the first gate Gtf of the downstream even-numbered transfer thyristor T. Similarly, the resistance Rc is provided between the collector C of the even-numbered coupling transistor Qt and the first gate Gtf of the downstream odd-numbered transfer thyristor T. Accordingly, the potential (in the above example, −2.22 V) of the first gate Gtf (first gate Gtf2 in FIG. 7A) of the transfer thyristor T in the off state connected with the collector C (including second collector Cs) of the coupling transistor Qt, which becomes the on state because of the transfer thyristor T in the on state, through the resistance Rc is set at a value lower than the potential (in the above example, −1.8 V) of the cathode (first transfer signal line 72 or the second transfer signal line 73) of the transfer thyristor T in the on state.

Accordingly, the phenomenon, in which the transfer thyristors T are successively turned on like dominos, is restricted.

In the light emitting device 65 to which the third exemplary embodiment is applied shown in FIGS. 12A, 12B, and 14, the light emitting chips U are divided into the two light emitting chip groups; however, the light emitting chips U may be divided into three or more light emitting chip groups.

Also, in the light emitting chip U to which the third exemplary embodiment is applied shown in FIG. 14, the light-on control is executed for the single light emitting thyristor L by the odd-numbered light emitting thyristor T. However, the light-on control may be executed for two or more light emitting thyristors L by the odd-numbered transfer thyristor T. Alternatively, the light-on control may be executed for the light emitting thyristor L by the even-numbered transfer thyristor T.

Further alternatively, all transfer thyristors T may execute the light-on control for respectively corresponding light emitting thyristors L.

In any of the first to third exemplary embodiments, the thyristor (transfer thyristor T, light emitting thyristor L, write thyristor S (third exemplary embodiment), light-off thyristor RT (third exemplary embodiment)) is anode-common in which the anode is connected with the substrate 80, and the transistor (coupling transistor Q (first and second exemplary embodiments), coupling transistor Qt (third exemplary embodiment), write transistor Qs (third exemplary embodiment)) is the pnp bipolar transistor.

Alternatively, by changing the polarity of the circuit, the thyristor (transfer thyristor T, light emitting thyristor L, write thyristor S (third exemplary embodiment), light-off thyristor RT (third exemplary embodiment)) may be cathode-common in which the cathode is connected with the substrate 80, and the transistor (coupling transistor Q, coupling transistor Qt, write transistor Qs) may be the npn bipolar transistor.

Further, the coupling transistor Q, Qt is the pnp bipolar transistor or the npn bipolar transistor; however, a three-terminal switch element, such as a field-effect transistor (FET), may be used.

Further, the resistance Rc may be a resistance (parasitic resistance) present in the collector of the coupling transistor Q, Qt, or may be a resistance (parasitic resistance) present in the first gate Gtf of the transfer thyristor T.

Also, in any of the first to third exemplary embodiments, the transfer thyristor T is driven by the two-phase transfer signals of the first transfer signal φ1 and the second transfer signal φ2. However, transfer signals with three or more phases may be used.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting part comprising:
a plurality of light emitting elements that are each lit in the on state;
a plurality of transfer thyristors that each have an anode, a cathode, a first gate, and a second gate, that each designate a light emitting element to be lit among the plurality of light emitting elements in the on state, and that successively transfer the on state;
a plurality of three-terminal switch elements and a plurality of resistances, each of the plurality of three-terminal switch elements and each of the plurality of resistances being connected in series between the second gate of a former transfer thyristor and the first gate of a later transfer thyristor, the former transfer thyristor and the later transfer thyristor being closely arranged upstream and downstream transfer thyristors among the plurality of transfer thyristors in the order in which the transfer thyristors transfer the on state, the three-terminal switch element and the resistance becoming the on state if the former transfer thyristor becomes the on state and setting the later transfer thyristor in a state in which the later transfer thyristor is shifted to the on state; and
a number N of transfer signal lines, the plurality of transfer thyristors being selected cyclically and successively in the order in which the transfer thyristors transfer the on state and divided into a number N of groups, N being an integer of 2 or larger, the cathodes or the anodes of transfer thyristors, which belong to each of the N groups, being connected with corresponding one of the N transfer signal lines,
wherein, in one transfer signal line among the N transfer signal lines, a potential of the transfer signal line when one of the plurality of transfer thyristors belonging to one of the N groups connected with the transfer signal line is in the on state is smaller in an absolute value than a potential set for the transfer signal line connected with the later transfer thyristor, when it is assumed that the transfer thyristor in the on state is the former transfer thyristor, and when the later transfer thyristor, which is set in the state in which the later transfer thyristor is shifted to the on state through the three-terminal switch element and the resistance, is shifted to the on state.

2. The light emitting part according to claim 1, further comprising:
a plurality of current limiting resistances provided at respective reception terminals, the reception terminals receiving respective transfer signals, which are transmitted through the N transfer signal lines, the transfer signals having different phases; and
a start resistance connected between the first gate of a transfer thyristor that transfers the on state first among the plurality of transfer thyristors, and the reception end of one of the transfer signal lines other than the transfer signal line with which the transfer thyristor is connected among the N transfer signal lines.

3. The light emitting part according to claim 1, further comprising a plurality of write thyristors that are each provided between a light emitting element among the plurality of light emitting elements and a transfer thyristor among the plurality of transfer thyristors designated by the light emitting element, that each become the on state in response to reception of a write signal, and that each allow the designated light emitting element to be lit.

4. The light emitting part according to claim 1,
wherein the plurality of light emitting elements are a plurality of light emitting thyristors, and
wherein the light emitting part further comprises
a light-on signal line that is connected with the plurality of light emitting thyristors, and that supplies current for lighting the plurality of light emitting thyristors to the plurality of light emitting thyristors, and
a light-off thyristor that is shifted from the off state to the on state in response to reception of a light-off signal, and that sets a potential of the light-on signal line at a potential which causes the plurality of light emitting thyristors to become the off state.

5. A print head comprising:
a light emitting unit including
a plurality of light emitting elements that are each lit in the on state,
a plurality of transfer thyristors that each have an anode, a cathode, a first gate, and a second gate, that each designate a light emitting element to be lit among the plurality of light emitting elements in the on state, and that successively transfer the on state,
a plurality of three-terminal switch elements and a plurality of resistances, each of the plurality of three-terminal switch elements and each of the plurality of resistances being connected in series between the second gate of a former transfer thyristor and the first gate of a later transfer thyristor, the former transfer thyristor and the later transfer thyristor being closely arranged upstream and downstream transfer thyristors among the plurality of transfer thyristors in the order in which the transfer thyristors transfer the on state, the three-terminal switch element and the resistance becoming the on state if the former transfer thyristor becomes the on state and setting the later transfer thyristor in a state in which the later transfer thyristor is shifted to the on state, and
a number N of transfer signal lines, the plurality of transfer thyristors being selected cyclically and successively in the order in which the transfer thyristors transfer the on state and divided into a number N of groups, N being an integer of 2 or larger, the cathodes or the anodes of transfer thyristors, which belong to each of the N groups, being connected with corresponding one of the N transfer signal lines,
wherein, in one transfer signal line among the N transfer signal lines, a potential of the transfer signal line when one of the plurality of transfer thyristors belonging to one of the N groups connected with the transfer signal line is in the on state is smaller in an absolute value than a potential set for the transfer signal line connected with the later transfer thyristor, when it is assumed that the transfer thyristor in the on state is the former transfer thyristor, and when the later transfer thyristor, which is set in the state in which the later transfer thyristor is shifted to the on state through the three-terminal switch element and the resistance, is shifted to the on state; and
an optical unit that forms an image of light emitted from the light emitting unit.

6. An image forming apparatus comprising:
an image holding member;
a charging unit that electrically charges the image holding member;
an exposure unit that exposes the image holding member electrically charged by the charging unit, to light through an optical unit, the exposure unit including
a plurality of light emitting elements that are each lit in the on state,
a plurality of transfer thyristors that each have an anode, a cathode, a first gate, and a second gate, that each designate a light emitting element to be lit among the plurality of light emitting elements in the on state, and that successively transfer the on state,
a plurality of three-terminal switch elements and a plurality of resistances, each of the plurality of three-terminal switch elements and each of the plurality of resistances being connected in series between the second gate of a former transfer thyristor and the first gate of a later transfer thyristor, the former transfer thyristor and the later transfer thyristor being closely arranged upstream and downstream transfer thyristors among the plurality of transfer thyristors in the order in which the transfer thyristors transfer the on state, the three-terminal switch element and the resistance becoming the on state if the former transfer thyristor becomes the on state and setting the later transfer thyristor in a state in which the later transfer thyristor is shifted to the on state, and
a number N of transfer signal lines, the plurality of transfer thyristors being selected cyclically and successively in the order in which the transfer thyristors transfer the on state and divided into a number N of groups, N being an integer of 2 or larger, the cathodes or the anodes of transfer thyristors, which belong to each of the N groups, being connected with corresponding one of the N transfer signal lines,
wherein, in one transfer signal line among the N transfer signal lines, a potential of the transfer signal line when one of the plurality of transfer thyristors belonging to one of the N groups connected with the transfer signal line is in the on state is smaller in an absolute value than a potential set for the transfer signal line connected with the later transfer thyristor, when it is assumed that the transfer thyristor in the on state is the former transfer thyristor, and when the later transfer thyristor, which is set in the state in which the later transfer thyristor is shifted to the on state through the three-terminal switch element and the resistance, is shifted to the on state;
a developing unit that develops an electrostatic latent image formed on the image holding member exposed to the light by the exposure unit; and
a transfer unit that transfers an image developed by the image holding member, on a transfer-target material.

* * * * *